(12) United States Patent
Lin et al.

(10) Patent No.: US 11,705,452 B2
(45) Date of Patent: Jul. 18, 2023

(54) METHOD (AND RELATED APPARATUS) FOR FORMING A SEMICONDUCTOR DEVICE WITH REDUCED SPACING BETWEEN NANOSTRUCTURE FIELD-EFFECT TRANSISTORS

(71) Applicant: Taiwan Semiconductor Manufacturing Company, Ltd., Hsin-Chu (TW)

(72) Inventors: Zhi-Chang Lin, Zhubei (TW); Huan-Chieh Su, Tianzhong Township (TW); Kuo-Cheng Chiang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/729,390

(22) Filed: Apr. 26, 2022

(65) Prior Publication Data
US 2022/0254780 A1    Aug. 11, 2022

Related U.S. Application Data

(62) Division of application No. 16/929,592, filed on Jul. 15, 2020, now Pat. No. 11,322,493.
(Continued)

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
CPC ........ H01L 27/0886; H01L 21/823431; H01L 21/823481; H01L 29/42392; H01L 29/785;
(Continued)

(56) References Cited

U.S. PATENT DOCUMENTS

| | | | |
|---|---|---|---|
| 2014/0151639 A1* | 6/2014 | Chang ................ | H01L 29/0673 257/27 |
| 2017/0110554 A1* | 4/2017 | Tak ................... | H01L 29/42392 |
| 2019/0067490 A1* | 2/2019 | Yang ..................... | B82Y 10/00 |

OTHER PUBLICATIONS

U.S. Appl. No. 16/550,049, filed Aug. 23, 2019.
(Continued)

*Primary Examiner* — Jonathan Han
(74) *Attorney, Agent, or Firm* — Eschweiler & Potashnik, LLC

(57) ABSTRACT

Various embodiments of the present disclosure are directed towards a semiconductor device. The semiconductor device includes a semiconductor fin projecting from a substrate. Semiconductor nanostructures are disposed over the semiconductor fin. A gate electrode is disposed over the semiconductor fin and around the semiconductor nanostructures. A dielectric fin is disposed over the substrate. A dielectric structure is disposed over the dielectric fin. An upper surface of the dielectric structure is disposed over the upper surface of the gate electrode. A dielectric layer is disposed over the substrate. The dielectric fin laterally separates both the gate electrode and the semiconductor nanostructures from the dielectric layer. An upper surface of the dielectric layer is disposed over the upper surface of the gate electrode structure and the upper surface of the dielectric structure. A lower surface of the dielectric layer is disposed below the upper surface of the dielectric fin.

20 Claims, 19 Drawing Sheets

Related U.S. Application Data

(60) Provisional application No. 62/927,881, filed on Oct. 30, 2019.

(51) Int. Cl.
*H01L 29/423* (2006.01)
*H01L 29/78* (2006.01)
*H01L 29/786* (2006.01)

(52) U.S. Cl.
CPC ...... *H01L 29/42392* (2013.01); *H01L 29/785* (2013.01); *H01L 29/78696* (2013.01)

(58) Field of Classification Search
CPC ............ H01L 29/78696; H01L 27/088; H01L 29/0653; H01L 29/0673; H01L 29/66439; H01L 29/775; B82Y 10/00
See application file for complete search history.

(56) References Cited

OTHER PUBLICATIONS

U.S. Appl. No. 16/785,985, filed Feb. 10, 2020.
U.S. Appl. No. 16/916,466, filed Jun. 30, 2020.
Notice of Allowance dated Jan. 4, 2022 for U.S. Appl. No. 16/929,592.

\* cited by examiner

METHOD (AND RELATED APPARATUS) FOR FORMING A SEMICONDUCTOR DEVICE WITH REDUCED SPACING BETWEEN NANOSTRUCTURE FIELD-EFFECT TRANSISTORS

REFERENCE TO RELATED APPLICATIONS

This Application is a Divisional of U.S. application Ser. No. 16/929,592, filed on Jul. 15, 2020, which claims the benefit of U.S. Provisional Application No. 62/927,881, filed on Oct. 30, 2019. The contents of the above-referenced Patent Applications are hereby incorporated by reference in their entirety.

BACKGROUND

The integrated circuit (IC) manufacturing industry has experienced exponential growth over the last few decades. As ICs have evolved, the integration density of various electronic components (e.g., transistors, diodes, resistors, capacitors, etc.) has continued to improve by continual reductions in minimum feature sizes, which allow more electronic components to be integrated into a given area. This scaling down process provides a number of benefits, for example, increasing production yield, lowering fabrication costs, increasing device performance, etc. One advance by the IC manufacturing industry to scale down semiconductor devices is multi-gate field effect transistors (FETs). Some examples of multi-gate FETs include the double-gate FET, the triple-gate FET, the omega-gate FET, and the gate-all-around FET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
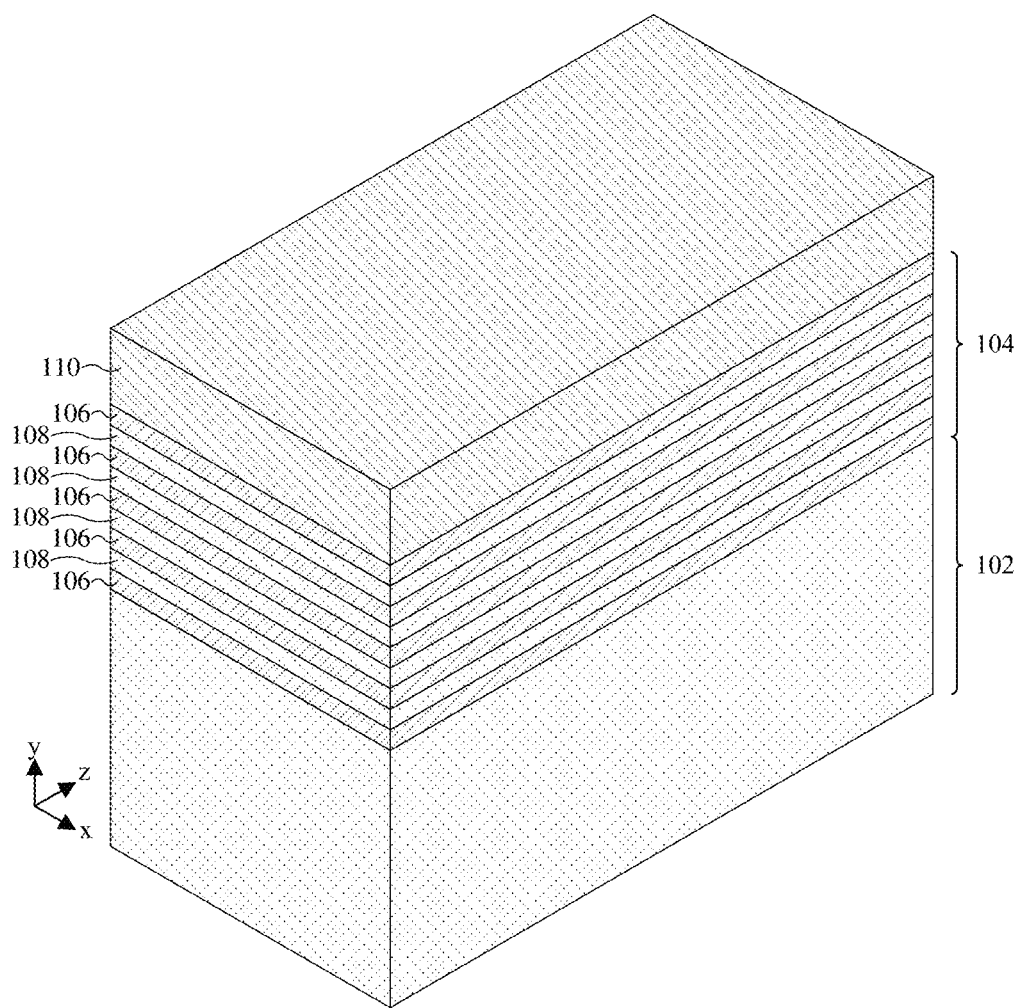
FIGS. 1-19 illustrate a series of various views of some embodiments of a method for forming a semiconductor device with reduced spacing between nanostructure field-effect transistors (NSFETs).

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device (e.g., an integrated circuit) comprises a first nanostructure field-effect transistor (NSFET) (e.g., a gate-all-around FET) and a second NSFET laterally spaced from the first NSFET. The first NSFET comprises a first metal gate that extends around a first plurality of nanostructures, which extend laterally between a pair of first source/drain regions. The second NSFET comprises a second metal gate that extends around a second plurality of nanostructures, which extend laterally between a pair of second source/drain regions.

Typically, a method for forming the above semiconductor device comprises forming a metal layer that extends continuously over both the first plurality of nanostructures and the second plurality of nanostructures. Thereafter, the metal layer is selectively etched to form separate metal gates, thereby forming the first metal gate and the second metal gate. The selective etch of the metal layer removes a portion of the metal layer between the first metal gate and the second metal gate, thereby forming an opening laterally between the first metal gate and the second metal gate. A dielectric layer is then deposited in the opening. The dielectric layer is configured to improve the device performance of the semiconductor device (e.g., reducing leakage between the first NSFET and the second NSFET) and/or reduce fabrication cost (e.g., by allowing the subsequent utilization of a self-aligned contact (SAC) process).

One challenge with the above method is that, as minimum feature sizes continue to scale down (e.g., 3 nanometer (nm) technology node and beyond), the above method does not provide sufficient control to reliably form the separate metal gates. For example, as the spacing between the first NSFET and the second NSFET is reduced (e.g., reducing the lateral spacing between the first plurality of nanostructures and the second plurality of nanostructures to less than 40 nm), the above method is insufficient to ensure the portion of the metal layer is selectively etched so that only predefined portions of the metal layer are removed (e.g., poor overlay control of various patterning processes may lead to the selective etch of the metal layer unintentionally removing portions of the metal layer that were not predefined to be removed). In other words, the above method may unintentionally remove other portions of the metal layer. Because the above method unintentionally removes portions of the metal layer, as minimum features sizes continue to scale down, the above method may cause electrical shorts (e.g., between the first metal gate and the second metal gate), negatively impact device performance (e.g., due to an unintentional reduction in the size of the first/second metal gate), and so forth, thereby reducing production yield.

In various embodiments, the present application is directed toward a method for forming a semiconductor device (e.g., an integrated circuit) with reduced spacing between nanostructure field-effect transistors (NSFETs). The method comprises forming a first dielectric structure over a first dielectric fin, and a second dielectric structure over a second dielectric fin. The first dielectric structure and the first dielectric fin laterally separate a first conductive structure from a second conductive structure. The second dielectric structure and the second dielectric fin laterally separate the second conductive structure from a third conductive structure. The first conductive structure extends around a first plurality of semiconductor nanostructures, the second conductive structure extends around a second plurality of semiconductor nanostructures, and the third conductive structure extends around a third plurality of semiconductor nanostructures. The second conductive structure is disposed between and laterally spaced from the first conductive structure and the second conductive structure.

A first dielectric layer is formed over the first dielectric fin, the second dielectric fin, the first plurality of semiconductor nanostructures, the second plurality of semiconductor nanostructures, the third plurality of semiconductor nanostructures, the first dielectric structure, the second dielectric structure, the first conductive structure, the second conductive structure, and the third conductive structure. Thereafter, the first dielectric layer is selectively etched to form a first opening in the first dielectric layer that at least partially overlies the second conductive structure, the first dielectric structure, and the second dielectric structure. A first etching process is then performed through the first opening that removes the second conductive structure. Thereafter, a second etching process is performed through the first opening to remove the second plurality of semiconductor nanostructures, thereby forming a second opening below the first opening. Further, the second etching process removes a portion of the first dielectric structure, thereby forming a third dielectric structure over the first dielectric fin, and removes a portion of the second dielectric structure, thereby forming a fourth dielectric structure over the second dielectric fin. A second dielectric layer is then formed in the first and second openings and at least partially covering the third dielectric structure and the fourth dielectric structure.

Because the first dielectric structure is formed over the first dielectric fin and the second dielectric structure is formed over the second dielectric fin, the etching window for forming the first opening is increased. For example, the first dielectric structure and the second dielectric structure allow the first opening to be formed with a greater width (e.g., due to resolution limitations in lithography) and/or shifted laterally from a predefined location (e.g., due to poor overlay control), while still ensuring the first opening only overlies desired features (e.g., the second conductive feature).

Further, during removal of the second conductive structure, the first dielectric structure and the second dielectric structure act as "retaining walls," thereby allowing the first etching process to selectively remove the second conductive structure. For example, because the first dielectric structure laterally separates the first conductive structure from the second conductive structure, and because the second dielectric structure laterally separates the second conductive structure from the third conductive structure, the first dielectric structure and the second dielectric structure act as "retaining walls" that prevent the first etching process from unintentionally removing portions of the first conductive structure and/or portions of the second conductive structure.

Moreover, because the second etching process removes the portion of the first dielectric structure (e.g., forming the third dielectric structure) and removes the portion of the second dielectric structure (e.g., forming the fourth dielectric structure), the second dielectric layer may be formed in a self-aligned manner. For example, after the second etching process, the third dielectric structure is disposed over the third fin and the fourth dielectric structure is disposed over the fourth fin. Thus, during formation of the second dielectric layer, the second dielectric layer will self-align with sidewalls of the third and fourth dielectric structures. Accordingly, as feature sizes continue to scale down, the method forms a semiconductor device with reduced spacing between NSFETs (e.g., less than 40 nm lateral spacing between the first plurality of nanostructures and the third plurality of nanostructures), thereby increasing production yield, improve device performance, prevent electrical shorts, and so forth.

Figure 11:
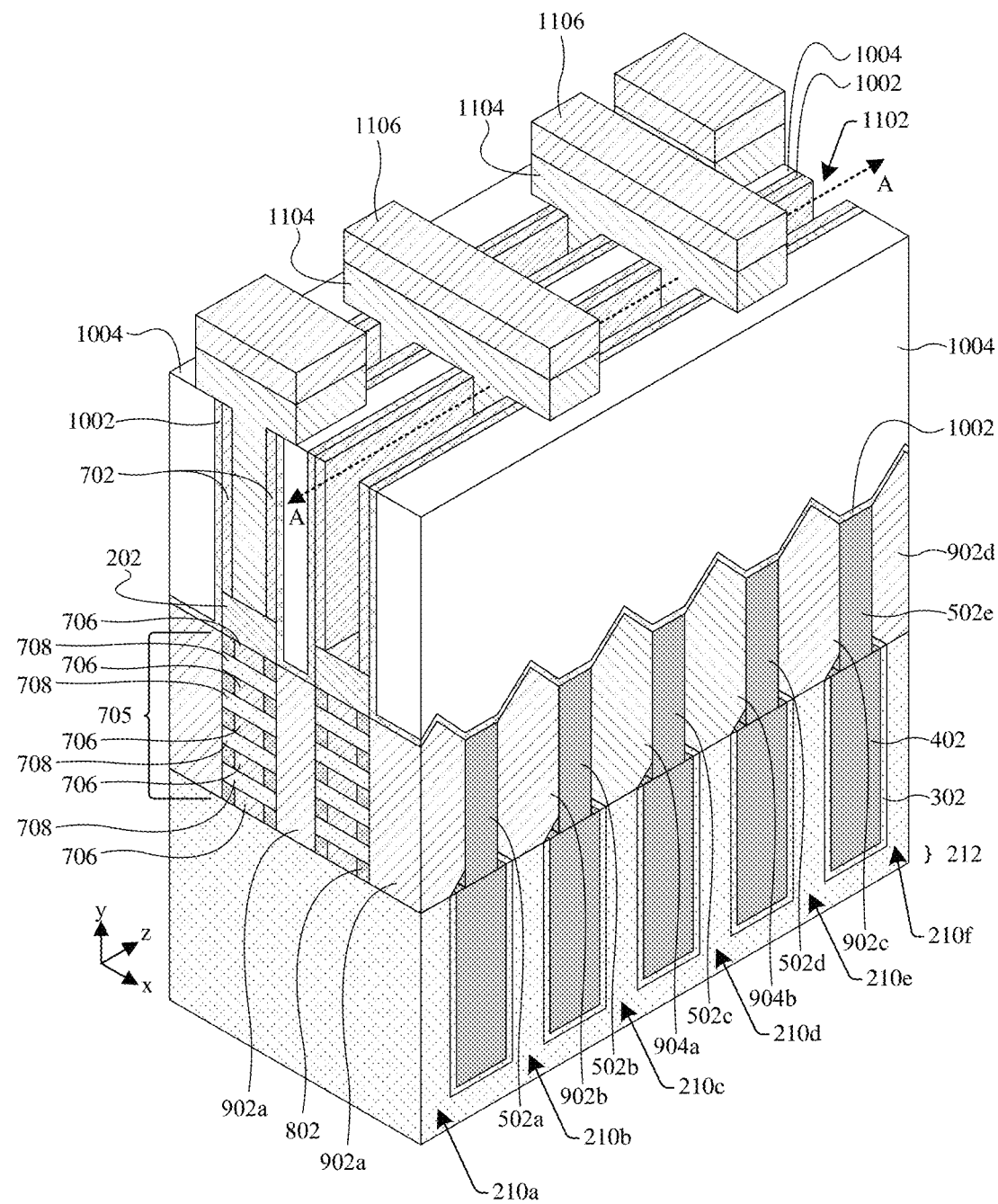
Figure 13:
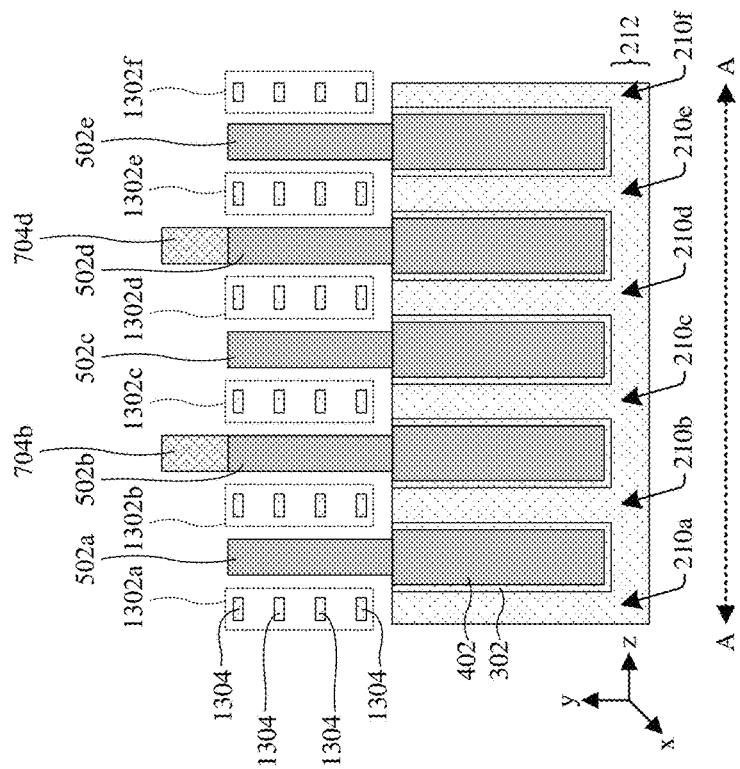
Figure 12:
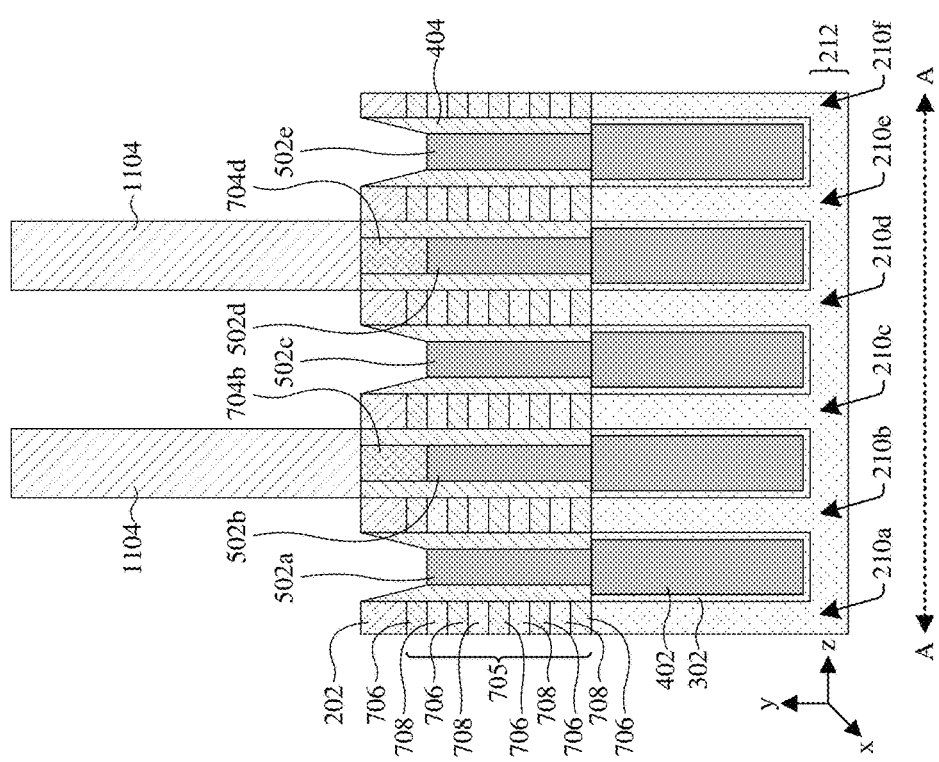
Figure 14:
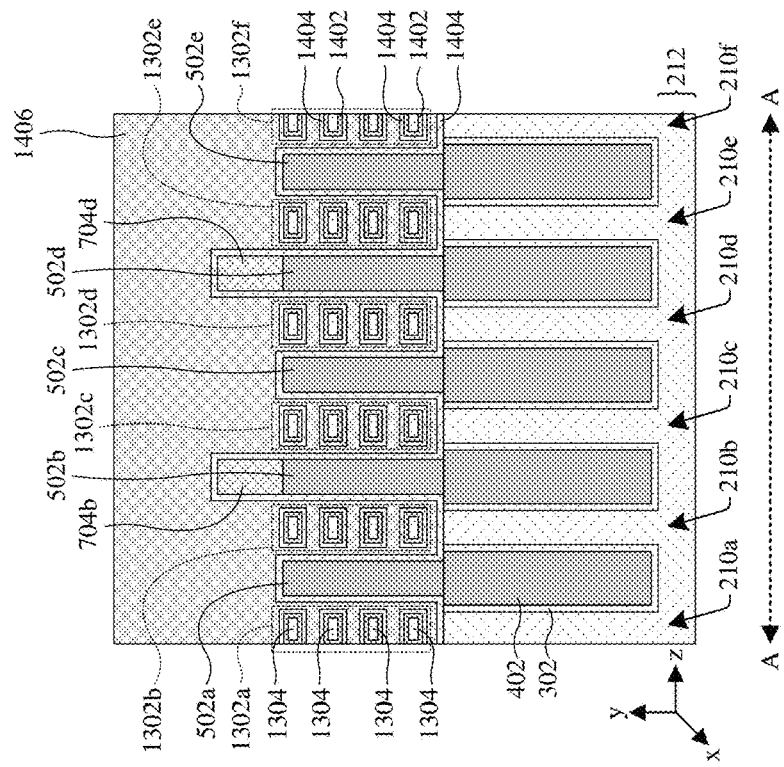

FIGS. 1-19 illustrate a series of various views of some embodiments of a method for forming a semiconductor device 1904 with reduced spacing between nanostructure field-effect transistors (NSFETs) 1810. FIGS. 1-11 illustrate a series of perspective views at various stages of the method for forming the semiconductor device 1904 with reduced spacing between NSFETs 1810. FIGS. 12-19 illustrate a series of cross-sectional views at various stages of the method for forming the semiconductor device 1904 with reduced spacing between NSFETs 1810. The cross-sectional views of FIGS. 12-19 are taken along line A-A of FIG. 11 and continue after the stage illustrated in FIG. 11. For example, FIG. 12 illustrates a first stage after the stage illustrated in FIG. 11 and taken along line A-A of FIG. 11, FIG. 13 illustrates a second stage after the first stage illustrated in FIG. 12 and taken along line A-A of FIG. 11, FIG. 14 illustrates a third stage after the second stage illustrated in FIG. 13 and taken along line A-A of FIG. 13, and so forth.

As shown in FIG. 1, a base semiconductor structure 102 is provided. The base semiconductor structure 102 comprises any type of semiconductor body (e.g., monocrystalline silicon/CMOS bulk, silicon-germanium (SiGe), silicon on insulator (SOI), etc.), which may be doped (e.g., with n-type or p-type dopants) or undoped. The base semiconductor structure 102 may be a semiconductor wafer (e.g., a disk-shaped silicon wafer) or a portion of a semiconductor wafer.

Also shown in FIG. 1, a stack of semiconductor layers 104 is formed over the base semiconductor structure 102. The stack of semiconductor layers 104 comprises alternating first semiconductor layers 106 and second semiconductor layers 108. The stack of semiconductor layers 104 may comprise any number of the first semiconductor layers 106 and any number of the second semiconductor layers 108.

The first semiconductor layers 106 are or comprise a first semiconductor material (e.g., silicon (Si), SiGe, germanium (Ge), gallium arsenide (GaAs), indium arsenide (InAs), indium phosphide (InP), etc.). The second semiconductor layers 108 are or comprises a second semiconductor material (e.g., Si, SiGe, Ge, GaAs, InAs, InP, etc.) that is different than the first semiconductor material. For example, the first semiconductor material is SiGe, and the second semiconductor material is Si. In such embodiments, the stack of semiconductor layers 104 comprises alternating layers of SiGe and Si. The first semiconductor layers 106 may be doped or undoped (e.g., depending on the design of the semiconductor device 1904). The second semiconductor layers 108 may be doped or undoped (e.g., depending on the design of the semiconductor device 1904). The first semiconductor material may be a different semiconductor material than the semiconductor material of the base semiconductor structure 102. For example, the semiconductor material of the base semiconductor structure 102 may be Si, and the first semiconductor material may be SiGe.

In some embodiments, a process for forming the stack of semiconductor layers 104 comprises epitaxially forming the first semiconductor layers 106 and the second semiconductor layers 108. For example, a first one of the first semiconductor layers 106 is grown on the base semiconductor structure 102 by a first epitaxial process, such as, vapor-phase epitaxy (VPE), liquid-phase epitaxy (LPE), molecular-beam epitaxy (MBE), some other epitaxial process, or a combination of the foregoing. Thereafter, a first one of the second semiconductor layers 108 is grown on the first one of the first semiconductor layers 106 by a second epitaxial process, such as, VPE, LPE, MBE, some other epitaxial process, or a combination of the foregoing. The first epitaxial process and the second epitaxial process are repeated in an alternative manner until the stack of semiconductor layers 104 is formed with a predefined number of the first semiconductor layers 106 and a predefined number of the second semiconductor layers 108. In some embodiments, after the stack of semiconductor layers 104 is formed, a planarization process (e.g., chemical mechanical polishing (CMP), an etchback process, or the like) may be performed to planarize an upper surface of the uppermost semiconductor layer of the stack of semiconductor layers 104 (e.g., an uppermost one of the first semiconductor layers 106).

In some embodiments, the first epitaxial process and the second epitaxial process may be performed in a same processing chamber (e.g., epitaxial growth chamber). In such embodiments, a first set of precursors for growing the first semiconductor layers 106 and a second set of precursors for growing the second semiconductor layers 108 may be cyclically pumped into the processing chamber. The first set of precursors comprises precursors for the formation of the first semiconductor material (e.g., SiGe), and the second set of precursors comprises precursors for the formation of the second semiconductor material (e.g., Si). In some embodiments, the first set of precursors comprises a silicon precursor (e.g., silane ($SiH_4$)) and a germanium precursor (e.g., germane ($GeH_4$)), while the second set of precursors comprises the silicon precursor without the germanium precursors. Thus, the silicon precursor may be flowed into the processing chamber, and then cyclically: (1) enabling a flow of the germanium precursor into the processing chamber when growing the first semiconductor layers 106; and (2) disabling the flow the germanium precursors to the processing chamber when growing the second semiconductor layers 108. It will be appreciated that, in some embodiments, one or more purging steps may be performed during formation of the stack of semiconductor layers 104 (e.g., purging the processing chamber between growing the first semiconductor layers 106 and the second semiconductor layers 108).

Also shown in FIG. 1, a hardmask layer 110 is formed over the stack of semiconductor layers 104. The hardmask layer 110 covers the stack of semiconductor layers 104. The hardmask layer 110 is or comprises, for example, an oxide (e.g., silicon dioxide ($SiO_2$)), a nitride (e.g., silicon nitride (SiN)), an oxy-nitride (e.g., silicon oxy-nitride (SiON)), some other hardmask material, or a combination of the foregoing. In some embodiments, a process for forming the hardmask layer 110 comprises depositing or growing the hardmask layer 110 on the upper surface of the stack of semiconductor layers 104. The hardmask layer 110 may be deposited or grown by, for example, chemical vapor deposition (CVD), physical vapor deposition (PVD), atomic layer deposition (ALD), thermal oxidation, some other deposition or growth process, or a combination of the foregoing. In further embodiments, the hardmask layer 110 may comprise multiple layers. For example, the hardmask layer 110 may comprise an oxide layer (e.g., $SiO_2$) and comprise a nitride layer (e.g., SiN) overlying the oxide layer.

Figure 2:
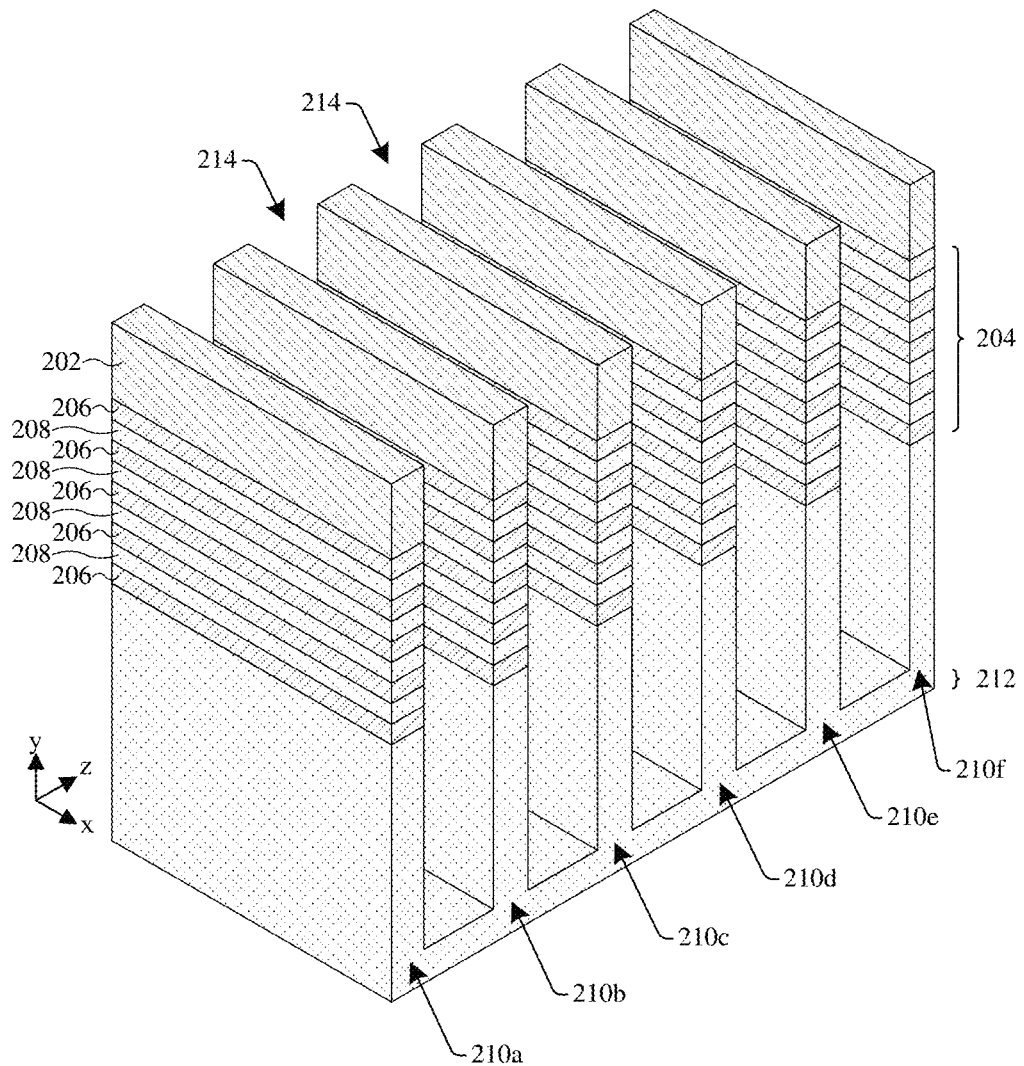

As shown in FIG. 2, a first hardmask structure 202, a plurality of first stacks of semiconductor structures 204, first semiconductor structures 206, second semiconductor structures 208, and semiconductor fins 210 are formed. For clarity in the figures, only some of the first stacks of semiconductor structures 204, the first semiconductor structures 206, the second semiconductor structures 208, and the semiconductor fins 210 are specifically labeled in the figures. Also shown in FIG. 2, the base semiconductor structure 102 is recessed, thereby forming a semiconductor substrate 212. The semiconductor substrate 212 may be referred to as a substrate 212 hereinafter.

The semiconductor fins 210 protrude vertically from the substrate 212. The semiconductor fins 210 are laterally spaced (along the z-axis). For example, a first semiconductor fin 210a, a second semiconductor fin 210b, a third semiconductor fin 210c, a fourth semiconductor fin 210d, a fifth semiconductor fin 210e, and a sixth semiconductor fin 210f are laterally spaced from one another (along the z-axis). The semiconductor fins 210 extend laterally (along the x-axis) over the substrate 212 and in parallel with one another.

The first stacks of semiconductor structures 204 overlie the semiconductor fins 210, respectively. The first stacks of semiconductor structures 204 are laterally spaced (along the z-axis). The first stacks of semiconductor structures 204 extend laterally (along the x-axis) over the semiconductor fins 210 and in parallel with one another. Each of the first stacks of semiconductor structures 204 comprises alternating first semiconductor structures 206 and second semiconductor structures 208. The first hardmask structure 202 overlies the first stacks of semiconductor structures 204.

In some embodiments, a process for forming the first hardmask structure 202 comprises forming a first patterned masking layer (not shown) (e.g., positive/negative photoresist) over the hardmask layer 110. The first patterned masking layer may be formed by forming a masking layer (not shown) over the hardmask layer 110, exposing the masking layer to a pattern (e.g., via a lithography process, such as photolithography, extreme ultraviolet lithography, or the like), and developing the masking layer to form the first patterned masking layer. Thereafter, with the first patterned masking layer in place, a first etching process is performed on the hardmask layer 110 to remove unmasked portions of the hardmask layer 110, thereby leaving masked portions of the hardmask layer 110 in place as the first hardmask structure 202. The first etching process may be a dry etching process, a wet etching process, a reactive ion etching (RIE) process, some other etching process, or a combination of the foregoing. Subsequently, the first patterned masking layer may be stripped away.

The first hardmask structure 202 is then utilized as an etching mask to form the first stacks of semiconductor structures 204, the first semiconductor structures 206, the second semiconductor structures 208, the semiconductor fins 210, and the substrate 212. With the first hardmask structure 202 in place, a second etching process is performed on the stack of semiconductor layers 104 and the base semiconductor structure 102 (see, FIG. 1). The second etching process removes unmasked portions of the stack of semiconductor layers 104, thereby leaving masked portions of the stack of semiconductor layers 104 in place as the first stacks of semiconductor structures 204. In other words, the second etching process removes unmasked portions of the first semiconductor layers 106 and the second semiconductor layers 108, thereby leaving masked portions of the first semiconductor layers 106 in place as the first semiconductor structures 206 and leaving masked portions of the second semiconductor layers 108 in place as the second semiconductor structures 208. The second etching process also recesses unmasked portions of the base semiconductor structure 102, thereby leaving portions (e.g., masked portions and recessed portions) of the base semiconductor structure 102 in place as the substrate 212 and the semiconductor fins 210. The second etching process may be a dry etching process, a wet etching process, a RIE process, some other etching process, or a combination of the foregoing.

Further, the process for forming the first hardmask structure 202, the first stacks of semiconductor structures 204, the first semiconductor structures 206, the second semiconductor structures 208, the semiconductor fins 210, and the substrate 212 forms first trenches 214 over the substrate 212. For clarity in the figures, only some of the first trenches 214 are specifically labeled in the figures. The first trenches 214 are laterally spaced (along the z-axis). The first trenches 214 are laterally separated (along the z-axis) by the semiconductor fins 210. In other words, the first trenches 214 are disposed on opposite sides of the semiconductor fins 210. The first trenches 214 extend laterally (along the x-axis) over the substrate 212 and in parallel with one another.

It will be appreciated that the first hardmask structure 202, the first stacks of semiconductor structures 204, the first semiconductor structures 206, the second semiconductor structures 208, the semiconductor fins 210, and the substrate 212 may be formed by any suitable method. For example, the first hardmask structure 202, the first stacks of semiconductor structures 204, the first semiconductor structures 206, the second semiconductor structures 208, the semiconductor fins 210, and the substrate 212 may be formed by using one or more photolithography processes, such as a double-patterning process, a multi-patterning process, or the like. The semiconductor fins 210 may be referred to as fins 210 hereinafter.

Figure 3:
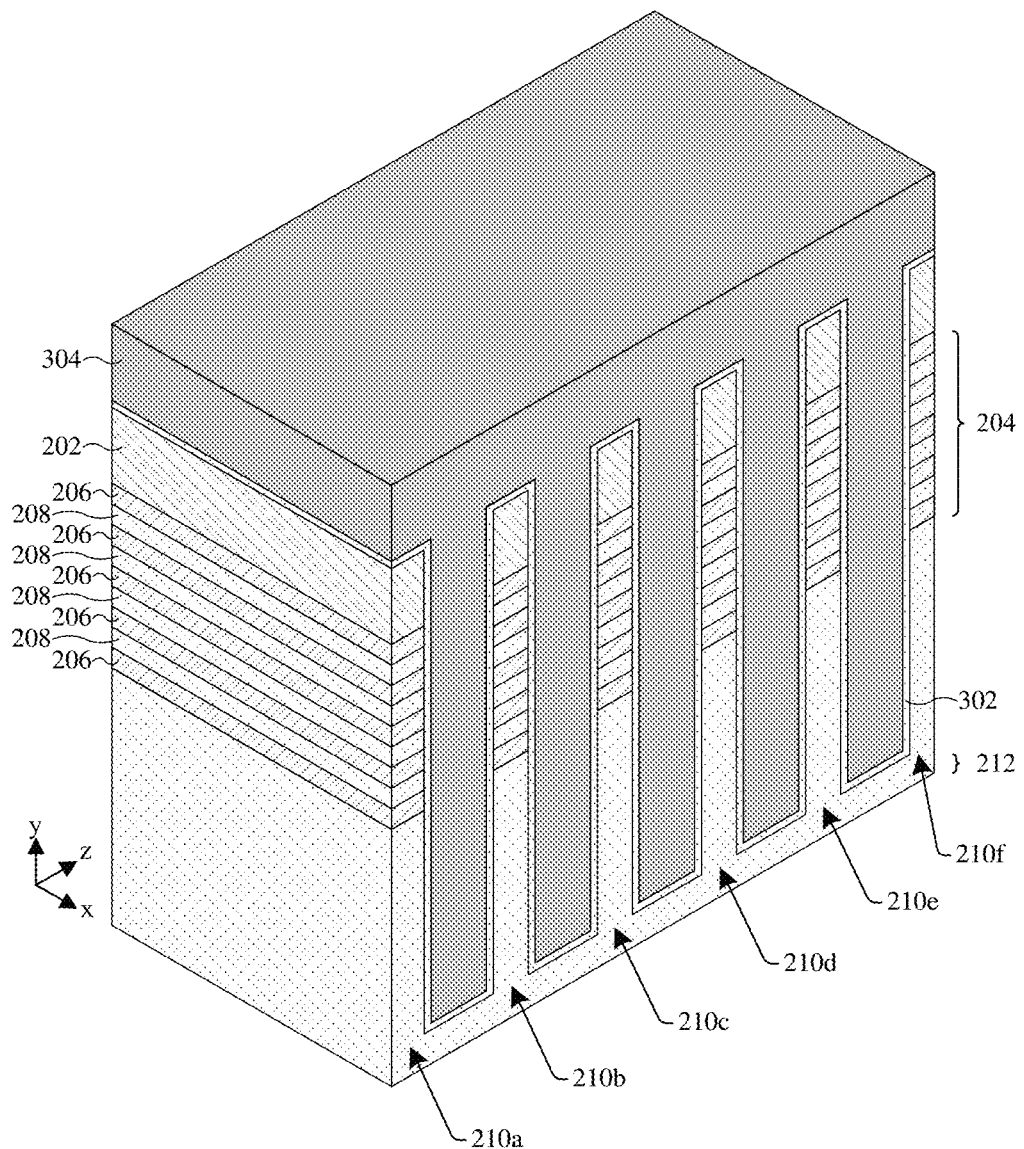

As shown in FIG. 3, a liner layer 302 is formed along sidewalls of the first trenches 214 and lower surfaces of the first trenches 214 (see, FIG. 2). In other words, the liner layer 302 is formed along sidewalls of the fins 210, upper surfaces of the substrate 212 (e.g., upper surfaces disposed between the fins 210), sidewalls of the first stacks of semiconductor structures 204, and sidewalls of the first hardmask structure 202. In some embodiments, the liner layer 302 may be formed over upper surfaces of the first hardmask structure 202. In further embodiments, a process for forming the liner layer 302 comprises growing or depositing the liner layer 302 by, for example, CVD, PVD, ALD, an epitaxial process, some other deposition or growth process, or a combination of the foregoing.

The liner layer 302 is or comprises a semiconductor material (e.g., Si, SiGe, etc.). In some embodiments, the semiconductor material of the liner layer 302 may be the same as the semiconductor material of the fins 210 (e.g., the semiconductor material of the base semiconductor structure 102). In other embodiments, the semiconductor material of the liner layer 302 may be the same as the semiconductor material of the first semiconductor structures 206 (e.g., the first semiconductor material). In further embodiments, the liner layer 302 is a conformal layer.

Also shown in FIG. 3, a first dielectric layer 304 is formed over the substrate 212, the first hardmask structure 202, and the liner layer 302. The first dielectric layer 304 is formed after the liner layer 302. The first dielectric layer 304 is formed filling the first trenches 214 (see, FIG. 2). The first dielectric layer 304 may be formed with a planar upper surface. The first dielectric layer 304 is or comprises, for example, a nitride (e.g., SiN), an oxy-nitride (e.g., SiON), a silicon-carbon-nitride (e.g., SiCN), a silicon-carbon-oxy-nitride (e.g., $SiC_XO_YN_Z$), a metal oxide (e.g., aluminum oxide (AlO), hafnium oxide (HfO), zirconium oxide (ZrO), yttrium oxide (YO)), some other dielectric material, or a combination of the foregoing. More specifically, in some embodiments, the first dielectric layer 304 is $SiC_XO_YN_Z$ having a first $SiC_XO_YN_Z$ composition (e.g., a first combination of values for X, Y, and Z). In further embodiments, a process for forming the first dielectric layer 304 comprises depositing the first dielectric layer 304 in the first trenches 214, over the liner layer 302, and over the first hardmask structure 202 by, for example, CVD, PVD, ALD, some other deposition process, or a combination of the foregoing.

Figure 4:
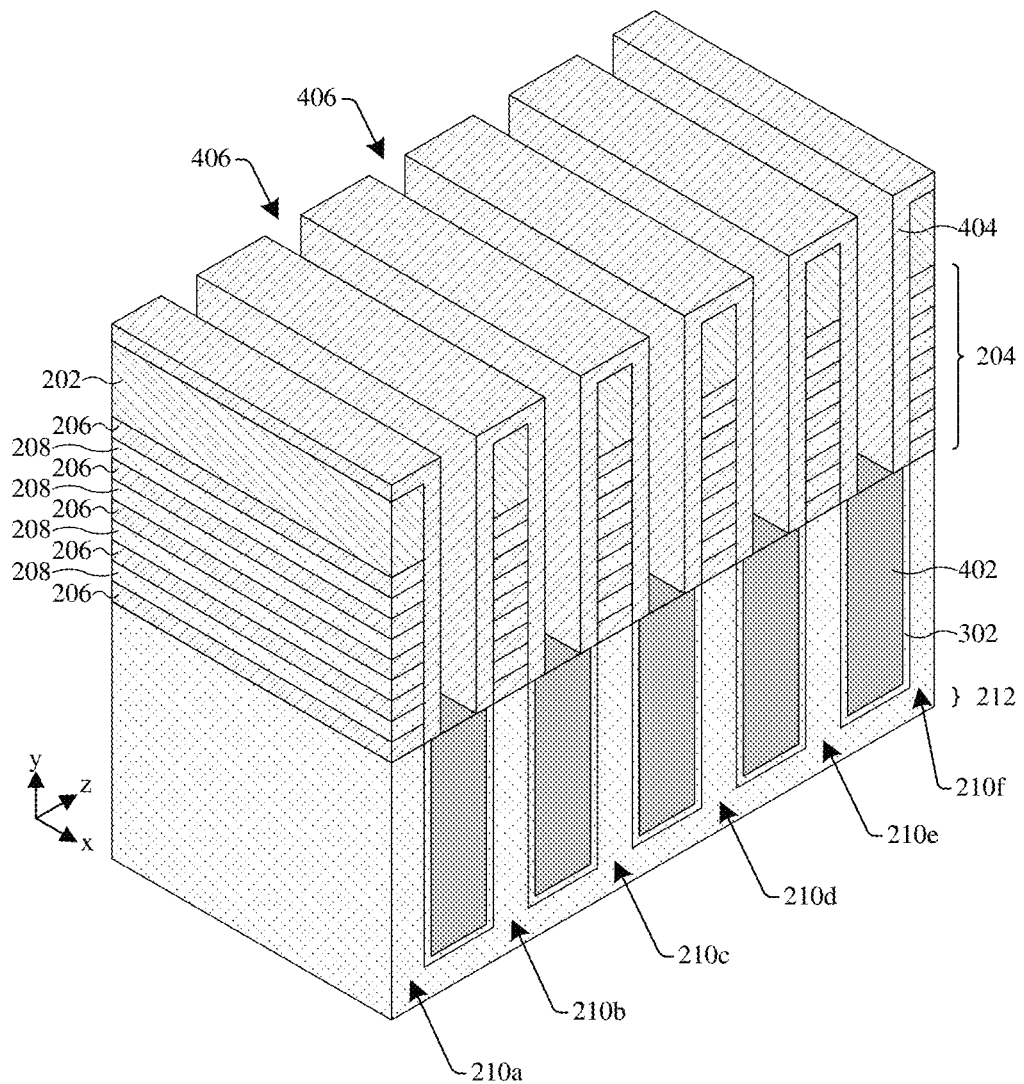

As shown in FIG. 4, isolation structures 402 are formed over the substrate 212 and between the fins 210. For clarity in the figures, only some of the isolation structures 402 are specifically labeled in the figures. The isolation structures 402 may be referred to as shallow trench isolation (STI) structures. The isolation structures 402 are laterally spaced (along the z-axis). The isolation structures 402 are laterally separated (along the z-axis) by the semiconductor fins 210. In some embodiments, the isolation structures 402 extend laterally (along the x-axis) over the substrate 212 and in parallel with one another. In further embodiments, the isolation structures 402 may be portions of one or more continuous isolation structures that laterally surround one or more of the fins 210 (e.g., a larger STI structure may have some portions that extend laterally along the x-axis and some other portions that extend laterally along the z-axis, such that the larger STI structure laterally surrounds one or more of the fins 210).

The isolation structures 402 may have upper surfaces that are substantially planar. In other embodiments, the upper surfaces of the isolation structures 402 may be convex or concave. The upper surfaces of the isolation structures 402 may be substantially aligned (e.g., flush) with upper surfaces of the fins 210. In other embodiments, the upper surfaces of the isolation structures 402 may be disposed below or above the upper surfaces of the fins 210.

In some embodiments, a process for forming the isolation structures 402 comprises recessing the first dielectric layer 304 (see, FIG. 3). The first dielectric layer 304 may be recessed by performing a third etching process on the first dielectric layer 304. Thus, the third etching process recesses the first dielectric layer 304 to a predefined height, thereby leaving the lower portions of the first dielectric layer 304 in place as the isolation structures 402. In some embodiments, the third etching process also removes an upper portion of the liner layer 302, thereby leaving lower portions of the liner layer 302 along sidewalls of the fins 210 and upper surfaces of the substrate 212, as shown in FIG. 4. In other embodiments, the third etching process may be more selective to the first dielectric layer 304 than the liner layer 302, thereby leaving the liner layer 302 in place along sidewalls of the first stacks of semiconductor structures 204, sidewalls of the first hardmask structure 202, and upper surfaces of the first hardmask structure 202. The third etching process may be, for example, a dry etching process, a wet etching process, some other etching process, or a combination of the foregoing. In some embodiments, the third etching process may be referred to as a first etchback process.

Also shown in FIG. 4, capping structures 404 are formed over the first stacks of semiconductor structures 204, respectively. The capping structures 404 are also formed over the isolation structures 402, the liner layer 302, and the first hardmask structure 202. For clarity in the figures, only some of the capping structures 404 are specifically labeled in the figures. The capping structures 404 are or comprises a semiconductor material (e.g., Si, SiGe, etc.). In some embodiments, the semiconductor material of the capping structures 404 is the same as the semiconductor material of the first semiconductor structures 206 (e.g., the first semiconductor material). For example, the capping structures 404 are SiGe, and the first semiconductor structures 206 are SiGe.

In some embodiments, a process for forming the capping structures 404 comprises growing or depositing the capping structures 404 over the first stacks of semiconductor structures 204 and the first hardmask structure 202. The capping structures 404 may be grown or deposited by, for example, CVD, PVD, ALD, an epitaxial process, some other deposition or growth process, or a combination of the foregoing. In further embodiments, the capping structures 404 are selectively grown from exposed surfaces of the liner layer 302 (e.g., via an epitaxial process), and thus the upper surfaces of the isolation structures 402 are free of the capping structures 404.

Further, the processes for forming the isolation structures 402 and the capping structures 404 also forms second trenches 406 over the substrate 212. The second trenches 406 are also formed over the isolation structures 402, respectively. For clarity in the figures, only some of the second trenches 406 are specifically labeled in the figures. The second trenches 406 are laterally spaced (along the z-axis). The second trenches 406 are laterally separated (along the z-axis) by the capping structures 404. In other words, the second trenches 406 are disposed on opposite sides of the capping structures 404 and over the isolation structures 402. The second trenches 406 extend laterally (along the x-axis) over the isolation structures 402 and in parallel with one another.

Figure 5:
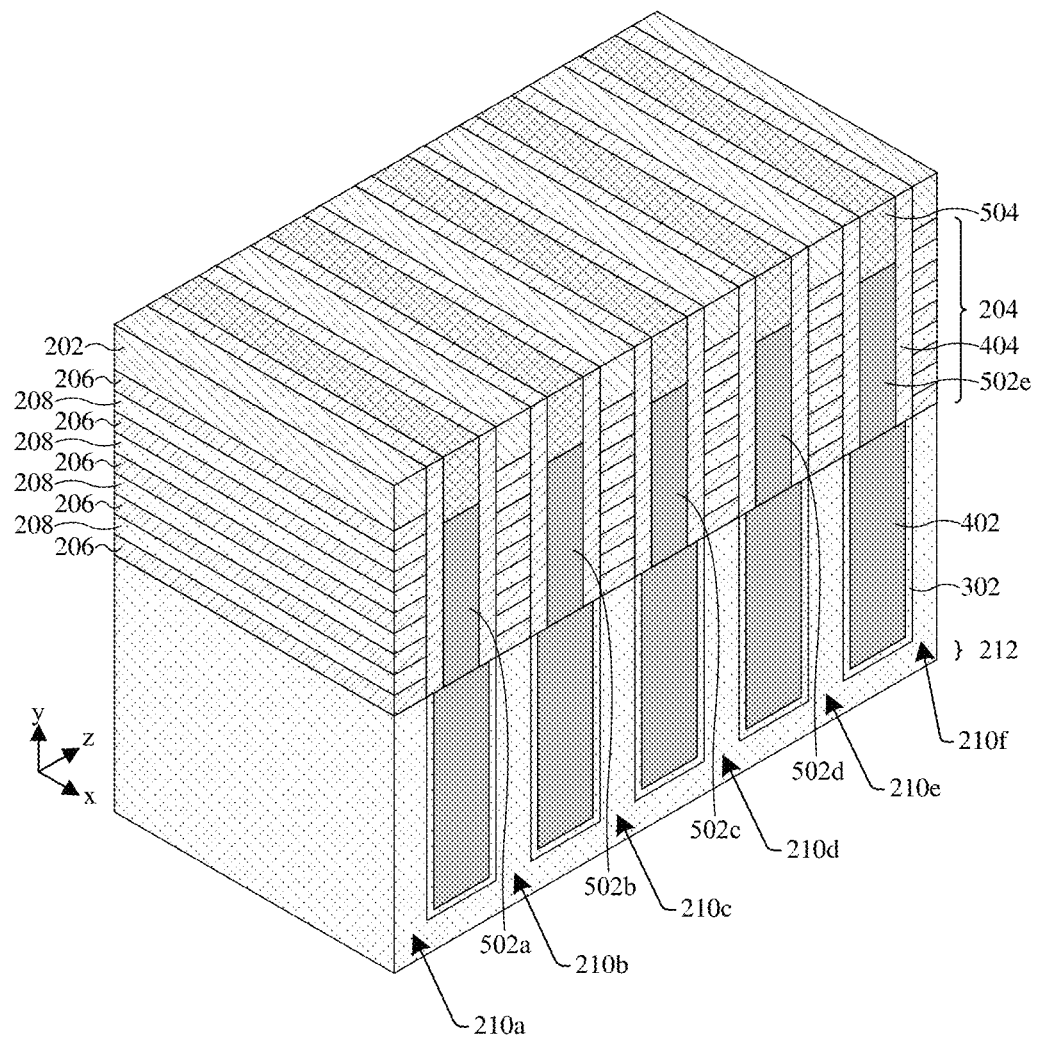

As shown in FIG. 5, dielectric fins 502 are formed over the substrate 212 and the fins 210. The dielectric fins 502 are also formed over (e.g., directly over) the isolation structures 402, respectively. The dielectric fins 502 are laterally spaced (along the z-axis). For example, a first dielectric fin 502a, a second dielectric fin 502b, a third dielectric fin 502c, a fourth dielectric fin 502d, and a fifth dielectric fin 502e are laterally spaced from one another (along the z-axis). The dielectric fins 502 are laterally separated (along the z-axis) by the capping structures 404. In other words, the dielectric fins 502 are disposed on the opposite sides of the capping structures 404 and over the isolation structures 402. The dielectric fins 502 extend laterally (along the x-axis) over the isolation structures 402 and in parallel with one another.

The dielectric fins 502 have upper surfaces that are disposed below upper surfaces of the first stacks of semiconductor structures 204. More specifically, the upper surfaces of the dielectric fins 502 are disposed below upper surfaces of the uppermost semiconductor structures of the first stacks of semiconductor structures 204 (e.g., uppermost ones of the first semiconductor structures 206 of the first stacks of semiconductor structures 204). In some embodiments, the upper surfaces of the dielectric fins 502 are substantially aligned with upper surfaces of the uppermost second semiconductor structures 208 of the first stacks of semiconductor structures 204. In other embodiments, the upper surfaces of the dielectric fins 502 are disposed below or above the upper surfaces of the uppermost second semiconductor structures 208 of the first stacks of semiconductor structures 204. In further embodiments, the upper surfaces of the dielectric fins 502 are substantially planar. In other embodiments, the upper surfaces of the dielectric fins 502 may be convex or concave.

The dielectric fins 502 are or comprise, for example, a nitride (e.g., SiN), an oxy-nitride (e.g., SiON), a silicon-carbon-nitride (e.g., SiCN), a silicon-carbon-oxy-nitride (e.g., $SiC_XO_YN_Z$), a metal oxide (e.g., AlO, HfO, ZrO, YO), some other dielectric material, or a combination of the foregoing. More specifically, in some embodiments, the dielectric fins 502 are $SiC_XO_YN_Z$ having a second $SiC_XO_YN_Z$ composition (e.g., a second combination of values for X, Y, and Z). In some embodiments, the second $SiC_XO_YN_Z$ composition is different than the first $SiC_XO_YN_Z$ composition.

In some embodiments, a process for forming the dielectric fins 502 comprises forming a second dielectric layer (not shown) over the substrate 212, the isolation structures 402, the liner layer 302, the capping structures 404, and the first hardmask structure 202. The second dielectric layer is formed filling the second trenches 406 (see, FIG. 4). The second dielectric layer may be formed with a planar upper surface. The second dielectric layer is or comprises, for example, an oxide (e.g., $SiO_2$), a nitride (e.g., SiN), an oxy-nitride (e.g., SiON), a silicon-carbon-oxy-nitride (e.g., $SiC_XO_YN_Z$), some other dielectric material, or a combination of the foregoing. More specifically, in some embodiments, the second dielectric layer is $SiC_XO_YN_Z$ having the second $SiC_XO_YN_Z$ composition (e.g., a second combination of values for X, Y, and Z). In some embodiments, a process for forming the second dielectric layer comprises depositing the second dielectric layer in the second trenches 406, over the isolation structures 402, and over the capping structures 404 by, for example, CVD, PVD, ALD, some other deposition process, or a combination of the foregoing.

Thereafter, the second dielectric layer is recessed to a predefined height. The second dielectric layer may be recessed by a fourth etching process. The fourth etching process is more selective to the second dielectric layer than other features underlying the second dielectric layer (e.g., the capping structures 404 and the first hardmask structure 202). Thus, the fourth etching process recesses the second dielectric layer to the predefined height, thereby leaving lower portions of the second dielectric layer in place as the dielectric fins 502. The fourth etching process may be, for example, a dry etching process, a wet etching process, some other etching process, or a combination of the foregoing. In some embodiments, the fourth etching process may be referred to as a second etchback process.

Also shown in FIG. 5, dielectric strips 504 are formed over the substrate 212. The dielectric strips 504 are also formed over (e.g., directly over) the dielectric fins 502, respectively. For clarity in the figures, only some of the dielectric strips 504 are specifically labeled in the figures. The dielectric strips 504 are laterally spaced (along the z-axis). The dielectric strips 504 are laterally separated (along the z-axis) by the capping structures 404. In other words, the dielectric strips 504 are disposed on the opposite sides of the capping structures 404 and over the dielectric fins 502. The dielectric strips 504 extend laterally (along the x-axis) over the dielectric fins 502 and in parallel with one another.

The dielectric strips 504 extend vertically (along the y-axis) from the upper surfaces of the dielectric fins 502, respectively. In other words, the dielectric strips 504 contact the upper surfaces of the dielectric fins 502, respectively, and extend vertically from the upper surfaces of the dielectric fins 502 to upper surfaces of the dielectric strips 504, respectively. The upper surfaces of the dielectric strips 504 are substantially planar. The upper surfaces of the dielectric strips 504 are substantially aligned with upper surfaces of the capping structures 404 and upper surfaces of the first hardmask structure 202.

The dielectric strips 504 are or comprise, for example, an oxide (e.g., $SiO_2$), a high-k dielectric (e.g., HfO, ZrO, hafnium aluminate (HfAlO), hafnium silicate (HfSiO), or some other dielectric material with a dielectric constant greater than 3.9), a silicon-carbon-nitride (e.g., SiCN), a metal oxide (e.g., AlO, HfO, ZrO, YO), some other dielectric material, or a combination of the foregoing. The dielectric strips 504 comprise a different dielectric material than the dielectric fins 502. For example, the dielectric strips 504 are HfO, and the dielectric fins 502 are $SiC_XO_YN_Z$. In some embodiments, because the dielectric fins 502 comprise a first dielectric material (e.g., $SiC_XO_YN_Z$) and the dielectric strips 504 comprise a second dielectric material (e.g., HfO) different than the first dielectric material, the dielectric fins 502 and corresponding dielectric strips 504 may be collectively referred to as hybrid fins. For example, a first one of the hybrid fins comprises a first one of the dielectric fins 502 and a corresponding first one of the dielectric strips 504 that overlies the first one of the dielectric fins 502.

In some embodiments, a process for forming the dielectric strips 504 comprises forming a third dielectric layer (not shown) over the substrate 212, the dielectric fins 502, the capping structures 404, and the first hardmask structure 202. The third dielectric layer is or comprises, for example, an oxide (e.g., $SiO_2$), a high-k dielectric (e.g., HfO, ZrO, hafnium aluminate (HfAlO), hafnium silicate (HfSiO), or some other dielectric material with a dielectric constant greater than 3.9), a silicon-carbon-nitride (e.g., SiCN), a metal oxide (e.g., AlO, HfO, ZrO, YO), some other dielectric material, or a combination of the foregoing. The third dielectric layer comprises a different dielectric material than the second dielectric layer. For example, the third dielectric layer is HfO, and the second dielectric layer is $SiC_XO_YN_Z$. In some embodiments, a process for forming the third dielectric layer comprises depositing the third dielectric layer over the dielectric fins 502, the capping structures 404, and the first hardmask structure 202 by, for example, CVD, PVD, ALD, some other deposition process, or a combination of the foregoing.

Thereafter, a planarization process (e.g., CMP) is performed on the third dielectric layer. The planarization process removes an upper portion of the third dielectric layer, thereby leaving lower portions of the third dielectric layer in place as the dielectric strips 504, respectively. The planarization process is also performed on the first hardmask structure 202 and the capping structures 404. Thus, the planarization process removes upper portions of the first hardmask structure 202 and the capping structures 404, thereby co-planarizing upper surfaces of the dielectric strips 504, upper surfaces of the first hardmask structure 202, and upper surfaces of the capping structures 404.

Figure 6:
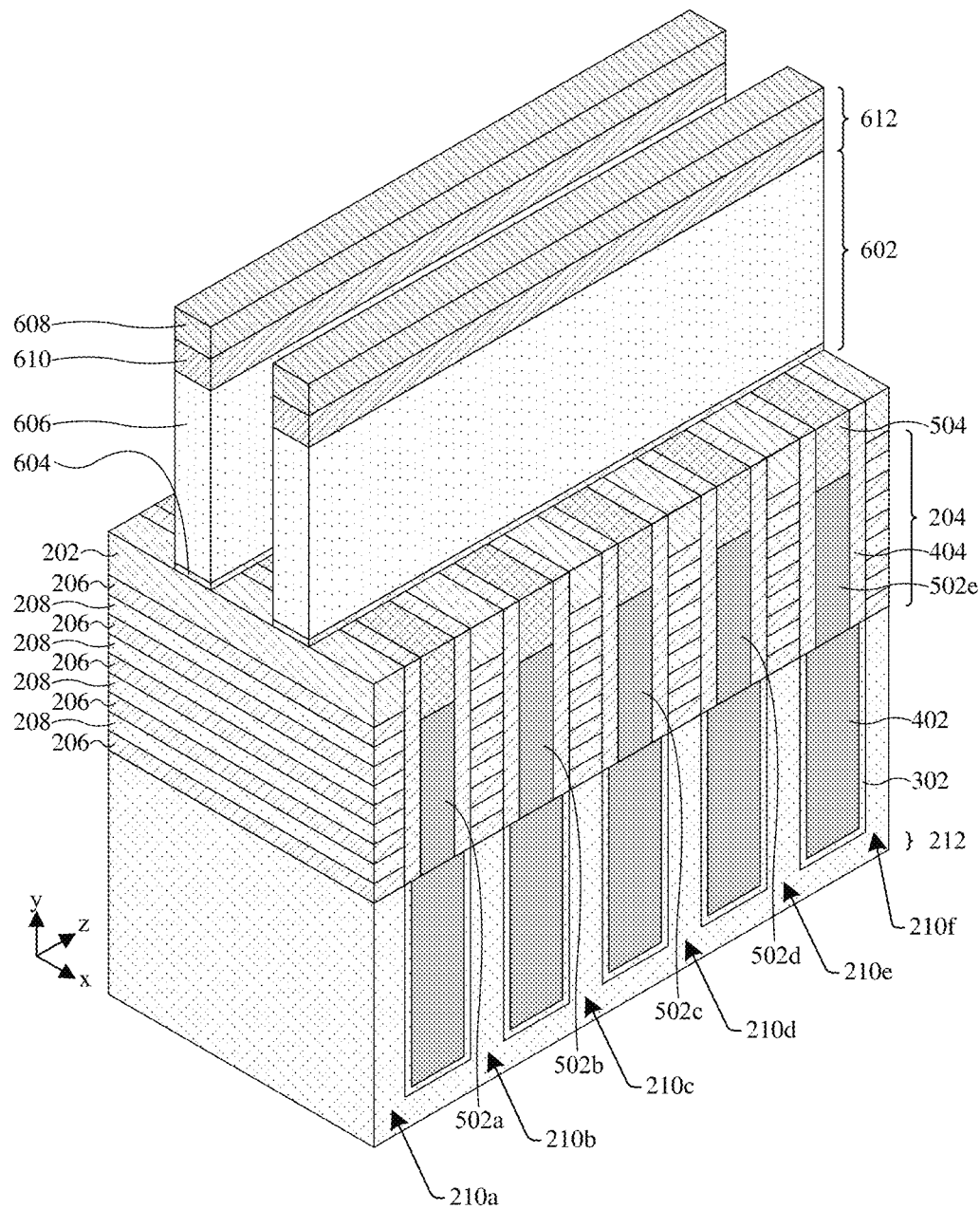

As shown in FIG. 6, dummy gate structures 602 are formed over the substrate 212, the fins 210, the first stacks of semiconductor structures 204, the isolation structures 402, the liner layer 302, the capping structures 404, the dielectric fins 502, the dielectric strips 504, and the first hardmask structure 202. In some embodiments, the dummy gate structures 602 comprise dummy gate dielectric structures 604, respectively, and dummy gate material structures 606, respectively. The dummy gate material structures 606 overlie the dummy gate dielectric structures 604, respectively. For clarity in the figures, only some of the dummy gate structures 602, the dummy gate dielectric structures 604, and the dummy gate material structures 606 are specifically labeled in the figures.

The dummy gate structures 602 are laterally spaced (along the x-axis). The dummy gate structures 602 extend laterally (along the z-axis) over the substrate 212, the fins 210, the first stacks of semiconductor structures 204, the isolation structures 402, the liner layer 302, the capping structures 404, the dielectric fins 502, the dielectric strips 504, and the first hardmask structure 202. The dummy gate material structures 606 may be or comprise, for example, polysilicon, although the dummy gate material structures 606 may be or comprise other materials. The dummy gate dielectric structures 604 are or comprise, for example, an oxide (e.g., $SiO_2$), a nitride (e.g., SiN), an oxy-nitride (e.g., SiON), some other dielectric material, or a combination of the foregoing.

In some embodiments, a process for forming the dummy gate structures 602 comprises depositing a dummy gate dielectric layer (not shown) over the substrate 212, the fins 210, the first stacks of semiconductor structures 204, the isolation structures 402, the liner layer 302, the capping structures 404, the dielectric fins 502, the dielectric strips 504, and the first hardmask structure 202. The dummy gate dielectric layer may be deposited as a conformal layer. The dummy gate dielectric layer is or comprises, for example, an oxide (e.g., $SiO_2$), a nitride (e.g., SiN), an oxy-nitride (e.g., SiON), some other dielectric material, or a combination of the foregoing. In some embodiments, the dummy gate dielectric layer is deposited by, for example, CVD, PVD, ALD, some other deposition process, or a combination of the foregoing.

A dummy gate material layer (not shown) is then deposited on and covering the dummy gate dielectric layer. The dummy gate material layer may be or comprise, for example, polysilicon, although the dummy gate material layer may be or comprise other materials. The dummy gate material layer may be deposited by, for example, CVD, PVD, ALD, some other deposition process, or a combination of the foregoing.

Thereafter, a first hardmask layer (not shown) is deposited or grown on and covering the dummy gate material layer. The first hardmask layer is or comprises, for example, an oxide (e.g., $SiO_2$), a nitride (e.g., SiN), an oxy-nitride (e.g., SiON), some other hardmask material, or a combination of the foregoing. The first hardmask layer may be deposited or grown by, for example, CVD, PVD, ALD, thermal oxidation, some other deposition or growth process, or a combination of the foregoing.

A second hardmask layer (not shown) is then deposited on and covering the first hardmask layer. The second hardmask layer is or comprises, for example, an oxide (e.g., $SiO_2$), a nitride (e.g., SiN), an oxy-nitride (e.g., SiON), some other hardmask material, or a combination of the foregoing. The second hardmask layer comprises a different hardmask material than the first hardmask. For example, the first hardmask may be $SiO_2$, and the second hardmask may be SiN. The second hardmask layer may be deposited by, for example, CVD, PVD, ALD, some other deposition process, or a combination of the foregoing.

Thereafter, a second patterned masking layer (not shown) (e.g., positive/negative photoresist) is formed over the second hardmask layer. With the second patterned masking layer in place, a fifth etching process is performed to remove unmasked portions of the second hardmask layer, thereby leaving masked portions of the second hardmask layer in place as a second hardmask structure 608. With the second hardmask structure 608 in place over the first hardmask layer, a sixth etching process is then performed to remove unmasked portions of the first hardmask layer, thereby leaving masked portions of the first hardmask layer in place as a third hardmask structure 610. The second hardmask structure 608 and the third hardmask structure may be collectively referred to as a fourth hardmask structure 612. The fifth etching process may be, for example, a dry etching process, a wet etching process, a RIE process, some other etching process, or a combination of the foregoing. The sixth etching process may be, for example, a dry etching process, a wet etching process, a RIE process, some other etching process, or a combination of the foregoing.

Thereafter, with the fourth hardmask structure 612 in place over dummy gate material layer and the dummy gate dielectric layer, a seventh etching process is performed on the dummy gate material layer and the dummy gate dielectric layer to form the dummy gate structures 602. The seventh etching process removes unmasked portions of the dummy gate material layer, thereby leaving masked portions of the dummy gate material layer in place as the dummy gate material structures 606. The seventh etching process also removes unmasked portions of the dummy gate dielectric layer, thereby leaving masked portions of the dummy gate dielectric layer in place as the dummy gate dielectric structures 604. Thus, the dummy gate structures 602 are formed. The seventh etching process may be, for example, a dry etching process, a wet etching process, a RIE process, some other etching process, or a combination of the foregoing.

Figure 7:
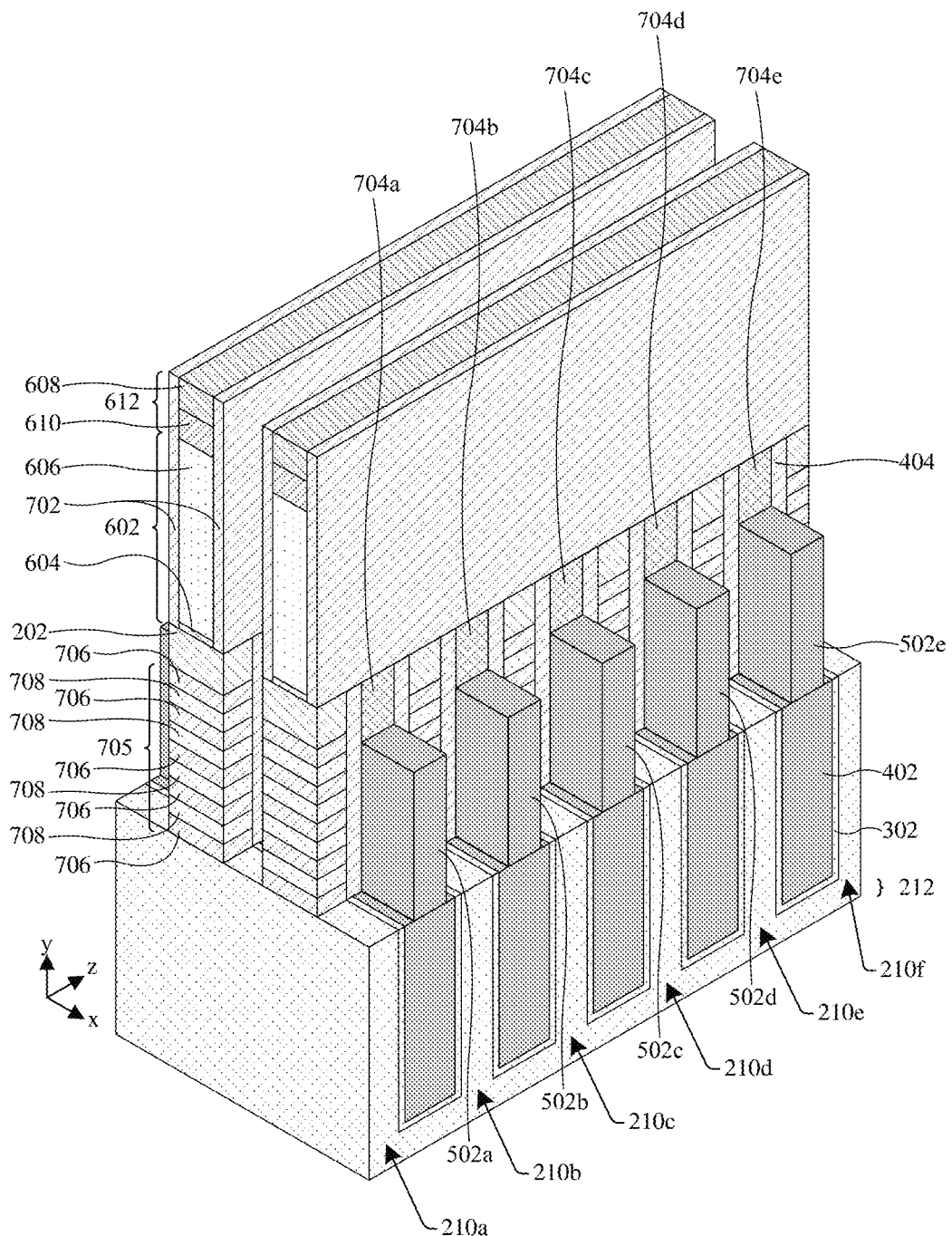

As shown in FIG. 7, first sidewall spacers 702 are formed along the sidewalls of the dummy gate material structures 606. In some embodiments, the first sidewall spacers 702 are also formed along the sidewalls of the fourth hardmask structure 612. For clarity in the figures, only some of the first sidewall spacers 702 are specifically labeled in the figures.

In some embodiments, a process for forming the first sidewall spacers 702 comprises depositing a first spacer layer over the structure illustrated in FIG. 6. The first spacer layer may be deposited conformally over the structure illustrated in FIG. 6. The first spacer layer is or comprises, for example, an oxide (e.g., $SiO_2$), a nitride (e.g., SiN), an oxy-nitride (e.g., SiON), some other hardmask material, or a combination of the foregoing. Thereafter, an eighth etching process is performed on the first spacer layer to remove horizontal portions (e.g., portions over the fourth hardmask structure 612, the first hardmask structure 202, the capping structures 404, and the dielectric strips 504) of the first spacer layer, thereby leaving vertical portions of the first spacer layer in place as the first sidewall spacers 702 (e.g., along sidewalls of the dummy gate dielectric structures 604, the dummy gate material structures 606, the third hardmask structure 610, and the second hardmask structure 608). The eighth etching process may be, for example, a dry etching process, an RIE process, some other etching process, or a combination of the foregoing.

Also shown in FIG. 7, portions of the first hardmask structure 202, portions of the first stacks of semiconductor structures 204, portions of the capping structures 404, and portions of the dielectric strips 504 (see, FIG. 6) that are outside the boundaries of the first sidewall spacers 702 (e.g., outside the outer sidewalls of the first sidewall spacers 702) are removed. In some embodiments, a process for removing the portions of the first hardmask structure 202, the portions of the first stacks of semiconductor structures 204, the portions of the capping structures 404, and the portions of the dielectric strips 504 that are outside the boundaries of the first sidewall spacers 702 comprise performing a ninth etching process on the first hardmask structure 202, the first stacks of semiconductor structures 204, the capping structures 404, and the dielectric strips 504.

The ninth etching process is an anisotropic etch. The ninth etching process may be, for example, a dry etching process, an RIE process, some other etching process, or a combination of the foregoing. The ninth etching process utilizes etchant(s) that are selective to the first hardmask structure 202, the first semiconductor structures 206, the second semiconductor structures 208, the capping structures 404, and the dielectric strips 504 (e.g., having a higher etching rate for these materials than the dielectric fins 502 and/or the isolation structures 402).

During the ninth etching process, the dummy gate structures 602, the fourth hardmask structure 612, and the first sidewall spacers 702 act collectively as an etching mask. Thus, the ninth etching process removes the portions of the first hardmask structure 202, the portions of the first stacks of semiconductor structures 204, the portions of the capping structures 404, and the portions of the dielectric strips 504 that are outside the boundaries of the first sidewall spacers 702. The ninth etching process exposes upper surfaces of the fins 210. In some embodiments, the ninth etching process stops at (or near) the upper surfaces of the isolation structures 402.

The ninth etching process forms a first plurality of dielectric structures 704. For example, the ninth etching process forms a first dielectric structure 704a, a second dielectric structure 704b, a third dielectric structure 704c, a fourth dielectric structure 704d, and a fifth dielectric structure 704e. The first plurality of dielectric structures 704 are discrete portions of the dielectric strips 504 that remain after the ninth etching process. The first plurality of dielectric structures 704 are formed over (e.g., directly over) the dielectric fins 502 and below (e.g., directly below) both the first sidewall spacers 702 and the dummy gate structures 602. The first plurality of dielectric structures 704 are spaced from one another (along the z-axis and/or along the x-axis). It will be appreciated that the first plurality of dielectric structures 704 may comprise more dielectric structures than those listed above (e.g., the first plurality of dielectric structures 704 comprises other discrete portions of the dielectric strips 504 that remain under other dummy gate structures 602 but are not illustrate in the figures due to the perspective views of the figures).

The ninth etching process also forms a plurality of second stacks of semiconductor structures 705. Each of the second stacks of semiconductor structures 705 comprises alternating third semiconductor structures 706 and fourth semiconductor structures 708. The third semiconductor structures 706 are portions of the first semiconductor structures 206 that remain after the ninth etching process. The fourth semiconductor structures 708 are portions of the second semiconductor structures 208 that remain after the ninth etching process. For clarity in the figures, only some of the second stacks of semiconductor structures 705, the third semiconductor structures 706, and the fourth semiconductor structures 708 are specifically labeled.

The second stacks of semiconductor structures 705 are formed over (e.g., directly over) the fins 210 and below (e.g., directly below) both the first sidewall spacers 702 and the dummy gate structures 602. More specifically, the second stacks of semiconductor structures 705 are formed over (e.g., directly over) the fins 210 and below (e.g., directly below) discrete portions of the first hardmask structure 202. The discrete portions of the first hardmask structure 202 are formed by the ninth etching process. The discrete portions of the first hardmask structure 202 are discrete portions of the first hardmask structure 202 that remain after the ninth etching process. The discrete portions of the first hardmask structure 202 are laterally spaced (along the z-axis). The discrete portions of the first hardmask structure 202 are laterally disposed (along the z-axis) and between the capping structures 404. The discrete portions of the first hardmask structure 202 are disposed over (e.g., directly over) the second stacks of semiconductor structures 705, respectively, and below (e.g., directly below) both the first sidewall spacers 702 and the dummy gate structures 602.

Because the ninth etching process is an anisotropic etching process, each of the first plurality of dielectric structures 704, each of the discrete portions of the first hardmask structure 202, each of the third semiconductor structures 706, and each of the fourth semiconductor structures 708 are formed with outer sidewalls (laterally spaced along the x-axis) that are substantially aligned with the outer sidewalls (laterally spaced in the x-axis) of the first sidewall spacers 702. Further, because the ninth etching process is an anisotropic etching process, the portions of the capping structures 404 that remain after the ninth etching process also have outer sidewalls (laterally spaced along the x-axis) that are substantially aligned with the outer sidewalls (laterally spaced in the x-axis) of the first sidewall spacers 702. In some embodiments, the first plurality of dielectric structures 704 are referred to as a first plurality of dielectric fin helmets because they cover (and protect in subsequent processing steps) portions of the upper surfaces of the dielectric fins 502.

Figure 8:
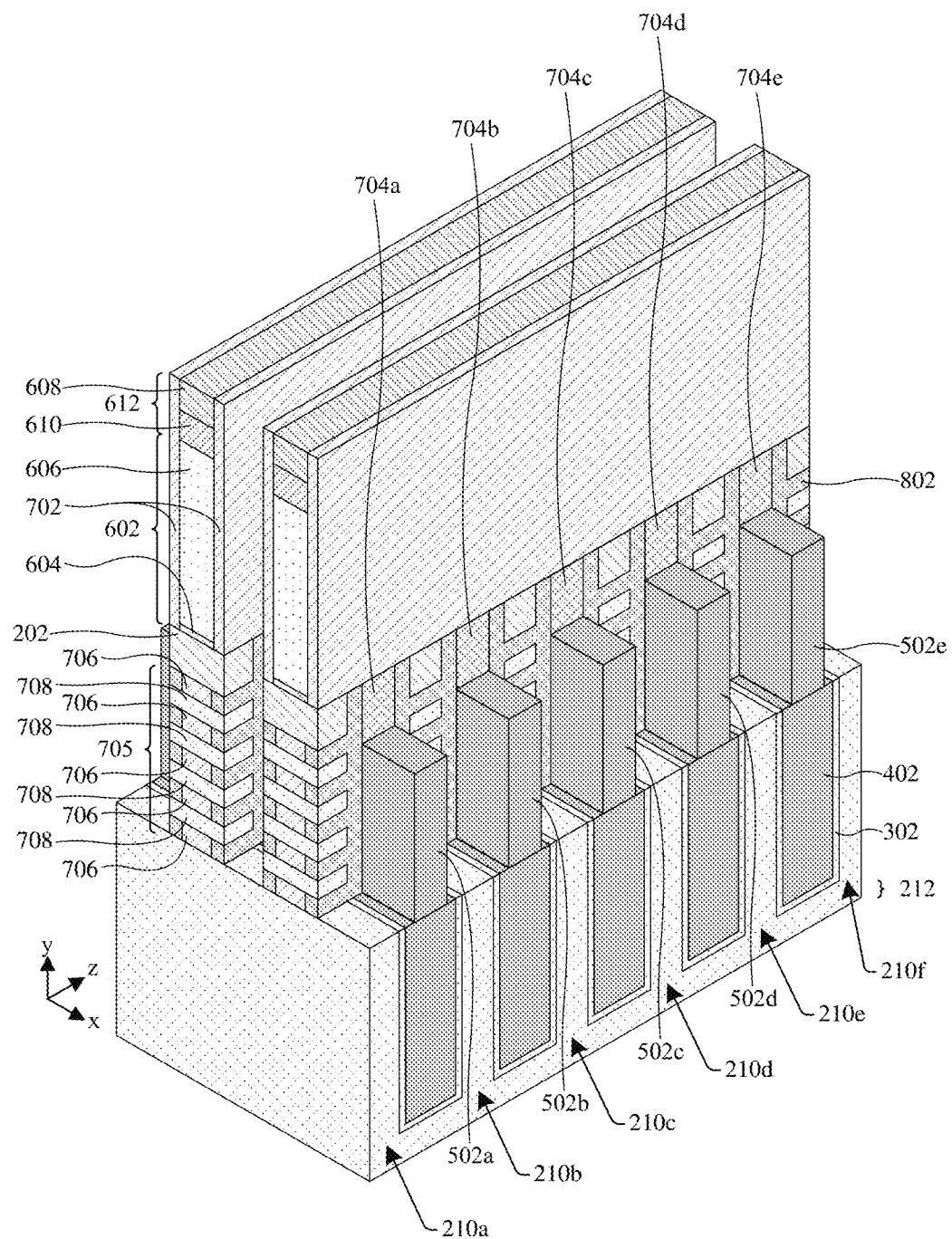

As shown in FIG. 8, second sidewall spacers 802 are formed along outer sidewalls (laterally spaced along the x-axis) of each of the third semiconductor structures 706. The second sidewall spacers 802 are also formed along outer sidewalls (laterally spaced along the x-axis) of the capping structures 404. Further, the second sidewall spacers 802 are formed partially along opposite sidewalls (laterally spaced along the z-axis) of the discrete portions of the first hardmask structure 202. For clarity in the figures, only some of the second sidewall spacers 802 are specifically labeled in the figures. In some embodiments, the second sidewall spacers 802 may be referred to as inner sidewall spacers.

In some embodiments, a process for forming the second sidewall spacers 802 comprises performing a tenth etching process that laterally etches (along the x-axis) the third semiconductor structures 706 and the capping structures 404. The tenth etching process is selective to the material of the third semiconductor structures 706 and the capping structures 404 (e.g., the first semiconductor material (e.g., SiGe)), and therefore laterally recesses both the third semiconductor structures 706 and the capping structures 404. After the tenth etching process, the outer sidewalls of each of the third semiconductor structures 706 and the outer sidewalls of each of the capping structures 404 are recessed in relation to the outer sidewalls of the first hardmask structure 202, the outer sidewalls of the first sidewall spacers 702, and the outer sidewalls of the first plurality of dielectric structures 704.

Thereafter, a second spacer layer (not shown) is formed filling the recesses formed by the tenth etching process. The second spacer layer may be formed by depositing the second spacer layer in the recesses formed by the tenth etching process and over the substrate 212, the fins 210, the liner layer 302, the isolation structures 402, the dielectric fins 502, the second stacks of semiconductor structures 705, the first hardmask structure 202, the first plurality of dielectric structures 704, the first sidewall spacers 702, the dummy gate structures 602, and the fourth hardmask structure 612. In some embodiments, the second spacer layer may be deposited as a conformal layer. In further embodiments, the second spacer layer is or comprises, for example, an oxide (e.g., $SiO_2$), a nitride (e.g., SiN), an oxy-nitride (e.g., SiON), some other dielectric material, or a combination of the foregoing. The second spacer layer may be deposited by, for example, CVD, PVD, ALD, some other deposition process, or a combination of the foregoing.

An eleventh etching process is then performed on the second spacer layer to partially remove the second spacer layer, thereby leaving portions of the second spacer layer along the outer sidewalls of the third semiconductor structures 706 and the outer sidewalls of the capping structures 404 as the second sidewall spacers 802. More specifically, the eleventh etching process is an anisotropic that trims the second spacer layer, such that only portions of the second spacer layer remain in the recesses formed by the tenth etching process. Thus, the second sidewall spacers 802 may be formed with sidewalls that are substantially aligned with the outer sidewalls of the first hardmask structure 202, the outer sidewalls of the first sidewall spacers 702, and the outer sidewalls of the first plurality of dielectric structures 704. The eleventh etching process may be, for example, a plasma etching process, a dry etching process, RIE, some other etching process, or a combination of the foregoing.

Figure 9:
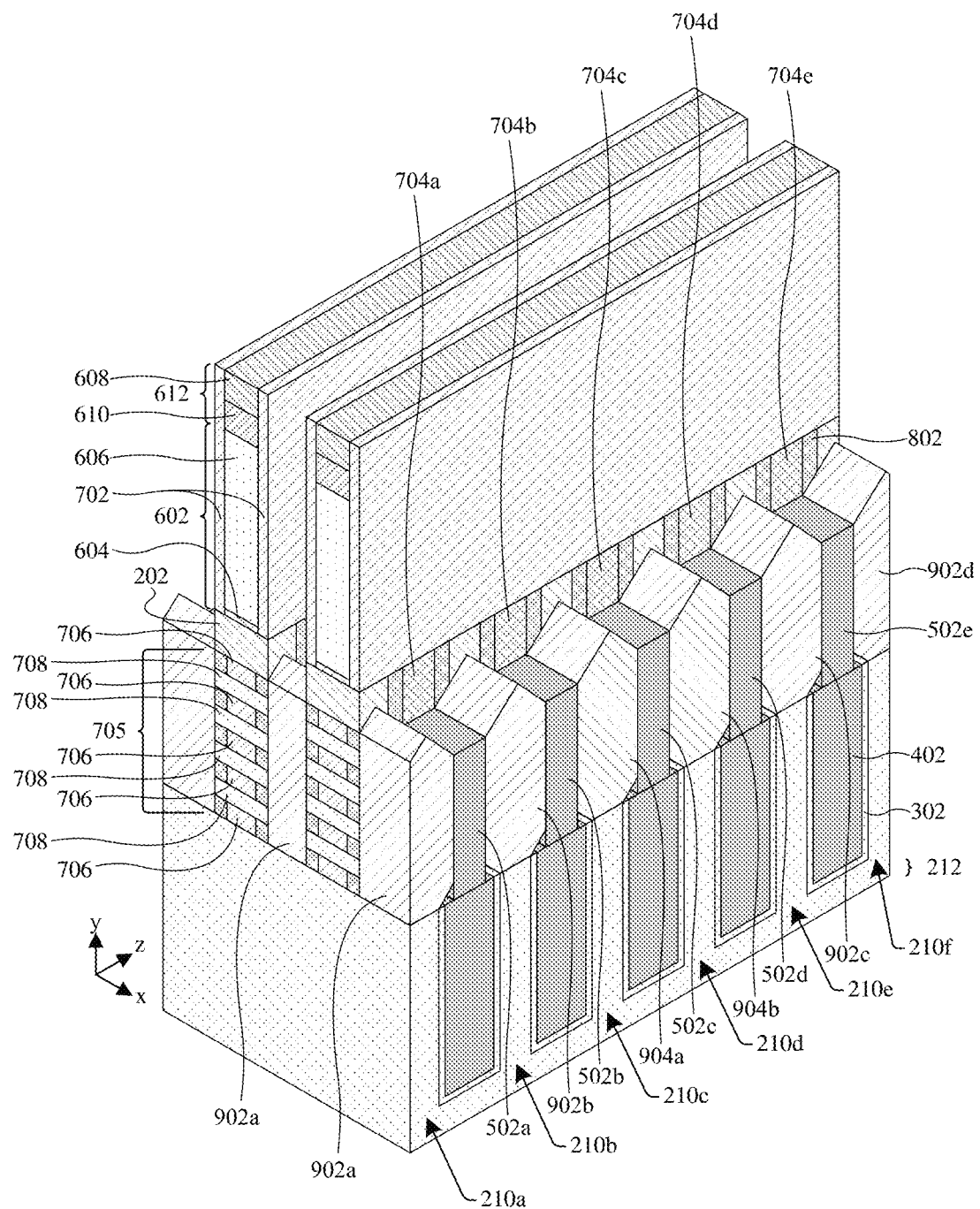

As shown in FIG. 9, pairs of first source/drain regions 902 and pairs of second source/drain regions 904 are formed over the fins 210. For clarity in the figures, only some of the first source/drain regions 902 and only some of the second source/drain regions 904 are specifically labeled. The first source/drain regions 902 are formed over (e.g., directly over) some of the fins 210, respectively, and the second source/drain regions 904 are formed over (e.g., directly over) some other of the fins 210, respectively. For example, a first pair 902a of the first source/drain regions 902 is formed over (e.g., directly over) the first fin 210a, a second pair 902b of the first source/drain regions 902 is formed over (e.g., directly over) the second fin 210b, a third pair 904a of the second source/drain regions 904 is formed over (e.g., directly over) the third fin 210c, a fourth pair 904b of the second source/drain regions 904 is formed over (e.g., directly over) the fourth fin 210d, a fifth pair 902c of the first source/drain regions 902 is formed over (e.g., directly over)

the fifth fin 210e, and a sixth pair 902d of the first source/drain regions 902 is formed over (e.g., directly over) the sixth fin 210f.

The first source/drain regions 902 of the pairs of the first source/drain regions 902 (e.g., the first pair 902a, the second pair 902b, the fifth pair 902c, and the sixth pair 902d) are laterally spaced (along the x-axis) and disposed on opposite sides of the dummy gate structures 602. The second source/drain regions 904 of the pairs of the second source/drain regions 904 (e.g., the third pair 904a and the fourth pair 904b) are laterally spaced (along the x-axis) and disposed on opposite sides of the dummy gate structures 602. The pairs of the first source/drain regions 902 and the pairs of the second source/drain regions 904 are laterally spaced (along the z-axis). The pairs of the first source/drain regions 902 and the pairs of the second source/drain regions 904 are laterally separated (along the z-axis) by the dielectric fins 502. In other words, the pairs of the first source/drain regions 902 and the pairs of the second source/drain regions 904 are disposed on opposite sides of the dielectric fins 502.

The fourth semiconductor structures 708 that overlie a corresponding fin 210 extend laterally (along the x-axis) between the source/drain regions of the pairs of the source/drain regions that overlie the corresponding fin 210, respectively. For example, one of the second stacks of semiconductor structures 705 that overlies the first fin 210a is disposed between the first source/drain regions 902 of the first pair 902a, and the fourth semiconductor structures 708 of the one of the second stacks of semiconductor structures 705 that overlies the first fin 210a extend laterally (along the x-axis) between the first source/drain regions 902 of the first pair 902a. The second sidewall spacers 802 that overlie a corresponding fin 210 are disposed between the source/drain regions of the pairs of the source/drain regions that overlie the corresponding fin 210, respectively. For example, one of the second sidewall spacers 802 that is disposed along the outer sidewalls of the third semiconductor structures 706 of the one of the second stacks of semiconductor structures 705 that overlies the first fin 210a is disposed between the first source/drain regions 902 of the first pair 902a.

The first source/drain regions 902 are or comprise, for example, Si, Ge, SiGe, silicon carbide (SiC), some other semiconductor material, or a combination of the foregoing. In some embodiments, the first source/drain regions 902 are an epitaxial semiconductor material (e.g., a semiconductor material formed by an epitaxial process, such as epitaxial Si, epitaxial Ge, epitaxial SiGe, epitaxial SiC, etc.). The second source/drain regions 904 are or comprise, for example, Si, Ge, SiGe, SiC, some other semiconductor material, or a combination of the foregoing. In some embodiments, the second source/drain regions 904 are an epitaxial semiconductor material (e.g., a semiconductor material formed by an epitaxial process, such as epitaxial Si, epitaxial Ge, epitaxial SiGe, epitaxial SiC, etc.).

In some embodiments, the first source/drain regions 902 and the second source/drain regions 904 comprise a same semiconductor material. In other embodiments, the first source/drain regions 902 and the second source/drain regions 904 comprise a different semiconductor material. In further embodiments, the first source/drain regions 902 have a first doping type (e.g., p-type). In yet further embodiments, the second source/drain regions 904 have a second doping type (e.g., n-type) opposite the first doping type.

In some embodiments, a process for forming the first source/drain regions 902 and the second source/drain regions 904 comprises epitaxially forming the first source/drain regions 902 and the second source/drain regions 904. A third epitaxial process is performed to grow the first source/drain regions 902 from upper surfaces of corresponding fins 210. For example, the first source/drain regions 902 of the first pair 902a are formed from upper surfaces of the first fin 210a, the first source/drain regions 902 of the second pair 902b are formed from upper surfaces of the second fin 210b, the first source/drain regions 902 of the fifth pair 902c are formed from upper surfaces of the fifth fin 210e, and the first source/drain regions 902 of the sixth pair 902d are formed from upper surfaces of the sixth fin 210f. In some embodiments, the third epitaxial process may be, for example, VPE, LPE, MBE, some other epitaxial process, or a combination of the foregoing. The third epitaxial process may in-situ dope the first source/drain regions 902 with first doping type dopants (e.g., p-type dopants, such as boron atoms).

A fourth epitaxial process is performed to grow the second source/drain regions 904 from upper surfaces of corresponding fins 210. For example, the second source/drain regions 904 of the third pair 904a are formed from upper surfaces of the third fin 210c and the second source/drain regions 904 of the fourth pair 904b are formed from upper surfaces of the fourth fin 210d. In some embodiments, the fourth epitaxial process may be, for example, VPE, LPE, MBE, some other epitaxial process, or a combination of the foregoing. The fourth epitaxial process may in-situ dope the second source/drain regions 904 with second doping type dopants (e.g., n-type dopants, such as phosphorus atoms). It will be appreciated that the upper surfaces of the fins 210 in which the second source/drain regions 904 are grown from may be masked (e.g., via a masking layer) during the third epitaxial process. It will be appreciated that the first source/drain regions 902 may be masked (e.g., via a masking layer) during the fourth epitaxial process.

Figure 10:
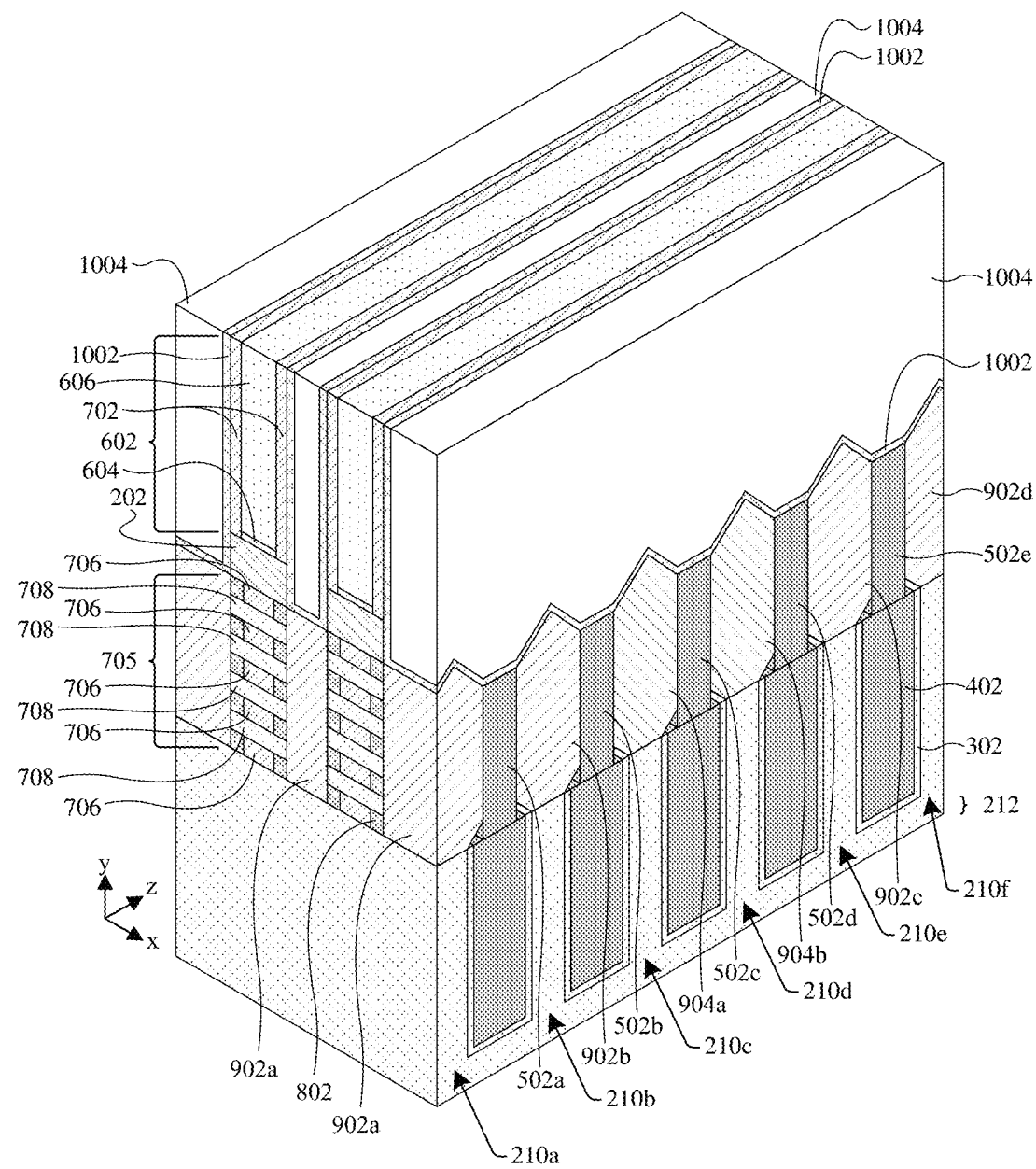

As shown in FIG. 10, a first etch stop layer 1002 (e.g., contact etch stop layer (CESL)) is formed over the structure illustrated in FIG. 9, and an interlayer dielectric (ILD) layer 1004 is formed over the first etch stop layer 1002. The first etch stop layer 1002 is or comprises, for example, an oxide (e.g., $SiO_2$), a nitride (e.g., SiN), an oxy-nitride (e.g., SiON), some other dielectric material, or a combination of the foregoing. The ILD layer 1004 is or comprises, for example, a low-k dielectric (e.g., a dielectric material with a dielectric constant less than about 3.9), an oxide (e.g., $SiO_2$), or the like.

In some embodiments, a process for forming the first etch stop layer 1002 and the ILD layer 1004 comprises depositing the first etch stop layer 1002 over and covering the structure illustrated in FIG. 9. In some embodiments, the first etch stop layer 1002 is deposited as a conformal layer. The first etch stop layer 1002 may be deposited by, for example, CVD, PVD, ALD, some other deposition process, or a combination of the foregoing. Thereafter, the ILD layer 1004 is deposited over and covering the first etch stop layer 1002 and the structure illustrated in FIG. 9. A planarization process (e.g., CMP) is then performed on the ILD layer 1004, the first etch stop layer 1002, the fourth hardmask structure 612 (see, FIG. 9), and the first sidewall spacers 702. The planarization process removes upper portions of the ILD layer 1004, the first etch stop layer 1002, the fourth hardmask structure 612, and the first sidewall spacers 702, thereby forming the structure illustrated in FIG. 10. Thus, the planarization process co-planarizes upper surfaces of the ILD layer 1004, the first etch stop layer 1002, and the first sidewall spacers 702.

As shown in FIG. 11, the dummy gate structures 602 are removed, thereby forming third trenches 1102 between inner sidewalls of the first sidewall spacers 702. For clarity in the figures, only some of the third trenches 1102 are specifically labeled in the figures. The third trenches 1102 expose portions of the first hardmask structure 202 and portions of the first plurality of dielectric structures 704 that are disposed between the inner sidewalls of the first sidewall spacers 702. In some embodiments, a process for removing the dummy gate structures 602 comprises performing a twelfth etching process (e.g., wet etching process, dry etching process, or the like) that selectively removes the dummy gate dielectric structures 604 and the dummy gate material structures 606. It will be appreciated that multiple etching processes may be utilized to remove the dummy gate structures 602 (e.g., the twelfth etching process removes the dummy gate material structures 606 and a subsequent etching process removes the dummy gate dielectric structures 604).

Also shown in FIG. 11, a first masking structure 1104 is formed in the third trenches 1102. The first masking structure 1104 may be formed with upper surfaces that are disposed over the upper surfaces of the ILD layer 1004. The first masking structure 1104 comprises, for example, a positive photoresist material, a negative photoresist material, or the like. A fifth hardmask structure 1106 is formed over the first masking structure 1104. The fifth hardmask structure 1106 is or comprises, for example, an oxide (e.g., $SiO_2$), a nitride (e.g., SiN), an oxy-nitride (e.g., SiON), some other hardmask material, or a combination of the foregoing.

In some embodiments, a process for forming the first masking structure 1104 and the fifth hardmask structure 1106 comprises depositing a photoresist layer (e.g., a positive/negative photoresist material) by, for example, CVD, spin-on coating, or the like. The photoresist layer is deposited in the third trenches 1102 (e.g., filling the third trenches 1102) and over the upper surfaces of the ILD layer 1004, the first etch stop layer 1002, and the first sidewall spacers 702. Thereafter, a hardmask layer (not shown) is deposited on and covering the photoresist layer by, for example, CVD, PVD, ALD, or the like. Thereafter, a third patterned masking layer is formed over the hardmask layer. With the third patterned masking layer in place, a thirteenth etching process (e.g., wet etching process, dry etching process, RIE process, or the like) is performed on the hardmask layer to remove unmasked portions of the hardmask layer, thereby leaving masked portions of the hardmask layer in place as the fifth hardmask structure 1106. Subsequently, the third patterned masking layer may be stripped away.

A fourteenth etching process (e.g., wet etching process, dry etching process, RIE process, or the like) is then performed on the photoresist layer to form the first masking structure 1104. During the fourteenth etching process, the fifth hardmask structure 1106 is utilized as an etching mask. Thus, the fourteenth etching process removes unmasked portions of the photoresist layer, thereby leaving remaining portions of the photoresist layer in place as the first masking structure 1104. In some embodiments, the first masking structure 1104 may be referred to as a cut metal gate (CMG) mask.

FIGS. 12-19 illustrate a series of cross-sectional views at various stages of the method for forming the semiconductor device 1904 with reduced spacing between NSFETs 1810. The cross-sectional views of FIGS. 12-19 are taken along line A-A of FIG. 11 and continue after the stage illustrated in FIG. 11. For example, FIG. 12 illustrates a first stage after the stage illustrated in FIG. 11 and taken along line A-A of FIG. 11, FIG. 13 illustrates a second stage after the first stage illustrated in FIG. 12 and taken along line A-A of FIG. 11, FIG. 14 illustrates a third stage after the second stage illustrated in FIG. 13 and taken along line A-A of FIG. 13, and so forth. Because the cross-sectional views of FIGS. 12-19 are taken along line A-A of FIG. 11, the various stages illustrated in FIGS. 12-19 of the method for forming the semiconductor device 1904 with reduced spacing between NSFETs 1810 only illustrate the processing (e.g., removal, formation, recessing, etc.) of features (e.g., structural features) that may be seen along line A-A of FIG. 11. However, it will be appreciated that, in some embodiments, similar features (e.g., structural features that are similar to the structural features being processed in FIGS. 12-19) are also being processed at the various stages illustrated in FIGS. 12-19 (e.g., the similar features are being processed in a similar manner as the features being processed in FIGS. 12-19, but are not illustrated in the figures due to the figures being taken along line A-A of FIG. 11).

As shown in FIG. 12, the first plurality of dielectric structures 704 that are exposed by the third trenches 1102 (see, FIG. 11) and not masked by the first masking structure 1104 are removed. For example, the first dielectric structure 704a, the third dielectric structure 704c, and the fifth dielectric structure 704e (see, FIG. 9) are exposed by the third trenches 1102 and not masked by the first masking structure 1104, and are therefore removed. While FIG. 12 illustrates the first dielectric structure 704a, the third dielectric structure 704c, and the fifth dielectric structure 704e being removed, it will be appreciated that any combination of the dielectric structures of the first plurality of dielectric structures 704 may be removed (e.g., by forming the first masking structure 1104 with a predefined pattern). In some embodiments, the dielectric structures of the first plurality of dielectric structures 704 that are exposed by the third trenches 1102 and not masked by the first masking structure 1104 are removed (e.g., completely). In other embodiments, only portions of the dielectric structures of the first plurality of dielectric structures 704 that are exposed by the third trenches 1102 and not masked by the first masking structure 1104 are removed (e.g., leaving remaining portions of such dielectric structures of the first plurality of dielectric structures 704 directly below the first sidewall spacers 702).

Also shown in FIG. 12, portions of the capping structures 404 that are exposed by the third trenches 1102 and not masked by the first masking structure 1104 are removed, thereby angling inner sidewalls of the capping structures 404. For example, the capping structures 404 disposed along the sidewalls of the first dielectric fin 502a, the third dielectric fin 502c, and the fifth dielectric fin 502e are exposed by the third trenches 1102 and not masked by the first masking structure 1104. Thus, portions of the capping structures 404 disposed along the sidewalls of the first dielectric fin 502a, the third dielectric fin 502c, and the fifth dielectric fin 502e are removed, thereby angling the inner sidewalls of the capping structures 404 disposed along the sidewalls of the first dielectric fin 502a, the third dielectric fin 502c, and the fifth dielectric fin 502e. The angled inner sidewalls of the capping structures 404 may angle from corresponding dielectric fins 502 to corresponding stacks of the second stacks of semiconductor structures 705. For example, a first angled inner sidewall of one of the capping structures 404 disposed along a first sidewall of the third dielectric fin 502c may angle from the third dielectric fin 502c to the second stack of semiconductor structures 705 that is disposed between the third dielectric fin 502c and the second dielectric fin 502b, and a second angled inner sidewall of another one of the capping structures 404 disposed along a second sidewall of the third dielectric fin 502c may angle from the third dielectric fin 502c (in an opposite direction as the first angled sidewall) to the second stack of semiconductor structures 705 disposed between the third dielectric fin 502c and the fourth dielectric fin 502d.

In some embodiments, a process for removing the first plurality of dielectric structures 704 that are exposed by the third trenches 1102 and not masked by the first masking structure 1104 comprises performing a fifteenth etching process on the structure illustrated in FIG. 11 to selectively remove the first plurality of dielectric structures 704 that are exposed by the third trenches 1102 and not masked by the first masking structure 1104. During the fifteenth etching process, the first masking structure 1104 acts as an etching mask that prevents the fifteenth etching process from etching away the first plurality of dielectric structures 704 (and portions of the capping structures 404) that are masked by the first masking structure 1104. Thus, the fifteenth etching process selectively removes the first plurality of dielectric structures 704 that are exposed by the third trenches 1102 and not masked by the first masking structure 1104. Further, the fifteenth etching process removes the portions of the capping structures 404 that are exposed by the third trenches 1102 and not masked by the first masking structure 1104, thereby angling the inner sidewalls of the capping structures 404. In some embodiments, the fifteenth etching process may be, for example, a dry etching process, a wet etching process, some other etching process, or a combination of the foregoing. Also shown in FIG. 12, the fifth hardmask structure 1106 is removed by, for example, the fifteenth etching process.

The first plurality of dielectric structures 704 that remain after the fifteenth etching process may collectively be referred to as remaining dielectric structures 704b/704d hereinafter. For example, as shown in FIG. 12, the remaining dielectric structures 704b/704d comprise the second dielectric structure 704b and the fourth dielectric structure 704d (e.g., because the second dielectric structure 704b and the fourth dielectric structure 704d remaining after the fifteenth etching process). It will be appreciated that other dielectric structures of the first plurality of dielectric structures 704 may remain after the fifteenth etching process (e.g., dielectric structures of the first plurality of dielectric structures 704 that are spaced (along the x-axis) from both the second dielectric structure 704b and the fourth dielectric structure 704d but are not illustrated in the figures due to the cross-sectional views of the figures being taken along line A-A of FIG. 11). It will also be appreciated that the use of "704b/704d" as a reference character for the remaining dielectric structures 704b/704d is for clarity and does not, in any way, limit the remaining dielectric structures 704b/704d to comprising only the second dielectric structure 704b and the fourth dielectric structure 704d. Rather, the remaining dielectric structures 704b/704d may comprise one or more (and/or any combination) of the first plurality of dielectric structures 704 that remain after the fifteenth etching process.

In some embodiments, the remaining dielectric structures 704b/704d are referred to as a second plurality of dielectric fin helmets because they cover (and protect in subsequent processing steps) portions of the upper surfaces of corresponding ones of the dielectric fins 502. For example, the second dielectric structure 704b covers (and protects in subsequent processing steps) a portion of the upper surface of the second dielectric fin 502b, and the fourth dielectric structure 704d covers (and protects in subsequent processing steps) a portion of the upper surface of the fourth dielectric fin 502d. Thus, the second dielectric structure 704b may be referred to as a first dielectric fin helmet of the second plurality of dielectric fin helmets, and the second dielectric structure 704b may be referred to as a second dielectric fin helmet of the second plurality of dielectric fin helmets.

As shown in FIG. 13, the first masking structure 1104 is removed. In some embodiments, a process for removing the first masking structure 1104 comprises performing a mask removal process on the structure illustrates in FIG. 12. The mask removal process may be, for example, an etching process (e.g., wet etching process, dry etching process, or the like), an ashing processes, a combination of the foregoing, or the like.

Also shown in FIG. 13, the first hardmask structure 202 is removed. The first hardmask structure 202 is removed after the first masking structure 1104 is removed. In some embodiments, the first hardmask structure 202 is removed by a sixteenth etching process (e.g., wet etching process, dry etching process, or the like) that selectively removes the first hardmask structure 202. Rather than removing the first hardmask structure 202, in some embodiments, the first hardmask structure 202 is recessed (e.g., by the sixteenth etching process), thereby leaving portions of the first hardmask structure 202 over the second stacks of semiconductor structures 705 (e.g., to protect the fourth semiconductor structures 708 during a subsequent release process).

By removing (or recessing) the first hardmask structure 202, the third trenches 1102 (see, FIG. 11) are extended (along the y-axis). In some embodiments, the portions of the third trenches 1102 that are extended (along the y-axis) by the removal (or recessing) of the first hardmask structure 202 at least partially undercut (along the x-axis) the first sidewall spacers 702. In further embodiments, opposite sides (spaced along the x-axis) of the portions of the third trenches 1102 that are extended (along the y-axis) by the removal (or recessing) of the first hardmask structure 202 are at least partially defined by sidewalls of the first etch stop layer 1002. In yet further embodiments, the opposite sides (spaced along the x-axis) of the portions of the third trenches 1102 that are extended (along the y-axis) by the removal (or recessing) of the first hardmask structure 202 are at least partially defined by sidewalls of the first hardmask structure 202 (e.g., residual portions of the first hardmask structure 202 that remain after the sixteenth etching process).

Also shown in FIG. 13, a plurality of nanostructure stacks 1302 are formed over the fins 210, respectively. For example, a first nanostructure stack 1302a is formed over (e.g., directly over) the first fin 210a, a second nanostructure stack 1302b is formed over (e.g., directly over) the second fin 210b, a third nanostructure stack 1302c is formed over (e.g., directly over) the third fin 210c, a fourth nanostructure stack 1302d is formed over (e.g., directly over) the fourth fin 210d, a fifth nanostructure stack 1302e is formed over (e.g., directly over) the fifth fin 210e, and a sixth nanostructure stack 1302f is formed over (e.g., directly over) the sixth fin 210f. In some embodiments, the nanostructure stacks 1302 are formed after the first hardmask structure 202 is removed.

The nanostructure stacks 1302 are laterally spaced (along the z-axis). The nanostructure stacks 1302 are laterally separated (along the z-axis) by the dielectric fins 502. In other words, the nanostructure stacks 1302 are disposed on opposite sides of the dielectric fins 502. For example, the first nanostructure stack 1302a is disposed on a first side of the first dielectric fin 502a, and the second nanostructure stack 1302b is disposed on a second side of the first dielectric fin 502a opposite the first side of the first dielectric fin 502a.

Each of the nanostructure stacks 1302 comprise a plurality of nanostructures 1304 that are vertically stacked (along the y-axis) over one another (e.g., directly over one another). The nanostructures 1304 extend laterally (along the x-axis) over the fins 210 and in parallel with one another. The nanostructures 1304 of each of the nanostructure stacks 1302 extend (along the x-axis) between a corresponding pair of source/drain regions. For example, the nanostructures 1304 of the first nanostructure stack 1302*a* extend (along the x-axis) between the first pair 902*a* of the first source/drain regions 902 (see, FIG. 11), the nanostructures 1304 of the second nanostructure stack 1302*b* extend (along the x-axis) between the second pair 902*b* of the first source/drain regions 902 (see, FIG. 11), the nanostructures 1304 of the third nanostructure stack 1302*c* extend (along the x-axis) between the third pair 904*a* of the second source/drain regions 904 (see, FIG. 11), the nanostructures 1304 of the fourth nanostructure stack 1302*d* extend (along the x-axis) between the fourth pair 904*b* of the second source/drain regions 904 (see, FIG. 11), the nanostructures 1304 of the fifth nanostructure stack 1302*e* extend (along the x-axis) between the fifth pair 902*c* of the first source/drain regions 902 (see, FIG. 11), and the nanostructures 1304 of the sixth nanostructure stack 1302*f* extend (along the x-axis) between the sixth pair 902*d* of the first source/drain regions 902 (see, FIG. 11).

In some embodiments, the nanostructure stacks 1302 are spaced (along the y-axis) from the fins 210, respectively. In some embodiments, the nanostructures 1304 of the nanostructure stacks 1302 are vertically spaced (along the y-axis). For example, the first nanostructure stack 1302*a* is spaced (along the y-axis) from an upper surface of the first fin 210*a*, and the nanostructures 1304 of the first nanostructure stack 1302*a* are vertically spaced (along the y-axis) from one another.

In some embodiments, the nanostructures 1304 may have rectangular-like shaped profiles, as shown in FIG. 13. In other embodiments, the nanostructures 1304 may have square-like shaped profiles, ellipse-like shaped profiles, stadium-like (e.g., obround), hexagonal-like shaped profiles (e.g. vertically spaced hexagonal-like shaped profiles or merged hexagonal-like shaped profiles), some other geometrical-shaped profile, or a combination of the foregoing. If the nanostructures 1304 have the square-like shaped profiles, the nanostructures 1304 may be referred to as square nanowires. If the nanostructures 1304 have the ellipse-like shaped profiles, the nanostructures 1304 may be referred to as nano-rings. If the nanostructures 1304 have the hexagonal-like shaped profiles or the stadium-like shaped profiles, the nanostructures 1304 may be referred to as horizontal nanosheets or horizontal nanoslabs. If the nano structures 1304 have the hexagonal-like shaped profiles, the nanostructures 1304 may be referred to as hexagonal nanowires.

In some embodiments, a process for forming the nanostructure stacks 1302 comprises removing the third semiconductor structures 706 and the capping structures 404 that are exposed by the third trenches 1102 (e.g., the extended third trenches 1102). By removing the third semiconductor structures 706 and the capping structures 404, the fourth semiconductor structures 708 are released, thereby forming the nanostructures 1304. In other words, after the third semiconductor structures 706 and the capping structures 404 are removed, portions of the fourth semiconductor structures 708 are left in place as the nanostructures 1304, respectively.

The third semiconductor structures 706 and the capping structures 404 may be removed by a seventeenth etching process (e.g., wet etching process, dry etching process, etc.). Because the third semiconductor structures 706 and the capping structures 404 comprise a same semiconductor material (e.g., the first semiconductor material (e.g., SiGe)), the seventeenth etching process selectively removes the third semiconductor structures 706 and the capping structures 404, thereby forming the nanostructures 1304. In some embodiments, the seventeenth etching process may selectively remove the third semiconductor structures 706 and the capping structures 404 by using a wet etchant, such as, ammonium hydroxide ($NH_4OH$), tetramethylammonium hydroxide (TMAH) solution, ethylenediamine pyrocatechol (EDP), potassium hydroxide (KOH) solution, or the like. In further embodiments, the seventeenth etching process may slightly etch the semiconductor material (e.g., the second semiconductor material (e.g., Si)) of the fourth semiconductor structures 708, thereby forming the nanostructures 1304 with cross-sectional areas that are slightly smaller than cross-sectional areas of the fourth semiconductor structures 708. It will be appreciated that some portions of the nanostructures 1304 (e.g., portions directly under the first sidewall spacers 702 (see, FIG. 11)) may not be released by the seventeenth etching process. Rather, those portions of the nanostructures 1304 are surrounded by the second sidewall spacers 802 (see, FIG. 11).

As shown in FIG. 14, an interfacial layer 1402 is formed around each of the nanostructures 1304. The interfacial layer 1402 may be, for example, an oxide (e.g., $SiO_2$), a nitride (e.g., SiN), an oxy-nitride (e.g., SiON), some other dielectric material, or a combination of the foregoing. In some embodiments, a process for forming the interfacial layer 1402 comprises depositing or growing the interfacial layer 1402 on surfaces (e.g., outer sidewalls) of the nanostructures 1304 by, for example, CVD, PVD, ALD, thermal oxidation, some other deposition or growth process, or a combination of the foregoing. In further embodiments, the interfacial layer 1402 is an oxide and is grown by a thermal oxidation process, and as a result, the interfacial layer 1402 is not formed on the dielectric fins 502 or the remaining dielectric structures 704*b*/704*d*. Although not shown in FIG. 14, it will be appreciated that, in some embodiments, the interfacial layer 1402 may also be formed on upper surfaces of the fins 210 and upper surfaces of the liner layer 302 (e.g., the thermal oxidation process may grow the interfacial layer 1402 on the upper surfaces of the fins 210 and the upper surfaces of the liner layer 302).

Also shown in FIG. 14, a gate dielectric layer 1404 is formed around each of the nanostructures 1304. The gate dielectric layer 1404 is also formed around the interfacial layer 1402, over the fins 210, over the liner layer 302, over the dielectric fins 502, over the remaining dielectric structures 704*b*/704*d*, and over the isolation structures 402. The gate dielectric layer 1404 is or comprises a high-k dielectric, such as, HfO, ZrO, HfAlO, HfSiO, some other dielectric material with a dielectric constant greater than 3.9, or a combination of the foregoing.

The gate dielectric layer 1404 is formed after the interfacial layer 1402. In some embodiments, a process for forming the gate dielectric layer 1404 comprises depositing the gate dielectric layer 1404 on surfaces of the interfacial layer 1402, the fins 210, the liner layer 302, the dielectric fins 502, the remaining dielectric structures 704*b*/704*d*, and the isolation structures 402, as illustrated in FIG. 14. The gate dielectric layer 1404 may be deposited by, for example, ALD, CVD, PVD, some other deposition process, or a combination of the foregoing. In further embodiments, the gate dielectric layer 1404 may be formed as a conformal layer.

Also shown in FIG. 14, a gate electrode layer 1406 is formed over the gate dielectric layer 1404, the fins 210, the liner layer 302, the dielectric fins 502, the remaining dielectric structures 704b/704d, the isolation structures 402, and the nanostructure stacks 1302. In some embodiments, the gate electrode layer 1406 is also formed around and between each of the nanostructures 1304, as illustrated in FIG. 14.

In some embodiments, a process for forming the gate electrode layer 1406 comprises depositing a gate electrode material in the third trenches 1102 (e.g., the extended third trenches 1102), over the gate dielectric layer 1404, over the fins 210, over the liner layer 302, over the dielectric fins 502, over the remaining dielectric structures 704b/704d, over the isolation structures 402, over the nanostructure stacks 1302, and around and between each of the nanostructures 1304. The gate electrode material is also deposited over the ILD layer 1004, the first sidewall spacers 702, and the first etch stop layer 1002 (see, FIG. 11). The gate electrode material is or comprises, for example, polysilicon (e.g., doped polysilicon), a metal (e.g., aluminum (Al), tungsten (W), etc.), titanium nitride (TiN), tantalum nitride (TaN)), titanium-aluminum-carbon (TiAlC), titanium-aluminum-silicon (TiAlSi), some other conductive material, or a combination of the foregoing. The gate electrode material may comprise multiple layers of gate electrode materials, for example, a work function layer (e.g., TiN, TaN, or the like), a metal fill layer (e.g., W), etc.

The gate electrode material may be deposited by, for example, CVD, PVD, ALD, electrochemical plating, electroless plating, some other deposition process, or a combination of the foregoing. After the gate electrode material is deposited, a planarization process (e.g., CMP) is performed on the gate electrode material to remove upper portions of the gate electrode material, thereby leaving lower portions of the gate electrode material in place as the gate electrode layer 1406. The gate electrode layer 1406 is or comprises, for example, polysilicon (e.g., doped polysilicon), a metal (e.g., Al, W, etc.), TiN, TaN, TiAlC, TiAlSi, some other conductive material, or a combination of the foregoing. The gate electrode layer 1406 may comprise multiple layers, for example, a work function layer (e.g., TiN, TaN, or the like), a metal fill layer (e.g., W), etc. The planarization process may also remove upper portions of the ILD layer 1004, the first etch stop layer 1002, and the first sidewall spacers 702, thereby co-planarizing upper surfaces of the gate electrode layer 1406, the ILD layer 1004, the first etch stop layer 1002, and the first sidewall spacers 702.

Figure 15:
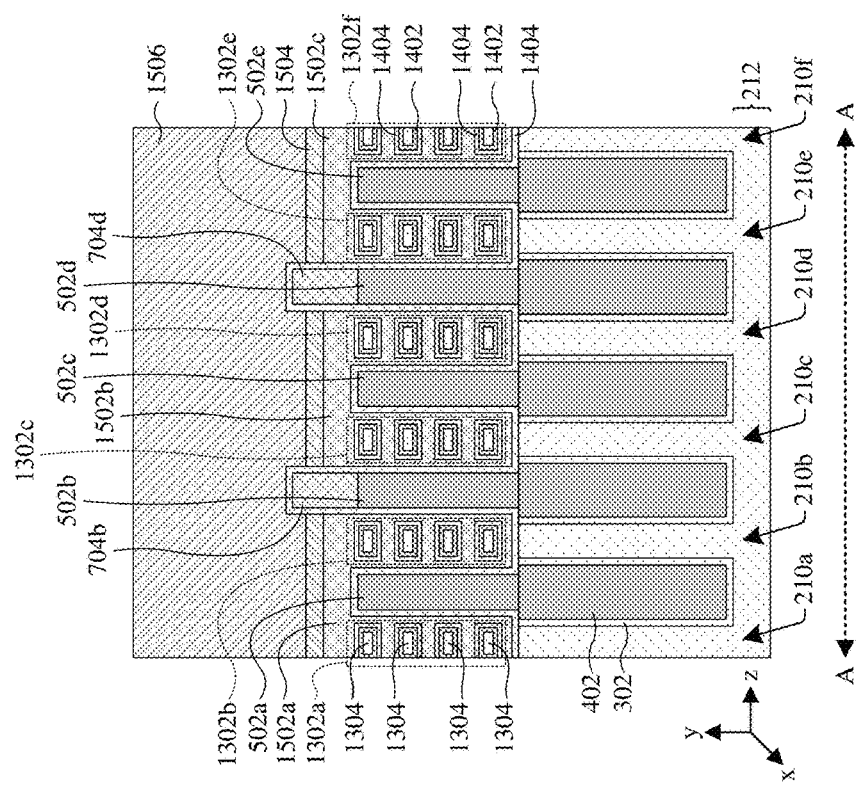

As shown in FIG. 15, a plurality of gate electrode structures 1502 are formed over the fins 210, the liner layer 302, the dielectric fins 502, the isolation structures 402, and the nanostructure stacks 1302. The gate electrode structures 1502 are laterally separated (along the z-axis) by corresponding dielectric fins 502 and corresponding remaining dielectric structures 704b/704d. The gate electrode structures 1502 are formed with upper surfaces disposed below upper surfaces of the remaining dielectric structures 704b/704d. In some embodiments, the upper surfaces of the gate electrode structures 1502 are formed below lower surfaces of the first sidewall spacers 702 (see, FIG. 11). The gate electrode structures 1502 are formed between the source/drain regions of one or more corresponding pairs of source/drain regions. In some embodiments, the gate electrode structures 1502 are formed around each of the nanostructures 1304 of one or more corresponding nanostructure stacks 1302.

For example, a first gate electrode structure 1502a, a second gate electrode structure 1502b, and a third gate electrode structure 1502c are formed. The second dielectric structure 704b and the second dielectric fin 502b both laterally separate (along the z-axis) the first gate electrode structure 1502a from the second gate electrode structure 1502b, and both the fourth dielectric structure 704d and the fourth dielectric fin 502d both laterally separate (along the z-axis) the second gate electrode structure 1502b from the third gate electrode structure 1502c. The first gate electrode structure 1502a, the second gate electrode structure 1502b, and the third gate electrode structure 1502c are formed with upper surfaces that are disposed below the upper surface of the second dielectric structure 704b and the upper surface of the fourth dielectric structure 704d.

The first gate electrode structure 1502a is formed between the first source/drain regions 902 of the first pair 902a and between the first source/drain regions 902 of the second pair 902b (see, FIG. 11). The second gate electrode structure 1502b is formed between the second source/drain regions 904 of the third pair 904a and between the second source/drain regions 904 of the fourth pair 904b (see, FIG. 11). The third gate electrode structure 1502c is formed between the first source/drain regions 902 of the fifth pair 902c and between the first source/drain regions 902 of the sixth pair 902d (see, FIG. 11). In some embodiments, the first gate electrode structure 1502a is formed such that the upper surface of the first gate electrode structure 1502a is disposed below the lower surfaces of the one of the first sidewall spacers 702 that extends (along the z-axis) between the first source/drain regions 902 of the first pair 902a and the second pair 902b. In further embodiments, the second gate electrode structure 1502b and the third gate electrode structure 1502c may also be formed such that the upper surfaces of the second gate electrode structure 1502b and/or the third gate electrode structure 1502c are disposed below the lower surfaces of the one of the first sidewall spacers 702.

The first gate electrode structure 1502a is formed around each of the nanostructures 1304 of the first nanostructure stack 1302a and around each of the nanostructures 1304 of the second nanostructure stack 1302b. The second gate electrode structure 1502b is formed around each of the nanostructures 1304 of the third nanostructure stack 1302c and around each of the nanostructures 1304 of the fourth nanostructure stack 1302d. The third gate electrode structure 1502c is formed around each of the nanostructures 1304 of the fifth nanostructure stack 1302e and around each of the nanostructures 1304 of the sixth nanostructure stack 1302f.

It will be appreciated that the first gate electrode structure 1502a, the second gate electrode structure 1502b, and the third gate electrode structure 1502c may be formed around each of the nanostructures 1304 of any number of nanostructure stacks 1302, which is determined by the intended functionality of the semiconductor device 1904. For example, the first gate electrode structure 1502a may be formed around each of the nanostructures 1304 of one of the nanostructure stacks 1302, around each of the nanostructures 1304 of two of the nanostructure stacks 1302 (e.g., as shown in FIG. 15), around each of the nanostructures 1304 of three of the nanostructure stacks 1302, or around each of the nanostructures 1304 of any other number of the nanostructure stacks 1302. It will be appreciated that the first gate electrode structure 1502a, the second gate electrode structure 1502b, and the third gate electrode structure 1502c may be formed around each of the nanostructures 1304 of a same number of the nanostructure stacks 1302 (e.g., two of the nanostructure stacks, as shown in FIG. 15), or the first gate electrode structure 1502a, the second gate electrode structure 1502b, and/or the third gate electrode structure 1502c may be formed around each of the nanostructures 1304 of a different number of the nanostructure stacks 1302. It will further be appreciated that the number of nanostructure stacks 1302 in which the gate electrode structures 1502 are formed around is determined by the pattern of the first masking structure 1104 (see, FIG. 12).

In some embodiments, a process for forming the gate electrode structures 1502 comprises recessing the gate electrode layer 1406 (see, FIG. 14) below the upper surfaces of the remaining dielectric structures 704*b*/704*d*. The gate electrode layer 1406 may be recessed by, for example, an etching process (e.g., wet etching process, dry etching process, etc.) that is selective to the gate electrode layer 1406 (e.g., removes the material(s) of the gate electrode layer 1406 without substantially attacking the gate dielectric layer 1404). After the gate electrode layer 1406 is recessed, discrete lower portions of the gate electrode layer 1406 are left in place as the gate electrode structures 1502, respectively. For example, after the gate electrode layer 1406 is recessed, the second dielectric structure 704*b* and the fourth dielectric structure 704*d* separate three lower portions of the gate electrode layer 1406, and therefore the first gate electrode structure 1502*a*, the second gate electrode structure 1502*b*, and the third gate electrode structure 1502*c* are formed in a self-aligned manner.

Because the gate electrode structures 1502 are formed in this self-aligned manner, the method disclosed herein provides advantages over a reference CMG process (e.g., where the reference CMG process includes, at this stage of processing, cutting the gate electrode layer 1406 into the gate electrode structures 1502 by forming openings in the gate electrode layer 1406 and filling those openings with a dielectric material). As feature sizes continue to scale down (e.g., 3 nm and beyond), the reference CMG process may have difficulty filling the openings, for example, due to the high aspect ratios of the openings. Inadequately filled openings may lead to electrical shorts between the gate electrode structures 1502 and may cause device failure. The method disclosed herein provides an improved method that forms the gate electrode structures 1502 in a self-aligned manner, thus preventing device failure and improving production yield.

Also shown in FIG. 15, a second etch stop layer 1504 is formed over (e.g., directly over) the gate electrode structures 1502. The second etch stop layer 1504 is formed after the gate electrode structures 1502. The second etch stop layer 1504 may be formed with upper surfaces disposed below the upper surfaces of the remaining dielectric structures 704*b*/704*d*. In some embodiments, the upper surfaces of the second etch stop layer 1504 are formed below lower surfaces of the first sidewall spacers 702 (see, FIG. 11). In further embodiments, the second etch stop layer 1504 may be a fluorine-free tungsten (FFW) layer. The second etch stop layer 1504 may act as an etch stop layer in a subsequent etching process and/or may help reduce the electrical resistance between the gate electrode structures 1502 and subsequently formed conductive contacts (e.g., metal contacts electrically coupled to the gate electrode structures 1502).

In some embodiments, a process for forming the second etch stop layer 1504 comprises depositing the second etch stop layer 1504 on the gate electrode structures 1502 by, for example, CVD, PVD, ALD, electrochemical plating, electroless plating, some other deposition process, or a combination of the foregoing. The second etch sop layer 1504 may be selectively deposited (e.g., via a selective CVD process) on the gate electrode structures 1502. The second etch stop layer 1504 is deposited after the gate electrode structures 1502. Further, the second etch stop layer 1504 is deposited in the trenches (not specifically labeled) that were created by forming the gate electrode structures 1502 (e.g., by recessing the gate electrode layer 1406). The trenches that were formed by forming the gate electrode structures 1502 extend vertically between the inner sidewalls of the first sidewall spacers 702 to the upper surfaces of the gate electrode structures 1502 and to the surfaces (e.g., upper surfaces and sidewalls) of the gate dielectric layer 1404 that are disposed above the upper surfaces of the gate electrode structures 1502.

Also shown in FIG. 15, a fourth dielectric layer 1506 is formed over (e.g., directly over) the remaining dielectric structures 704*b*/704*d*, the gate dielectric layer 1404, the gate electrode structures 1502, the dielectric fins 502, and the second etch stop layer 1504. The fourth dielectric layer 1506 is formed after the second etch stop layer 1504. The fourth dielectric layer 1506 is formed extending vertically (along the y-axis) between the inner sidewalls of the first sidewall spacers 702 to the upper surfaces of the second etch stop layer 1504 and the surfaces of the gate dielectric layer 1404 that are disposed above the upper surfaces of the second etch stop layer 1504. In other words, the fourth dielectric layer 1506 is formed in the remaining portions of the trenches that were formed by forming the gate electrode structures 1502 (e.g., portions of the trenches not filled by the second etch stop layer 1504). The fourth dielectric layer 1506 is formed such that the upper surface of the second dielectric structure 704*b* and the upper surface of the fourth dielectric structure 704*d* are disposed between an uppermost surface of the fourth dielectric layer 1506 and a lowermost surface of the fourth dielectric layer 1506, as shown in FIG. 15. In some embodiments, the uppermost surface of the fourth dielectric layer 1506 is substantially planar.

In some embodiments, a process for forming the fourth dielectric layer 1506 comprises depositing a third dielectric material over the remaining dielectric structures 704*b*/704*d*, the gate dielectric layer 1404, the gate electrode structures 1502, the dielectric fins 502, the second etch stop layer 1504, the first sidewall spacers 702, the first etch stop layer 1002, and the ILD layer 1004. In other words, the third dielectric material is deposited over the upper surfaces of the first sidewall spacers 702, the upper surfaces of the first etch stop layer 1002, and the upper surfaces of the ILD layer 1004 (see, FIG. 11), and filling the remaining portions of the trenches that were formed by forming the gate electrode structures 1502 (e.g., the portions of the trenches not filled by the second etch stop layer 1504). The third dielectric material is or comprises, for example, a nitride (e.g., SiN), a silicon-carbon-nitride (e.g., SiCN), a silicon-carbon-oxy-nitride (e.g., SiCON), an oxy-nitride (e.g., SiON), a metal oxide (e.g., AlO, HfO, ZrO, YO), an oxide (e.g., $SiO_2$), some other dielectric material, or a combination of the foregoing. The third dielectric material has a different chemical composition than the ILD layer 1004, such that the ILD layer 1004 may be selectively etched during a subsequent processing step (e.g., during formation of the source/drain contacts).

The third dielectric material may be deposited by, for example, CVD, PVD, ALD, some other deposition process, or a combination of the foregoing. After the third dielectric material is deposited, a planarization process (e.g., CMP) is performed on third dielectric material to remove upper portions of the third dielectric material, thereby leaving lower portions of the third dielectric material in place as the fourth dielectric layer 1506. The planarization process may also remove upper portions of the ILD layer 1004, the first etch stop layer 1002, and the first sidewall spacers 702, thereby co-planarizing upper surfaces of the fourth dielectric layer 1506, the ILD layer 1004, the first etch stop layer 1002, and the first sidewall spacers 702.

Figure 16:
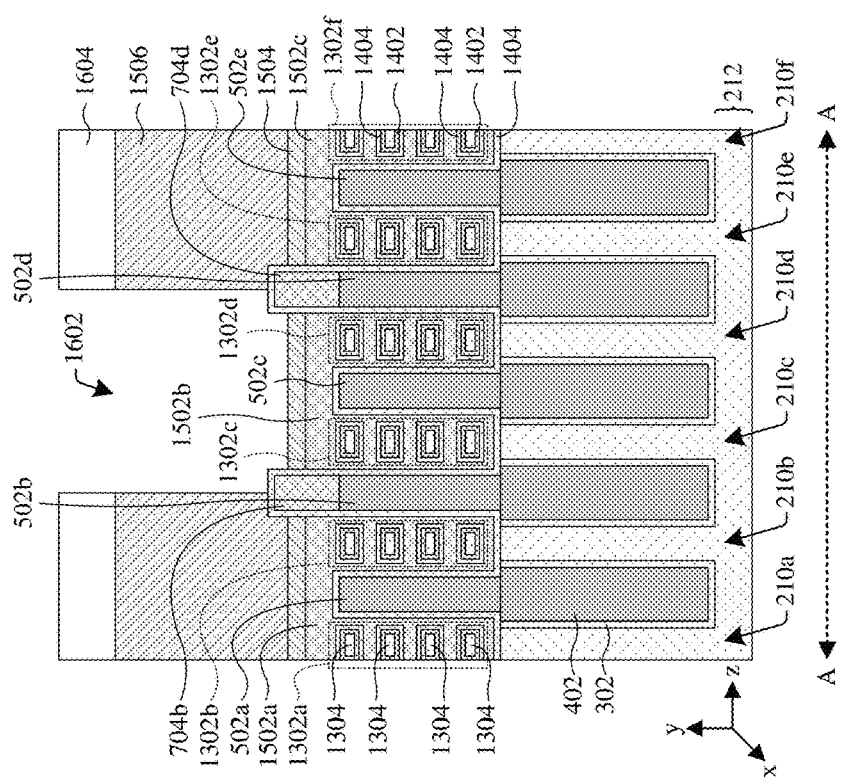

As shown in FIG. 16, a first opening 1602 is formed in the fourth dielectric layer 1506. The first opening 1602 is formed extending vertically (along the y-axis) between the inner sidewalls of the one of the first sidewall spacers 702 toward the second etch stop layer 1504. The first opening 1602 at least partially overlies the second gate electrode structure 1502b. The first opening 1602 partially overlies the second dielectric structure 704b and/or the fourth dielectric structure 704d.

In some embodiments, the first opening 1602 overlies the second gate electrode structure 1502b, partially overlies the second dielectric structure 704b, and partially overlies the fourth dielectric structure 704d. In other words, the second gate electrode structure 1502b is disposed between sidewalls of the first opening 1602, the second dielectric structure at 704b is partially disposed between the sidewalls of the first opening 1602, and the fourth dielectric structure 704d is partially disposed between the sidewalls of the first opening 1602. The first opening 1602 also overlies the third nanostructure stack 1302c, the fourth nanostructure stack 1302d, the third dielectric fin 502c, the third fin 210c, and the fourth fin 210d. In some embodiments, surfaces (e.g., sidewalls and lower surfaces) of the first opening 1602 are at least partially defined by inner sidewalls of the fourth dielectric layer 1506, the inner sidewalls of the one of the first sidewall spacers 702, an upper surface of the second etch stop layer 1504, and surfaces (e.g., sidewalls and upper surfaces) of the gate dielectric layer 1404.

In some embodiments, a process for forming the first opening 1602 comprises forming a second masking structure 1604 over the fourth dielectric layer 1506. The second masking structure 1604 is or comprises, for example, a positive/negative photoresist material, a hardmask material, a combination of the foregoing, or the like. In further embodiments, a process for forming the second masking structure 1604 comprise depositing a masking material (e.g., positive/negative photoresist) over the upper surface of the fourth dielectric layer 1506. Thereafter, the masking material is exposed to a pattern (e.g., via a lithography process, such as photolithography, extreme ultraviolet lithography, or the like) and developed, thereby forming the second masking structure 1604 over the fourth dielectric layer 1506.

Thereafter, an eighteenth etching process is performed on the fourth dielectric layer 1506 to remove portions of the fourth dielectric layer 1506 not masked by the second masking structure 1604, thereby forming the first opening 1602 in the fourth dielectric layer 1506. In some embodiments, the eighteenth etching process stops on the second etch stop layer 1504. In further embodiments, the eighteenth etching process stops on the second etch stop layer 1504 and the gate dielectric layer 1404. The eighteenth etching process may be a dry etching process, a wet etching process, RIE process, some other etching process, or a combination of the foregoing.

Because the second dielectric structure 704b is disposed over the second dielectric fin 502b and the fourth dielectric structure 704d is disposed over the fourth dielectric fin 504d, the etching window for forming the first opening 1602 is improved (e.g., increased) over a reference CMG process (e.g., where the reference CMG process includes, at this stage of processing, cutting the gate electrode layer 1406 into the gate electrode structures 1502 by forming openings in the gate electrode layer 1406 and filling those openings with a dielectric material). For example, the second dielectric structure 704b and the fourth dielectric structure 704d allow the first opening 1602 to be formed with a greater size (e.g., due to resolution limitations in lithography) and/or shifted laterally from a predefined location (e.g., due to poor overlay control), while still ensuring the first opening 1602 only overlies desired features (e.g., the second gate electrode structure 1502b). In comparison, if the openings of the reference CMG process (e.g., the openings formed in the gate electrode layer 1406 and filled with a dielectric material to form the gate electrode structures 1502) are too large and/or misaligned, the reference CMG process may unintentionally remove portions of the gate electrode layer 1406 (and/or unintentionally leave portions of the gate electrode layer 1406 in place), thereby causing device failure and reduced production yield. Thus, as feature sizes continue to scale down (e.g., 3 nm and beyond), the method disclosed herein may prevent device failure and improve production yield.

Figure 17:
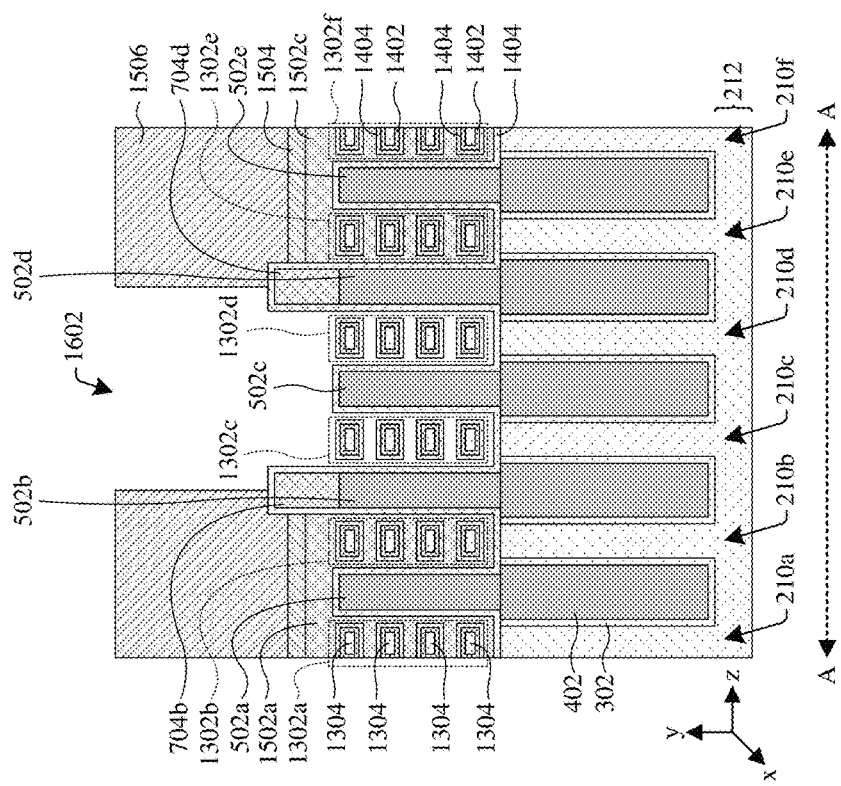

As shown in FIG. 17, the second masking structure 1604 is removed (e.g., stripped away). Also shown in FIG. 17, a portion of the second etch stop layer 1504 that is exposed by the first opening 1602 is removed, and the second gate electrode structure 1502b is removed. In some embodiments, the portion of the second etch stop layer 1504 that is exposed by the first opening 1602 and the second gate electrode structure 1502b are removed by a nineteenth etching process. In further embodiments, before the second gate electrode structure 1502b is removed, the gate electrode structures 1502 may be referred to as conductive gate structures, respectively (e.g., to distinguish between functional gate electrode structures that are present in the semiconductor device 1904 and conductive gate structures that are removed during the formation of the semiconductor device 1904). For example, before the second gate electrode structure 1502b is removed, the first gate electrode structure 1502a, the second gate electrode structure 1502b, and the third gate electrode structure 1502c may be referred to as a first conductive gate structure, a second conductive gate structure, and a third conductive gate structure, respectively.

The nineteenth etching process is an isotropic etch. The nineteenth etching process is selective to the second etch stop layer 1504 and the second gate electrode structure 1502b, thereby selectively removing the portion of the second etch stop layer 1504 that is exposed by the first opening 1602 and the second gate electrode structure 1502b (e.g., without removing portions of the gate dielectric layer 1404 or the remaining dielectric structures 704b/704d). The nineteenth etching process may be a dry etching process, a wet etching process, some other etching process, or a combination of the foregoing.

Because the second dielectric structure 704b laterally separates the first gate electrode structure 1502a from the second gate electrode structure 1502b, and because the fourth dielectric structure 704d laterally separates the second gate electrode structure 1502b from the third gate electrode structure 1502c, the second dielectric structure 704b and the fourth dielectric structure 704d act as "retaining walls" that allow the nineteenth etching process to selectively remove the second gate electrode structure 1502b. In other words, because of the locations of the second dielectric structure 702b and the fourth dielectric structure 702d, and because both the second dielectric structure 702b and the fourth dielectric structure 702d extend over the upper surfaces of the gate electrode structures 1502, the second dielectric structure 702b and the fourth dielectric structure 702d act as "retaining walls" that prevent the nineteenth etching process from unintentionally removing portions of the first gate electrode structure 1502a and the third gate electrode structure 1502c. Thus, as feature sizes continue to scale down (e.g., 3 nm and beyond), the method disclosed herein may further prevent device failure and improve production yield.

Figure 18:
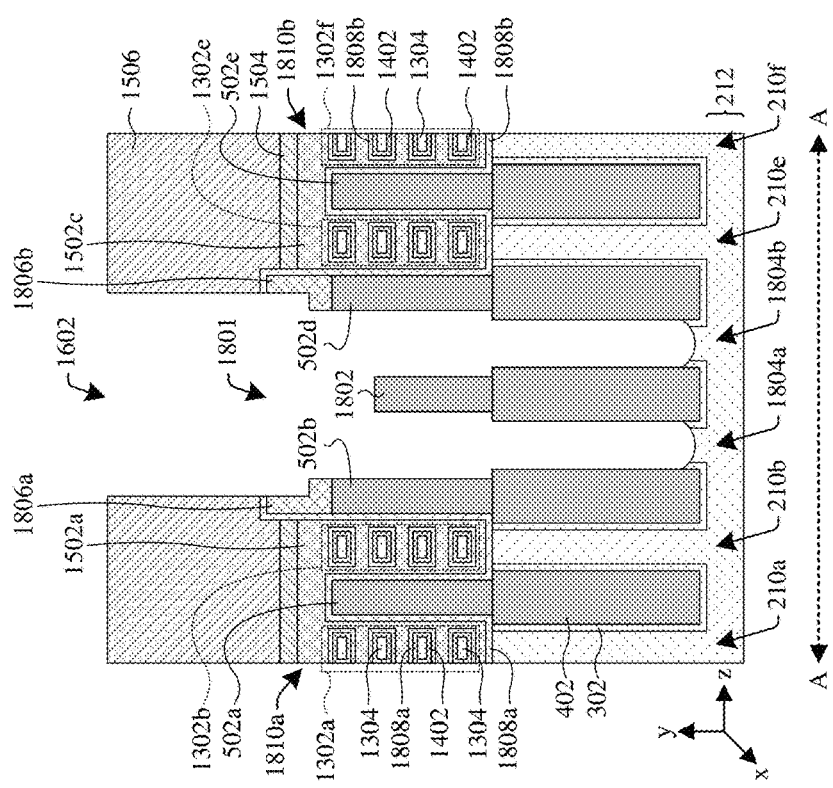

As shown in FIG. 18, a second opening 1801 is formed within the boundary of the first opening 1602 (e.g., within inner sidewalls of the first opening 1602) and extending (along the y-axis) from the first opening 1602 toward the substrate 212. The first opening 1602 and the second opening 1801 are a continuous region of free space (e.g., void of any material(s)). In some embodiments, a process for forming the second opening 1801 comprises performing a twentieth etching process on the structure illustrated in FIG. 17. The twentieth etching process may be, for example, a wet etching process, a dry etching process, a RIE process, some other etching process, or a combination of the foregoing.

The twentieth etching process removes (or recesses) features (e.g., structural features) that are exposed by (and/or underlying) the first opening 1602. In some embodiments, the twentieth etching process is a highly directional etch that etches the features exposed by (and/or underlying) the first opening 1602 vertically (e.g., downward) with little to no lateral (e.g., sideways) etching of the features exposed by (and/or underlying) the first opening 1602. In further embodiments, the twentieth etching process is selective to the features that are exposed by (and/or underlying) the first opening 1602. In other words, the twentieth etching process is more selective to the features exposed by (and/or underlying) the first opening 1602 than the fourth dielectric layer 1506. Thus, by performing the twentieth etching process on the structure illustrated in FIG. 17, the twentieth etching process may selectively remove (or recesses) the features that are exposed by (and/or underlying) the first opening 1602. The removal and recessing (e.g., by the twentieth etching process) of the features that are exposed by (and/or underlying) the first opening 1602 are discussed in more detail below.

The twentieth etching process removes (e.g., completely removes) the nanostructures 1304 of the third nanostructure stack 1302c, the nanostructures 1304 of the fourth nanostructure stack 1302d, and portions of the interfacial layer 1402 that are exposed (and/or underlying) the first opening 1602. Further, the twentieth etching process recesses the third dielectric fin 502c, thereby forming a recessed dielectric fin 1802. The recessed dielectric fin 1802 is formed with an upper surface disposed below the upper surfaces of the first dielectric fin 502a, the second dielectric fin 502b, the fourth dielectric fin 502d, and the fifth dielectric fin 502e. FIG. 18 illustrates the twentieth etching process removing two of the nanostructure stacks 1302 (e.g., the third nanostructure stack 1302c and the fourth nanostructure stack 1302d), but it will be appreciated that the twentieth etching process may remove any number of nanostructure stacks 1302. More specifically, the twentieth etching process may remove between about 1 nanostructure stack and about 1000 nanostructure stacks.

The twentieth etching process recesses the third fin 210c, thereby forming a recessed portion 1804a of the third fin 210c. The twentieth etching process recesses the fourth fin 210d, thereby forming a recessed portion 1804b of the fourth fin 210d. For clarity, the recessed portion 1804a of the third fin 210c may be referred to as a first recessed semiconductor fin 1804a hereinafter, and the recessed portion 1804b of the fourth fin 210d may be referred to as a second recessed semiconductor fin 1804b hereinafter (e.g., to more clearly distinguish between the recessed portion 1804a of the third fin 210c and the recessed portion 1804b of the fourth fin 210d). However, it will be appreciated that the first recessed semiconductor fin 1804a refers to the recessed portion 1804a of the third fin 210c (e.g., not all of the third fin 210c which may have portions that are not recessed) and the second recessed semiconductor fin 1804b refers to the recessed portion 1804b of the fourth fin 210d (e.g., not all of the fourth fin 210d which may have portions that are not recessed).

In some embodiments, the first recessed semiconductor fin 1804a and the second recessed semiconductor fin 1804b are formed with upper surfaces disposed vertically between lower (e.g., lowermost) surfaces of the isolation structures 402 and upper (e.g., uppermost) surfaces of the isolation structures 402. In other embodiments, the first recessed semiconductor fin 1804a and the second recessed semiconductor fin 1804b are formed such that the upper surface of the first recessed semiconductor fin 1804a and/or the upper surface of the second recessed semiconductor fin 1804b are disposed below the lower surfaces of the isolation structures 402. The upper surface of the first recessed semiconductor fin 1804a and the upper surface of the second recessed semiconductor fin 1804b may be rounded, as shown in FIG. 18. In such embodiments, the upper surfaces of the first recessed semiconductor fin 1804a and the second recessed semiconductor fin 1804b may be concave shaped. In other embodiments, the upper surfaces of the first recessed semiconductor fin 1804a and the second recessed semiconductor fin 1804b may substantially planar.

The twentieth etching process recesses portions of the liner layer 302 that are exposed by (and/or underlying) the first opening 1602. In some embodiments, the portions of the liner layer 302 exposed by (and/or underlying) the first opening 1602 are recessed, such that the liner layer 302 has upper surfaces that are substantially aligned with the upper surfaces of the first recessed semiconductor fin 1804a and the second recessed semiconductor fin 1804b, respectively. The upper surfaces of the liner layer 302 that are substantially aligned with the upper surfaces of the first recessed semiconductor fin 1804a and the second recessed semiconductor fin 1804b may be rounded. In some embodiments, the rounded upper surfaces of the liner layer 302 arc along a same radius of curvature as the upper surfaces of the first recessed semiconductor fin 1804a and the second recessed semiconductor fin 1804b, respectively. In other embodiments, the rounded upper surfaces of the liner layer 302 have a different radius of curvature than the upper surfaces of the first recessed semiconductor fin 1804a and the second recessed semiconductor fin 1804b, respectively. In further embodiments, the rounded upper surfaces of the liner layer 302 arc from the substantially planar upper surfaces of the first recessed semiconductor fin 1804a and the second recessed semiconductor fin 1804b, respectively, to sidewalls of corresponding isolation structures 402.

The twentieth etching process removes portions of the remaining dielectric structures 704b/704d (see, FIG. 17), thereby forming a second plurality of dielectric structures 1806. For example, a portion of the second dielectric structure 704b (see, FIG. 17) that is exposed by (and/or underlying) the first opening 1602 is removed, thereby leaving remaining portions of the second dielectric structure 704b in place as a sixth dielectric structure 1806a, which is one of the dielectric structures of the second plurality of dielectric structures 1806. Further, a portion of the fourth dielectric structure 704d (see, FIG. 17) that is exposed by (and/or underlying) the first opening 1602 is removed, thereby leaving remaining portions of the fourth dielectric structure 704*d* in place as a seventh dielectric structure 1806*b*, which is another one of the dielectric structures of the second plurality of dielectric structures 1806.

In some embodiments, the sixth dielectric structure 1806*a* has an L-shaped profile (e.g., along line A-A). In further embodiments, the seventh dielectric structure 1806*b* has an L-shaped profile (e.g., along line A-A). The L-shaped profile of the sixth dielectric structure 1806*a* and the L-shaped profile of the seventh dielectric structure 1806*b* face opposite direction. For example, the sixth dielectric structure 1806*a* has a first vertical portion (extending along the y-axis) and a first lateral portion (extending along the z-axis). The first lateral portion extends from the first vertical portion in a first direction (along the z-axis). The seventh dielectric structure 1806*b* has a second vertical portion (extending along the y-axis) and a second lateral portion (extending along the z-axis). The second lateral portion extends from the second vertical portion in a second direction (along the z-axis) that is opposite the first direction.

The twentieth etching process removes (e.g., completely removes) portions of the gate dielectric layer 1404 that are exposed by (and/or underlying) the first opening 1602, thereby forming a plurality of gate dielectric structures 1808. For example, by removing the portions of the gate dielectric layer 1404 that are exposed by (and/or underlying) the first opening 1602, a first portion of the gate dielectric layer 1404 is left in place as a first gate dielectric structure 1808*a* and a second portion of the gate dielectric layer 1404 is left in place as a second gate dielectric structure 1808*b*. The first gate dielectric structure 1808*a* separates the first gate electrode structure 1502*a* from the first fin 210*a*, the second fin 210*b*, the liner layer 302, the isolation structures 402, the first dielectric fin 502*a*, the second dielectric fin 502*b*, the sixth dielectric structure 1806*a*, each of the nanostructures 1304 of the first nanostructure stack 1302*a*, and each of the nanostructures 1304 of the second nanostructure stack 1302*b*. The first gate dielectric structure 1808*a* also separates the sixth dielectric structure 1806*a* from the second etch stop layer 1504 and the fourth dielectric layer 1506.

The second gate dielectric structure 1808*b* separates the third gate electrode structure 1502*c* from the fifth fin 210*e*, the sixth fin 210*f*, the liner layer 302, the isolation structures 402, the fourth dielectric fin 502*d*, the fifth dielectric fin 502*e*, the seventh dielectric structure 1806*b*, each of the nanostructures 1304 of the fifth nanostructure stack 1302*e*, and each of the nanostructures 1304 of the sixth nanostructure stack 1302*f*. The second gate dielectric structure 1808*b* also separates the seventh dielectric structure 1806*b* from the second etch stop layer 1504 and the fourth dielectric layer 1506.

Because the twentieth etching process is a highly directional etch that vertically etches the features exposed by (and/or underlying) the first opening 1602, various surfaces (e.g., sidewalls) of the structure illustrated in FIG. 18 may be substantially aligned. For example, a first inner sidewall of the fourth dielectric layer 1506 is substantially aligned with an outer sidewall of the first gate dielectric structure 1808*a*, and the outer sidewall of the first gate dielectric structure 1808*a* is substantially aligned with a first sidewall of the sixth dielectric structure 1806*a* (e.g., a sidewall of the first vertical portion of the sixth dielectric structure 1806*a*). A second inner sidewall of the fourth dielectric layer 1506 (opposite the first inner sidewall of the fourth dielectric layer 1506) is substantially aligned with an outer sidewall of the second gate dielectric structure 1808*b*, and the outer sidewall of the second gate dielectric structure 1808*b* is substantially aligned with a first sidewall of the seventh dielectric structure 1806*b* (e.g., a sidewall of the second vertical portion of the seventh dielectric structure 1806*b*). A second sidewall of the sixth dielectric structure 1806*a* (e.g., a sidewall of the first lateral portion of the sixth dielectric structure 1806*a*) is substantially aligned with an outer sidewall of the second dielectric fin 502*b*. A second sidewall of the seventh dielectric structure 1806*b* (e.g., a sidewall of the second lateral portion of the seventh dielectric structure 1806*b*) is substantially aligned with an outer sidewall of the fourth dielectric fin 502*d*.

In some embodiments, surfaces (e.g., sidewalls and lower surfaces) of the second opening 1801 are at least partially defined by the outer sidewall of the first gate dielectric structure 1808*a*, the outer sidewall of the second gate dielectric structure 1808*b*, surfaces (e.g., sidewalls and upper surfaces) of the second plurality of dielectric structures 1806, the outer sidewall of the second dielectric fin 502*b*, the outer sidewall of the fourth dielectric fin 502*d*, surfaces (e.g., sidewalls and an upper surface) of the recessed dielectric fin 1802, surfaces (e.g., sidewalls and upper surfaces) of the isolation structures 402, upper surfaces of the liner layer 302, an upper surface of the first recessed semiconductor fin 1804*a*, and an upper surface of the second recessed semiconductor fin 1804. In further embodiments, because the process for forming the second opening (e.g., the twentieth etching process) removes (or recesses) the features that are exposed by (and/or underlying) the first opening 1602, the process for forming the second opening may be referred to as a process for extending the depth (or height) of the first opening 1602.

Also shown in FIG. 18, by forming the second opening 1801, a plurality of NSFETs 1810 are formed. For example, by forming the second opening 1801, a first NSFET 1810*a* is formed on a first side of the second opening 1801 and a second NSFET 1810*b* is formed on a second side of the second opening 1801 opposite the first side of the second opening 1801. The first NSFET 1810*a* and the second NSFET 1810*b* are laterally separated (along the z-axis) by the second opening 1801. In some embodiments, formation of the gate dielectric structures 1808 completes formation of the first NSFET 1810*a* and the second NSFET 1810*b*.

The first NSFET 1810*a* comprises the first gate electrode structure 1502*a*, the first gate dielectric structure 1808*a*, the first nanostructure stack 1302*a*, the second nanostructure stack 1302*b*, the first source/drain regions 902 of the first pair 902*a* (see, FIG. 11), and the first source/drain regions 902 of the second pair 902*b* (see, FIG. 11). A first plurality of selectively-conductive channels (not shown) are disposed in the nanostructures 1304 of the first nanostructure stack 1302*a* and the nanostructures 1304 of the second nanostructure stack 1302*b*, respectively. The selectively-conductive channels disposed in the nanostructures 1304 of the first nanostructure stack 1302*a* extend (along the x-axis) between first source/drain regions 902 of the first pair 902*a*, and the selectively-conductive channels disposed in the nanostructures 1304 of the second nanostructure stack 1302*b* extend (along the x-axis) between first source/drain regions 902 of the second pair 902*b*. Rather than comprising two nanostructure stacks and two corresponding pairs of the first source/drain regions 902, it will be appreciated that the first NSFET 1810*a* may comprise any number of nanostructure stacks and any number of corresponding pairs of the first source/drain regions 902.

The second NSFET 1810*b* comprises the third gate electrode structure 1502*c*, the second gate dielectric structure 1808*b*, the fifth nanostructure stack 1302*e*, the sixth nanostructure stack 1302*f*, the first source/drain regions 902 of the fifth pair 902c (see, FIG. 11), and the first source/drain regions 902 of the sixth pair 902d (see, FIG. 11). A second plurality of selectively-conductive channels (not shown) are disposed in the nanostructures 1304 of the fifth nanostructure stack 1302e and the nanostructures 1304 of the sixth nanostructure stack 1302f, respectively. The selectively-conductive channels disposed in the nanostructures 1304 of the fifth nanostructure stack 1302e extend (along the x-axis) between first source/drain regions 902 of the fifth pair 902c, and the selectively-conductive channels disposed in the nanostructures 1304 of the sixth nanostructure stack 1302f extend (along the x-axis) between first source/drain regions 902 of the sixth pair 902d. Rather than comprising two nanostructure stacks and two corresponding pairs of the first source/drain regions 902, it will be appreciated that the second NSFET 1810b may comprise any number of nanostructure stacks and any number of corresponding pairs of the first source/drain regions 902. It will also be appreciated that the first NSFET 1810a and the second NSFET 1810b may comprise a same (or different) number(s) of nanostructure stacks and corresponding pairs of the first source/drain regions 902.

Figure 19:
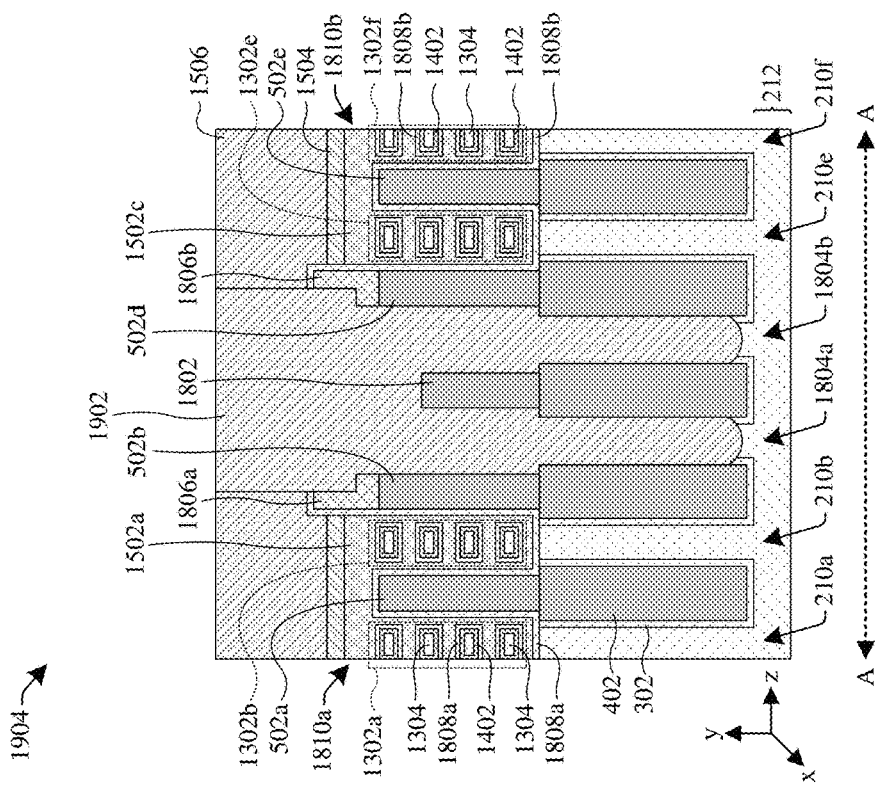

As shown in FIG. 19, a fifth dielectric layer 1902 is formed in (e.g., filling) the first opening 1602 and the second opening 1801. The fifth dielectric layer 1902 is formed over the first recessed semiconductor fin 1804a, the second recessed semiconductor fin 1804b, the liner layer 302, the isolation structures 402, the recessed dielectric fin 1802, the dielectric fins 502, the second plurality of dielectric structures 1806, and the gate dielectric structures 1808. In some embodiments, the fifth dielectric layer 1902 is formed with a planar upper surface.

In some embodiments, a process for forming the fifth dielectric layer 1902 comprises depositing a fourth dielectric material over the first recessed semiconductor fin 1804a, the second recessed semiconductor fin 1804b, the liner layer 302, the isolation structures 402, the recessed dielectric fin 1802, the dielectric fins 502, the second plurality of dielectric structures 1806, the gate dielectric structures 1808, the gate electrode structures 1502, the second etch stop layer 1504, the fourth dielectric layer 1506, the first sidewall spacers 702, the first etch stop layer 1002, and the ILD layer 1004. In other words, the fourth dielectric material is formed over the upper surfaces of the fourth dielectric layer 1506, the upper surfaces of the first sidewall spacers 702, the upper surfaces of the first etch stop layer 1002, the upper surfaces of the ILD layer 1004 (see, FIG. 11), and filling (e.g., completely filling) the second opening 1801 and the first opening 1602.

The fourth dielectric material is or comprises, for example, a nitride (e.g., SiN), a silicon-carbon-nitride (e.g., SiCN), a silicon-carbon-oxy-nitride (e.g., SiCON), an oxy-nitride (e.g., SiON), a metal oxide (e.g., aluminum oxide (AlO), hafnium oxide (HfO), zirconium oxide (ZrO), yttrium oxide (YO)), an oxide (e.g., $SiO_2$), some other dielectric material, or a combination of the foregoing. The fourth dielectric material has a different chemical composition than the ILD layer 1004, such that the ILD layer 1004 may be selectively etched during a subsequent processing step (e.g., during formation of the source/drain contacts). In some embodiments, the fourth dielectric material has a same chemical composition as the third dielectric material (e.g., the third dielectric material and the fourth dielectric material are a same dielectric material). In other embodiments, the fourth dielectric material and the third dielectric material have different chemical compositions (e.g., the third dielectric material and the fourth dielectric material are a different dielectric material).

The fourth dielectric material may be deposited by, for example, CVD, PVD, ALD, some other deposition process, or a combination of the foregoing. After the fourth dielectric material is deposited, a planarization process (e.g., CMP) is performed on fourth dielectric material to remove upper portions of the fourth dielectric material, thereby leaving lower portions of the fourth dielectric material in place as the fifth dielectric layer 1902. The planarization process may also remove upper portions of the ILD layer 1004, the first etch stop layer 1002, the first sidewall spacers 702, and the fourth dielectric layer 1506, thereby co-planarizing upper surfaces of the fifth dielectric layer 1902, the ILD layer 1004, the first etch stop layer 1002, the first sidewall spacers 702, and the fourth dielectric layer 1506.

The fifth dielectric layer 1902 laterally separates (along the z-axis) the first NSFET 1810a from the second NSFET 1810b. In some embodiments, the fifth dielectric layer 1902 improves the electrical insulation between the first NSFET 1810a and the second NSFET 1810b, thereby improving device performance. For example, as feature sizes are scaled down (e.g., 3 nm and beyond), the laterally spacing (along the z-axis) between the first NSFET 1810a and the second NSFET 1810b is reduced, which may result in leakage (e.g., leakage current) between the first NSFET 1810a and the second NSFET 1810b. The fifth dielectric layer 1902 may reduce this leakage, thereby improving the device performance of the first NSFET 1810a and/or the second NSFET 1810b.

Because the sixth dielectric structure 1806a is disposed over the second dielectric fin 502b and the seventh dielectric structure 1806b is disposed over the fourth dielectric fin 502d, the fifth dielectric layer 1902 is formed in a self-aligned manner. For example, during the deposition of the fourth dielectric material, the fourth dielectric material will self-align with the first sidewall of the sixth dielectric structure 1806a (e.g., the sidewall of the first vertical portion of the sixth dielectric structure 1806a) and the first sidewall of the seventh dielectric structure 1806b (e.g., the sidewall of the second vertical portion of the seventh dielectric structure 1806b). Thus, the fifth dielectric layer 1902 is formed in a self-aligned manner that self-aligns the fifth dielectric layer 1902 (along the z-axis). Thus, as features sizes continue to scale down (e.g., 3 nm and beyond), the method disclosed herein may improve device performance of the first NSFET 1810a and/or the second NSFET 1810b.

Although not shown, it will be appreciated that an interconnect structure may be formed over the first NSFET 1810a, the second NSFET 1810b, the ILD layer 1004, the fourth dielectric layer 1506, and the fifth dielectric layer 1902 to electrically coupled the various electronic devices (e.g., the first NSFET 1810a, the second NSFET 1810b, etc.) of the semiconductor device 1904 together in a predefined manner. For example, the interconnect structure may be formed by: (1) forming conductive source/drain contacts (e.g., metal contacts) that extend through the ILD layer 1004 to the first source/drain regions 902 and/or the second source/drain regions 904; (2) forming conductive gate electrode contacts (e.g., metal contacts) that extend through the fourth dielectric layer 1506 and/or the fifth dielectric layer 1902 to the gate electrode structures 1502; (3) forming a stack of additional ILD layers over the ILD layer 1004, the fourth dielectric layer 1506, and the fifth dielectric layer 1902; and (4) forming conductive lines (e.g., metal lines) and conductive vias (e.g., metal vias) in the stack of additional ILD layers, thereby electrically coupling the various electronic devices (e.g., the first NSFET 1810a, the second NSFET 1810b, etc.) of the semiconductor device 1904 together in the predefined manner.

In some embodiments, the source/drain contacts may be formed by a self-aligned contact (SAC) process. For example, as discussed above, the fourth dielectric layer 1506 and the fifth dielectric layer 1902 have different chemical compositions than the ILD layer 1004, such that the ILD layer 1004 may be selectively etched. Moreover, as discussed above, the fourth dielectric layer 1506 and the fifth dielectric layer 1902 are formed covering the gate electrode structures 1502, but not the ILD layer 1004. Thus, an etching process may be performed to selectively etch the ILD layer 1004, thereby forming source/drain contact openings (and/or trenches) in the ILD layer 1004 that expose the source/drain regions. Thereafter, the source/drain contact openings (and/or trenches) are filled with a conductive material (e.g., W, copper (Cu), Al, etc.), and a planarization process is performed on the conductive material, thereby leaving the conductive material in place as the source/drain region contacts. It will be appreciated that, before the source/drain contact openings (and/or trenches) are filled with a conductive material, a silicide process (e.g., silicide process) may be performed to form silicide layers on the source/drain regions exposed by the contact openings (and/or trenches).

Because the etching process selectively etches the ILD layer 1004, the etching process will not expose the gate electrode structures 1502 (e.g., will not etch the fourth dielectric layer 1506 and the fifth dielectric layer 1902 to expose the gate electrode structures 1502). Thus, if the source/drain contact openings (and/or trenches) are formed too large and/or misaligned, the conductive material (or silicide layers) will not be deposited on the gate electrode structures 1502, thereby preventing electrical shorts between the gate electrode structures 1502 and the source/drain regions (e.g., the first source/drain regions 902 and/or the second source/drain regions 904). Rather, the conductive material (and the silicide layers) will be deposited such that the conductive material self-aligns with the source/drain regions (e.g., the first source/drain regions 902 and/or the second source/drain regions 904). Accordingly, in some embodiments, the fourth dielectric layer 1506 may be referred to as a first SAC dielectric structure, and the fifth dielectric layer 1902 may be referred to as a second SAC dielectric structure.

In some embodiments, formation of the semiconductor device 1904 (e.g., integrated circuit) is complete after the interconnect structure is formed. For at least the reasons discussed above, the method disclosed herein forms the semiconductor device 1904 with reduced spacing between the first NSFET 1810a and the second NSFET 1810b (e.g., less than 40 nm lateral spacing (along the z-axis) between the second nanostructure stack 1302b and the fifth nanostructure stack 1302e). Accordingly, as discussed in more detail above, the method herein may improve production yield, prevent device failure, improve device performance, and so forth, as features sizes continue to scale down (e.g., 3 nm and beyond).

Figure 20B:
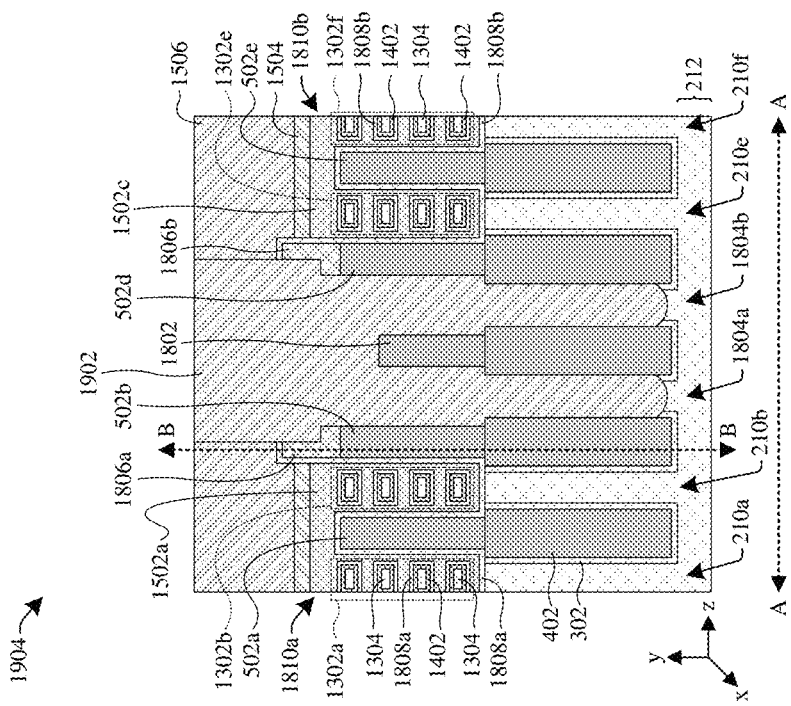
FIGS. 20A-20C illustrate various views of some embodiments of the semiconductor device with reduced spacing between the NSFETs.
Figure 20A:
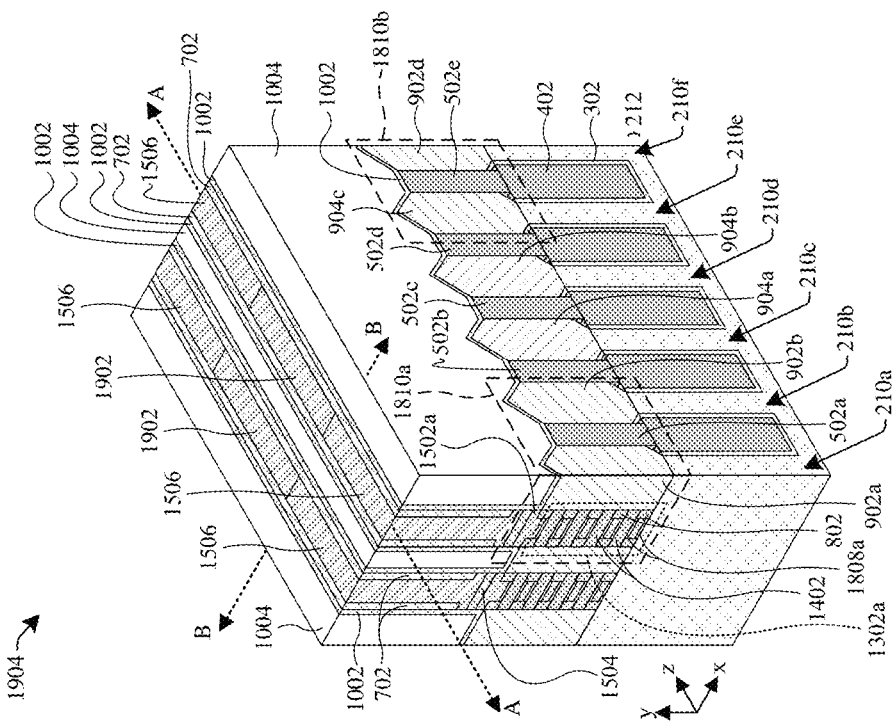
Figure 20C:
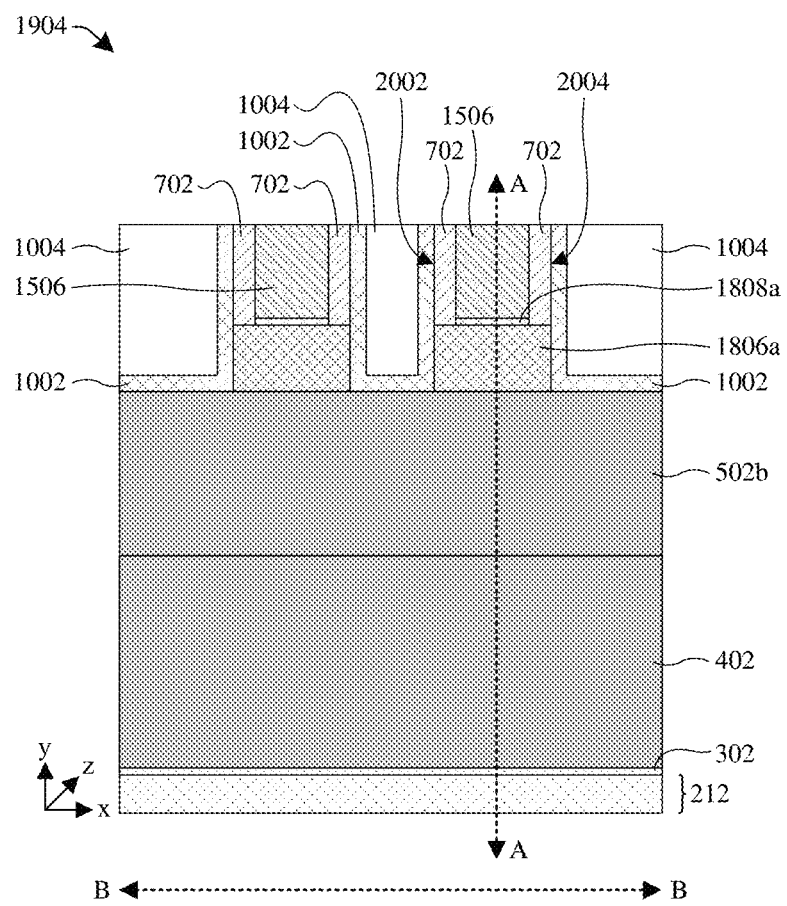

FIGS. 20A-20C illustrate various views of some embodiments of the semiconductor device 1904 with reduced spacing between the NSFETs 1810. FIG. 20A illustrates a perspective view of some embodiments of the semiconductor device 1904 with reduced spacing between the NSFETs 1810. FIG. 20B illustrates a cross-sectional view of the semiconductor device 1904 of FIG. 20A taken along line A-A of FIG. 20A. FIG. 20C illustrates a cross-sectional view of the semiconductor device 1904 of FIG. 20A taken along line B-B of FIG. 20A.

As shown in FIGS. 20A-20C, the second plurality of dielectric structures 1806 extend laterally (along the x-axis), such that the second plurality of dielectric structures 1806 undercut lower surfaces of corresponding first sidewall spacers 702. For example, the sixth dielectric structure 1806a (and the seventh dielectric structure 1806b) extends laterally (along the x-axis), such that the sixth dielectric structure 1806a (and the seventh dielectric structure 1806b) undercut lower surfaces of the one of the first sidewall spacers 702 (e.g., the one of the first sidewall spacers 702 that extends (along the z-axis) between the first source/drain regions 902 of the first pair 902a, the second pair 902b, the fifth pair 904c, and the sixth pair 904c). In some embodiments, the sixth dielectric structure 1806a (and the seventh dielectric structure 1806b) contacts (e.g., directly contacts) the lower surfaces of the one of the first sidewall spacers 702. In further embodiments, the first gate electrode structure 1502a (and the third gate electrode structure 1502c), the second etch stop layer 1504, and the fourth dielectric layer 1506 undercut the lower surfaces of the one of the first sidewall spacers 702.

In some embodiments, the sixth dielectric structure 1806a (and the seventh dielectric structure 1806b) extends laterally (along the x-axis) between opposite inner sidewalls of the first etch stop layer 1002. For example, the first etch stop layer 1002 has a first inner sidewall 2002 and a second inner sidewall 2004 opposite the first inner sidewall 2002. The first inner sidewall 2002 and the second inner sidewall 2004 extend vertically (along the y-axis) along opposite outer sidewalls of the one of the first sidewall spacers 702. The sixth dielectric structure 1806a (and the seventh dielectric structure 1806b) extends laterally (along the x-axis) between the first inner sidewall 2002 and the second inner sidewall 2004. In some embodiments, the sixth dielectric structure 1806a (and the seventh dielectric structure 1806b) contact (e.g., directly contact) the first inner sidewall 2002 and the second inner sidewall 2004.

Figure 21:
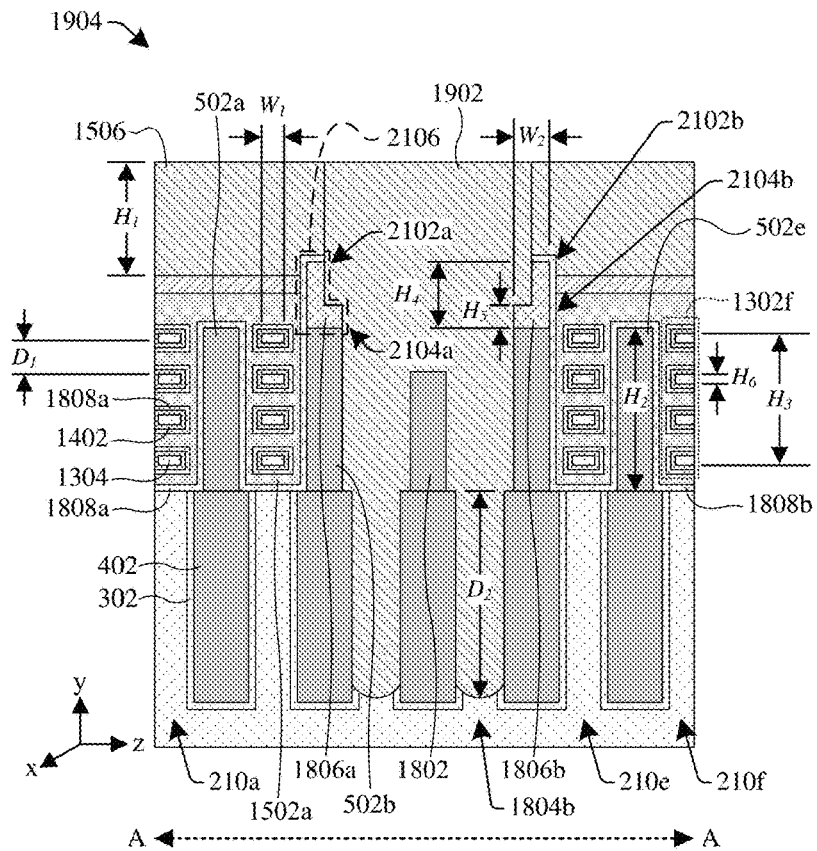
FIG. 21 illustrates a cross-sectional view of some embodiments of the semiconductor device of FIGS. 20A-20C taken along line B-B of FIG. 20A.

FIG. 21 illustrates a cross-sectional view of some embodiments of the semiconductor device 1904 of FIGS. 20A-20C taken along line B-B of FIG. 20A. For clarity, FIG. 21 does not include some of the reference characters for some of the structural features illustrated in FIG. 21.

As shown in FIG. 21, the fourth dielectric layer 1506 has a first height $H_1$. In some embodiments, the first height $H_1$ is between about 5 nm and about 50 nm. The dielectric fins 502 have a second height $H_2$. The second height may be between about 30 nm and about 80 nm. The nanostructure stacks 1302 have a third height $H_3$ (e.g., a distance between an uppermost surface of an uppermost one of the nanostructures 1304 of the first nanostructure stack 1302a to a lowermost surface of a lowermost one of the nanostructures 1304 of the first nanostructure stack 1302a). The third height $H_3$ may be between about 30 nm and about 80 nm. In some embodiments, the third height $H_3$ is substantially equal to the second height $H_2$. In other embodiments, the third height $H_3$ is different than (e.g., less than) the second height $H_2$.

The second plurality of dielectric structures 1806 have vertical portions 2102 (extending along the y-axis) and lateral portions 2104 (extending along the z-axis), respectively. For example, the sixth dielectric structure 1806a has a first vertical portion 2102a (extending along the y-axis) and a first lateral portion 2104a (extending along the z-axis). The first lateral portion 2104a extends from the first vertical portion 2102a in a first direction (along the z-axis). The seventh dielectric structure 1806b has a second vertical portion 2102b (extending along the y-axis) and a second lateral portion 2104b (extending along the z-axis). The second lateral portion 2104b extends from the second vertical portion 2102b in a second direction (along the z-axis) that is opposite the first direction.

The second plurality of dielectric structures 1806 have a fourth height $H_4$. The fourth height $H_4$ corresponds to a height of the vertical portions 2102 of the second plurality of dielectric structures 1806. In some embodiments, the fourth height $H_4$ is an overall height (e.g., a distance between an uppermost surface of the sixth dielectric structure 1806a and a lowermost surface of the sixth dielectric structure 1806a). In some embodiments, a ratio of the second height $H_2$ to the fourth height $H_4$ is between 3:5 and 16:1. In further embodiments, the ratio of the second height $H_2$ to the fourth height $H_4$ is between 8:5 and 6:1. In yet further embodiments, the fourth height $H_4$ is between about 5 nm and about 50 nm.

The second plurality of dielectric structures 1806 have a fifth height $H_5$. The fifth height $H_5$ corresponds to a height of the lateral portions 2104 of the second plurality of dielectric structures 1806. In some embodiments, a difference between the fourth height $H_4$ and the fifth height $H_5$ is greater than or equal to 3 nm. In further embodiments, the difference between the fourth height $H_4$ and the fifth height $H_5$ is between 3 nm and 47 nm. In yet further embodiments, the fifth height $H_5$ is between 1 about angstrom (A) and about 47 nm.

The nanostructures 1304 have a first width $W_1$. In some embodiments, the first width $W_1$ is between about 50 nm and about 150 nm. The nanostructures 1304 have a sixth height $H_6$. The sixth height $H_6$ may be between about 3 nm about 10 nm. The nanostructures 1304 of the nanostructure stacks 1302 may be spaced from one another by a first distance $D_1$ that is between about 3 nm and about 15 nm. In some embodiments, the nanostructure stacks 1302 may comprise between about 2 nanostructures 1304 and about 10 nanostructures 1304.

The second plurality of dielectric structures 1806 have a second width $W_2$. In some embodiments, a ratio of the second width $W_2$ to the fourth height $H_4$ is between 1:10 and 20:1. In further embodiments, a ratio of the second width $W_2$ to the first width $W_1$ is between 1:30 and 1:1. In yet further embodiments, the second width $W_2$ is between about 5 nm and about 100 nm.

The fifth dielectric layer 1902 extends (along the y-axis) a second distance $D_2$ from a lower surface of the recessed dielectric fin 1802 toward the semiconductor substrate 212. In other words, the second distance $D_2$ corresponds to a distance from a lowermost surface of the fifth dielectric layer 1902 to a lowermost surface of the recessed dielectric fin 1802. In some embodiments, the second distance $D_2$ is between about 20 nm and about 100 nm.

Figure 22:
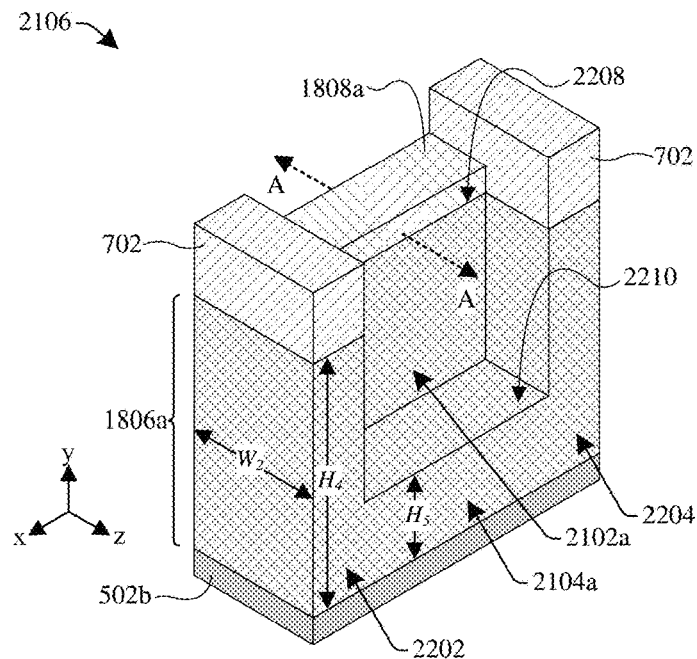
FIG. 22 illustrates a perspective view of some embodiments of an area of the semiconductor device of FIG. 21.

FIG. 22 illustrates a perspective view of some embodiments of an area 2106 of the semiconductor device 1904 of FIG. 21.

As shown in FIG. 22, the first vertical portion 2102a extends (along the y-axis) from the second dielectric fin 502b to the first gate dielectric structure 1808a. The first lateral portion 2104a extends (along the z-axis) from the first vertical portion 2102a. In some embodiments, the sixth dielectric structure 1806a has a first peripheral portion 2202 and a second peripheral portion 2204. The first peripheral portion 2202 is spaced from (along the x-axis) the second peripheral portion 2204.

The first vertical portion 2102a extends (along the x-axis) between the first peripheral portion 2202 and the second peripheral portion 2204. The first lateral portion 2104a extends (along the x-axis) between the first peripheral portion 2202 and the second peripheral portion 2204. The first peripheral portion 2202 and the second peripheral portion 2204 are disposed below (e.g., directly below) the lower surfaces of the one of the first sidewall spacers 702. In some embodiments, an outer sidewall of the first peripheral portion 2202 and an outer sidewall of the second peripheral portion 2204 are substantially aligned with the outer sidewalls of the one of the first sidewall spacers 702, respectively. In further embodiments, the outer sidewall of the first peripheral portion 2202 may contact (e.g., directly contact) the second inner sidewall 2004 of the first etch stop layer 1002 (see, FIG. 20C). In yet further embodiments, the outer sidewall of the second peripheral portion 2204 may contact (e.g., directly contact) the first inner sidewall 2002 of the first etch stop layer 1002 (see, FIG. 20C).

The sixth dielectric structure 1806a has a first upper surface 2208 and a second upper surface 2210. The first upper surface 2208 corresponds to an upper surface of the first vertical portion 2102a. The second upper surface 2210 corresponds to an upper surface of the first lateral portion 2104a.

The first upper surface 2208 is disposed over the second upper surface 2210. In some embodiments, the first upper surface 2208 is an uppermost surface of the sixth dielectric structure 1806a. The second upper surface 2210 is laterally disposed (along the z-axis) between the first upper surface 2208 and the second dielectric fin 502b (see, FIG. 21). The first upper surface 2208 is laterally disposed (along the z-axis) between the second upper surface 2210 and the first gate electrode structure 1502a (see, FIG. 21).

The first gate dielectric structure 1808a extends along the first upper surface 2208 of the sixth dielectric structure 1806a. In some embodiments, the first gate dielectric structure 1808a also extends along a first sidewall of the first gate dielectric structure 1808a, a first sidewall of the second dielectric fin 502b, an upper surface of the second fin 210b, sidewalls of the first dielectric fin 502a, an upper surface of the first dielectric fin 502a, and an upper surface of the first fin 210a (see, FIG. 20B). The first sidewall of the first gate dielectric structure 1808a extends vertically (along the y-axis) from the first upper surface 2208 to the second dielectric fin 502b. In some embodiments, the first sidewall of the first gate dielectric structure 1808a is substantially aligned with the first sidewall of the second dielectric fin 502b. In further embodiments, the first gate dielectric structure 1808a extends continuously along the first upper surface 2208, the sidewall of the first gate dielectric structure 1808a, the sidewall of the second dielectric fin 502b, the upper surface of the second fin 210b, the sidewalls of the first dielectric fin 502a, the upper surface of the first dielectric fin 502a, and the upper surface of the first fin 210a.

The first gate dielectric structure 1808a has a second sidewall that is opposite the first sidewall of the first gate dielectric structure 1808a. In other words, the second sidewall of the first gate dielectric structure 1808a is laterally spaced (along the z-axis) from the first sidewall of the first gate dielectric structure 1808a. The second sidewall of the first gate dielectric structure 1808a extends vertically (along the y-axis) from the first upper surface 2208 to the second upper surface 2210. In some embodiments, the second sidewall of the first gate dielectric structure 1808a is substantially aligned with a sidewall of the first gate dielectric structure 1808a.

The first gate dielectric structure 1808a has a third sidewall that is opposite the first sidewall of the first gate dielectric structure 1808a. In other words, the third sidewall of the first gate dielectric structure 1808a is laterally spaced (along the z-axis) from the first sidewall of the first gate dielectric structure 1808a. The third sidewall of the first gate dielectric structure 1808a extends vertically (along the y-axis) from the second upper surface 2210 to a lower surface of the first gate dielectric structure 1808a (e.g., a lowermost surface of the first gate dielectric structure 1808a that contacts the upper surface of the second dielectric fin 502b). The second upper surface 2210 is disposed laterally (along the z-axis) between the second sidewall of the first gate dielectric structure 1808a and the third sidewall of the first gate dielectric structure 1808a. In some embodiments, the second upper surface 2210 extends from the third sidewall of the first gate dielectric structure 1808a to the second sidewall of the first gate dielectric structure 1808a. In further embodiments, the third sidewall of the first gate dielectric structure 1808a is substantially aligned with a second sidewall of the second dielectric fin 502b that is opposite the first sidewall of the second dielectric fin 502b (e.g., the first sidewall of the second dielectric fin 502b is laterally spaced from (along the z-axis) the second sidewall of the second dielectric fin 502b).

In some embodiments, the first upper surface 2208 is disposed over an upper surface (e.g., uppermost surface) of the first gate electrode structure 1502a (see, FIG. 21). In further embodiments, the second upper surface 2210 is disposed below the upper of the first gate electrode structure 1502a (see, FIG. 21). The first upper surface 2208 may be disposed over the second etch stop layer 1504. The second upper surface 2210 may be disposed below the second etch stop layer 1504. While FIG. 22 illustrates features (e.g., structural features) of the sixth dielectric structure 1806a, it will be appreciated that each of the second plurality of dielectric structure may comprise substantially similar features.

Figure 23:
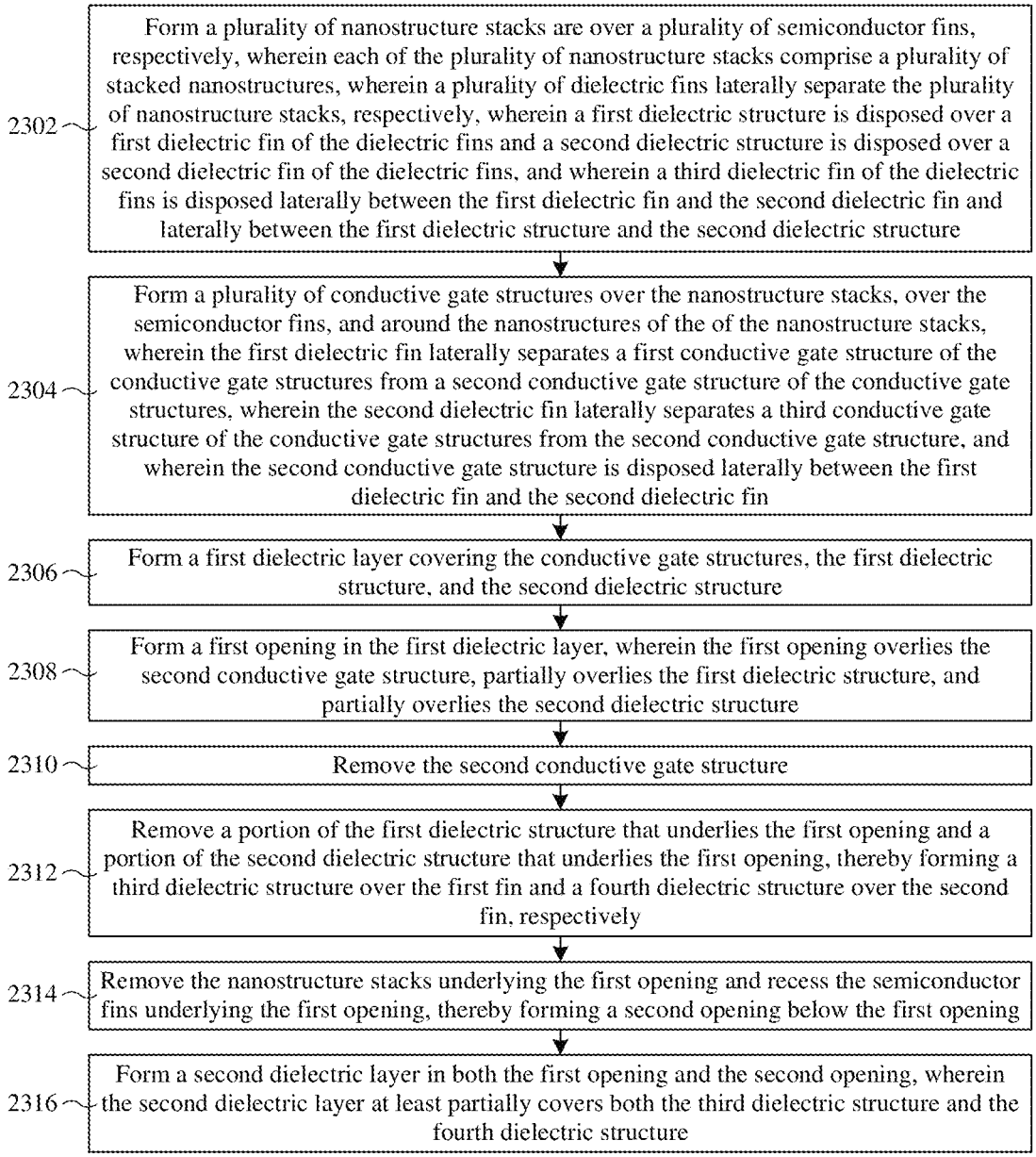
FIG. 23 illustrates a flowchart of some embodiments of a method for forming a semiconductor device with reduced spacing between NSFETs.

FIG. 23 illustrates a flowchart 2300 of some embodiments of a method for forming a semiconductor device with reduced spacing between NSFETs. While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2302, a plurality of nanostructure stacks are formed over a plurality of semiconductor fins, respectively, wherein each of the plurality of nanostructure stacks comprise a plurality of stacked nanostructures, wherein a plurality of dielectric fins laterally separate the plurality of nanostructure stacks, respectively, wherein a first dielectric structure is disposed over a first dielectric fin of the dielectric fins and a second dielectric structure is disposed over a second dielectric fin of the dielectric fins, and wherein a third dielectric fin of the dielectric fins is disposed laterally between the first dielectric fin and the second dielectric fin and laterally between the first dielectric structure and the second dielectric structure. FIGS. 1-13 illustrate a series of various views of some embodiments corresponding to act 2302.

At act 2304, a plurality of conductive gate structures are formed over the nanostructure stacks, over the semiconductor fins, and around the nanostructures of the of the nanostructure stacks, wherein the first dielectric fin laterally separates a first conductive gate structure of the conductive gate structures from a second conductive gate structure of the conductive gate structures, wherein the second dielectric fin laterally separates a third conductive gate structure of the conductive gate structures from the second conductive gate structure, and wherein the second conductive gate structure is disposed laterally between the first dielectric fin and the second dielectric fin. FIGS. 14-15 illustrate a series of cross-sectional views of some embodiments corresponding to act 2304.

At act 2306, a first dielectric layer is formed covering the conductive gate structures, the first dielectric structure, and the second dielectric structure. FIG. 15 illustrates a cross-sectional view of some embodiments corresponding to act 2306.

At act 2308, a first opening is formed in the first dielectric layer, wherein the first opening overlies the second conductive gate structure, partially overlies the first dielectric structure, and partially overlies the second dielectric structure. FIG. 16 illustrates a cross-sectional view of some embodiments corresponding to act 2308.

At act 2310, the second conductive gate structure is removed. FIG. 17 illustrates a cross-sectional view of some embodiments corresponding to act 2310.

At act 2312, a portion of the first dielectric structure that underlies the first opening is removed and a portion of the second dielectric structure that underlies the first opening is removed, thereby forming a third dielectric structure over the first fin and a fourth dielectric structure over the second fin, respectively. FIG. 18 illustrates a cross-sectional view of some embodiments corresponding to act 2312.

At act 2314, the nanostructure stacks underlying the first opening are removed and the nanostructures underlying the first opening are recessed, thereby forming a second opening below the first opening. FIG. 18 illustrates a cross-sectional view of some embodiments corresponding to act 2314.

At act 2316, a second dielectric layer is formed in both the first opening and the second opening, wherein the second dielectric layer at least partially covers both the third dielectric structure and the fourth dielectric structure. FIG. 19 illustrates a cross-sectional view of some embodiments corresponding to act 2316.

In some embodiments, the present application provides a semiconductor device. The semiconductor device comprises a semiconductor fin projecting vertically from a semiconductor substrate. A plurality of semiconductor nanostructures that are vertically stacked are disposed directly over the semiconductor fin. A gate electrode structure is disposed over the semiconductor fin and around the semiconductor nanostructures. A dielectric fin is disposed over the semiconductor substrate, wherein both the gate electrode structure and the semiconductor nanostructures are disposed on a first side of the dielectric fin, and wherein an upper surface of the dielectric fin is disposed below an upper surface of the gate electrode structure. A dielectric structure is disposed directly over the dielectric fin, wherein a first upper surface of the dielectric structure is disposed over the upper surface of the gate electrode structure. A dielectric layer is disposed at least partially over the semiconductor substrate, wherein the dielectric layer is disposed on a second side of the dielectric fin opposite the first side, wherein an upper surface of the dielectric layer is disposed over both the upper surface of the gate electrode structure and the first upper surface of the dielectric structure, and wherein a lower surface of the dielectric layer is disposed below the upper surface of the dielectric fin.

In some embodiments, the present application provides a semiconductor device. The semiconductor device comprises a first semiconductor fin and a second semiconductor fin projecting vertically from a semiconductor substrate, wherein the second semiconductor fin is laterally spaced from the first semiconductor fin in a first direction, wherein the first semiconductor fin and the second semiconductor fin extend laterally in a second direction in parallel with one another, and wherein the second direction is substantially perpendicular to the first direction. A first gate electrode structure is disposed over the first semiconductor fin. A second gate electrode structure is disposed over the second semiconductor fin and laterally spaced from the first gate electrode structure in the first direction. A first dielectric fin is disposed over the semiconductor substrate, wherein the first dielectric fin is disposed between the first semiconductor fin and the second semiconductor fin and between the first gate electrode structure and the second gate electrode structure. A second dielectric fin is disposed over the semiconductor substrate and laterally spaced from the first dielectric fin in the first direction, wherein the second dielectric fin is disposed between the first semiconductor fin and the second semiconductor fin and between the first gate electrode structure and the second gate electrode structure. A first dielectric structure is disposed over the first dielectric fin. A second dielectric structure is disposed over the second dielectric fin and laterally spaced from the first semiconductor fin in the first direction. A dielectric layer is disposed at least partially over the semiconductor substrate, wherein the first dielectric structure laterally separates the dielectric layer from a first portion of the first gate electrode structure, and the second dielectric structure laterally separates the dielectric layer from a first portion of the second gate electrode structure.

In some embodiments, the present application provides a method for forming a semiconductor device. The method comprises receiving a workpiece. The workpiece comprises a first conductive gate structure disposed over the semiconductor substrate and around the first plurality of semiconductor nanostructures; a second conductive gate structure disposed over the semiconductor substrate and around the second plurality of semiconductor nanostructures; a third conductive gate structure disposed over the semiconductor substrate and around the third plurality of semiconductor nanostructures, wherein the second conductive gate structure is disposed between and laterally spaced from the first conductive gate structure and the third conductive gate structure; a first dielectric structure disposed directly over the first dielectric fin, wherein the first dielectric structure and the first dielectric fin laterally separate the first conductive gate structure from the second conductive gate structure; and a second dielectric structure disposed directly over the second dielectric fin, wherein the second dielectric structure and the second dielectric fin laterally separate the third conductive gate structure from the second conductive gate structure. A dielectric layer is formed over the first dielectric fin, the second dielectric fin, the first plurality of semiconductor nanostructures, the second plurality of semiconductor nanostructures, the third plurality of semiconductor nanostructures, the first dielectric structure, the second dielectric structure, the first conductive gate structure, the second conductive gate structure, and the third conductive gate structure. A first opening is formed in the first dielectric layer, wherein the first opening at least partially overlies the first dielectric structure, the second dielectric structure, and the second conductive gate structure. The second conductive gate structure is removed. A portion of the first dielectric structure that underlies the first opening is removed, thereby forming a third dielectric structure directly over the first dielectric fin. A portion of the second dielectric structure that underlies the first opening is removed, thereby forming a fourth dielectric structure directly over the second dielectric fin. The second plurality of semiconductor nanostructures are removed, thereby forming a second opening below the first opening. A second dielectric layer is formed in both the first opening and the second opening and formed at least partially covering both the third dielectric structure and the fourth dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   receiving a workpiece comprising:
   a dielectric fin disposed over a semiconductor substrate and laterally between a first plurality of semiconductor nanostructures and a second plurality of semiconductor nano structures;
   a first conductive gate structure disposed over the semiconductor substrate and around the first plurality of semiconductor nanostructures;
   a second conductive gate structure disposed over the semiconductor substrate and around the second plurality of semiconductor nanostructures; and
   a dielectric fin helmet overlying the dielectric fin, wherein both the dielectric fin helmet and the dielectric fin are disposed laterally between the first conductive gate structure and the second conductive gate structure, and wherein an upper surface of the first conductive gate structure and an upper surface of the second conductive gate structure are both vertically disposed between a first upper surface of the dielectric fin helmet and the semiconductor substrate;
   forming a dielectric layer over the dielectric fin, the first plurality of semiconductor nanostructures, the second plurality of semiconductor nanostructures, the first conductive gate structure, the second conductive gate structure, and the dielectric fin helmet;
   forming a first opening in the dielectric layer, wherein the first opening at least partially overlies the dielectric fin helmet and the second conductive gate structure; and
   removing the second conductive gate structure by performing a first etching process that exposes the second conductive gate structure to a first etchant via the first opening.

2. The method of claim 1, further comprising:
   after the second conductive gate structure is removed, removing the second plurality of semiconductor nanostructures by performing a second etching process that exposes the second plurality of semiconductor nanostructures to a second etchant via the first opening, wherein the second etching process removes a first portion of the dielectric fin helmet, and wherein the second etching process forms a second opening that is within an outer boundary of the first opening.

3. The method of claim 2, further comprising:
depositing a dielectric material in the first opening and the second opening, wherein the dielectric material is deposited on a second upper surface of the dielectric fin helmet, and wherein the second upper surface of the dielectric fin helmet is exposed by removing the first portion of the dielectric fin helmet.

4. The method of claim 3, further comprising:
before the dielectric layer is formed, forming an etch stop layer over the first conductive gate structure and the second conductive gate structure, wherein an upper surface of the etch stop layer and a lower surface of the etch stop layer are both disposed vertically between the first upper surface of the dielectric fin helmet and a lower surface of the dielectric fin helmet, and wherein forming the first opening in the dielectric layer comprising performing a third etching process that stops on the etch stop layer.

5. A method for forming a semiconductor device, the method comprising:
forming a first stack of semiconductor structures over a first semiconductor fin;
forming a second stack of semiconductor structures over a second semiconductor fin;
forming a dielectric fin laterally between the first stack of semiconductor structures and the second stack of semiconductor structures;
forming a dielectric strip structure overlying the dielectric fin and laterally between the first stack of semiconductor structures and the second stack of semiconductor structures;
removing a portion of the first stack of semiconductor structures to form a third stack of semiconductor structures;
removing a portion of the second stack of semiconductor structures to form a fourth stack of semiconductor structures;
removing a portion of the dielectric strip structure to form a dielectric structure overlying the dielectric fin and laterally between the third stack of semiconductor structures and the fourth stack of semiconductor structures;
etching the third stack of semiconductor structures and the fourth stack of semiconductor structures, thereby forming a first nanostructure stack over the first semiconductor fin and a second nanostructure stack over the first semiconductor fin;
forming a gate electrode layer over the first semiconductor fin, over the second semiconductor fin, over the dielectric fin, over the dielectric structure, around the first nanostructure stack, and around the second nanostructure stack;
recessing the gate electrode layer to below an upper surface of the dielectric structure, thereby forming a first gate electrode structure around the first nanostructure stack and on a first side of the dielectric structure and forming a second gate electrode structure around the second nanostructure stack and on a second side of the dielectric structure opposite the first side of the dielectric structure;
forming a dielectric layer over the first gate electrode structure, the second gate electrode structure, the dielectric fin, and the dielectric structure;
forming an opening in the dielectric layer, wherein the opening overlies the dielectric structure and the second gate electrode structure; and
after the opening is formed in the dielectric layer, removing the second gate electrode structure, wherein the opening is utilized to remove the second gate electrode structure.

6. The method of claim 5, wherein utilizing the opening to remove the second gate electrode structure comprises:
performing an etching process that exposes the second gate electrode structure to an etchant via the opening.

7. The method of claim 5, further comprising:
after the opening is formed, removing the second nanostructure stack, wherein the opening is utilized to remove the second nanostructure stack.

8. The method of claim 7, wherein utilizing the opening to remove the second nanostructure stack comprises:
performing a first etching process that exposes the second nanostructure stack to a first etchant via the opening.

9. The method of claim 8, the first etching process exposes a portion of the dielectric structure to the first etchant via the opening, thereby removing the portion of the dielectric structure.

10. The method of claim 9, wherein utilizing the opening to remove the second gate electrode structure comprises:
performing a second etching process that exposes the second gate electrode structure to a second etchant via the opening, wherein the second etchant is different than the first etchant, and wherein the first etching process is performed after the second etching process.

11. The method of claim 10, wherein before the portion of the dielectric structure is removed, an uppermost surface of the dielectric structure defines an uppermost surface of the portion of the dielectric structure.

12. A method for forming a semiconductor device, the method comprising:
receiving a workpiece comprising:
a first dielectric fin disposed over a semiconductor substrate and laterally between a first plurality of semiconductor nanostructures and a second plurality of semiconductor nano structures;
a second dielectric fin disposed over the semiconductor substrate and laterally between a third plurality of semiconductor nanostructures and the second plurality of semiconductor nanostructures;
a first conductive gate structure disposed over the semiconductor substrate and around the first plurality of semiconductor nanostructures;
a second conductive gate structure disposed over the semiconductor substrate and around the second plurality of semiconductor nanostructures;
a third conductive gate structure disposed over the semiconductor substrate and around the third plurality of semiconductor nanostructures, wherein the second conductive gate structure is disposed between and laterally spaced from the first conductive gate structure and the third conductive gate structure;
a first dielectric structure overlying the first dielectric fin, wherein the first dielectric structure and the first dielectric fin laterally separate the first conductive gate structure from the second conductive gate structure; and a second dielectric structure overlying the second dielectric fin, wherein the second dielectric structure and the second dielectric fin laterally separate the third conductive gate structure from the second conductive gate structure;

forming a first dielectric layer over the first dielectric fin, the second dielectric fin, the first plurality of semiconductor nanostructures, the second plurality of semiconductor nanostructures, the third plurality of semiconductor nanostructures, the first dielectric structure, the second dielectric structure, the first conductive gate structure, the second conductive gate structure, and the third conductive gate structure;

forming a first opening in the first dielectric layer, wherein the first opening at least partially overlies the first dielectric structure, the second dielectric structure, and the second conductive gate structure;

removing the second conductive gate structure;

removing a portion of the first dielectric structure that underlies the first opening, thereby forming a third dielectric structure overlying the first dielectric fin;

removing a portion of the second dielectric structure that underlies the first opening, thereby forming a fourth dielectric structure overlying the second dielectric fin;

removing the second plurality of semiconductor nanostructures, thereby forming a second opening below the first opening; and forming a second dielectric layer in both the first opening and the second opening and at least partially covering both the third dielectric structure and the fourth dielectric structure.

13. The method of claim 12, wherein forming the first opening in the first dielectric layer comprises:

forming a masking layer over the first dielectric layer, wherein the masking layer comprises a third opening that exposes a portion of the first dielectric layer; and with the masking layer over the first dielectric layer, performing a first etching process on the first dielectric layer to remove the portion of the first dielectric layer.

14. The method of claim 13, wherein:

the third opening is partially defined by a first sidewall of the masking layer and a second sidewall of the masking layer that is opposite the first sidewall of the masking layer;

the first sidewall of the masking layer is laterally disposed between opposite sidewalls of the first dielectric structure; and the second sidewall of the masking layer is laterally disposed between opposite sidewalls of the second dielectric structure.

15. The method of claim 13, wherein removing the second conductive gate structure comprises:

performing a second etching process different than the first etching process on the second conductive gate structure.

16. The method of claim 15, wherein forming the second opening comprises:

performing a third etching process different than the second etching process on the second plurality of semiconductor nanostructures, the first dielectric structure, and the second dielectric structure, wherein the third etching process removes the second plurality of semiconductor nanostructures, removes the portion of the first dielectric structure, and removes the portion of the second dielectric structure.

17. The method of claim 16, wherein the second etching process is an isotropic etching process.

18. The method of claim 17, wherein:

the workpiece comprises a third dielectric fin disposed laterally between the first dielectric fin and the second dielectric fin; and the third etching process removes an upper portion of the third dielectric fin, thereby forming a recessed dielectric fin.

19. The method of claim 18, wherein the recessed dielectric fin has an upper surface that is disposed beneath an upper surface of the first dielectric fin and beneath an upper surface of the second dielectric fin.

20. The method of claim 19, wherein:

the workpiece comprises a semiconductor fin protruding vertically from the semiconductor substrate;

the second plurality of semiconductor nanostructures overlie the semiconductor fin; and the third etching process removes an upper portion of the semiconductor fin.

* * * * *